(12) United States Patent
Amikura et al.

(10) Patent No.: US 12,131,937 B2
(45) Date of Patent: Oct. 29, 2024

(54) TRANSFER SYSTEM, TRANSFER DEVICE, AND TRANSFER METHOD

(71) Applicant: Tokyo Electron Limited, Tokyo (JP)

(72) Inventors: Norihiko Amikura, Miyagi (JP); Toshiaki Toyomaki, Miyagi (JP); Masatomo Kita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 322 days.

(21) Appl. No.: 17/680,296

(22) Filed: Feb. 25, 2022

(65) Prior Publication Data
US 2022/0277981 A1    Sep. 1, 2022

(30) Foreign Application Priority Data

Feb. 26, 2021  (JP) .................................. 2021-030806
Jun. 7, 2021   (JP) .................................. 2021-095292
(Continued)

(51) Int. Cl.
*B25J 11/00*     (2006.01)
*B25J 9/16*      (2006.01)
(Continued)

(52) U.S. Cl.
CPC .......... *H01L 21/681* (2013.01); *B25J 9/1697* (2013.01); *B25J 11/0095* (2013.01); *B25J 13/08* (2013.01);
(Continued)

(58) Field of Classification Search
CPC ... H01L 21/681; B25J 9/1697; B25J 11/0095; B25J 13/08; B25J 15/0014; H01J 37/32807; G05B 2219/39001
See application file for complete search history.

(56) References Cited

U.S. PATENT DOCUMENTS 4,819,167 A * 4/1989 Cheng .................. H01L 21/681
                                                    700/59
2006/0167583 A1* 7/2006 Sundar ................. H01L 21/681
                                                    700/218
(Continued)

FOREIGN PATENT DOCUMENTS

JP    2019-102728 A    6/2019
JP    2020-96122 A     6/2020

*Primary Examiner* — Kira Nguyen
(74) *Attorney, Agent, or Firm* — XSENSUS LLP

(57) ABSTRACT

According to an aspect of the present disclosure, there is provided a transfer system comprising a transfer robot configured to transfer a transfer target object by an end effector based on an operation instruction, and a controller configured to output the operation instruction to the transfer robot, wherein at least any one of the end effector and the transfer target object has at least any one of a sensor and a camera, the controller calculates a relative position between the end effector and the transfer target object based on at least any one of a detected result of the sensor and a captured result of the camera, and the controller determines a teaching position of the end effector with respect to the transfer target object based on the relative position, and outputs the operation instruction to the transfer robot such that the end effector is disposed at the teaching position.

11 Claims, 33 Drawing Sheets

(30) Foreign Application Priority Data

Jul. 9, 2021 (JP) .................................. 2021-114080
Dec. 24, 2021 (JP) .................................. 2021-211397

(51) Int. Cl.
*B25J 13/08* (2006.01)
*H01J 37/32* (2006.01)
*H01L 21/68* (2006.01)
*H01L 21/687* (2006.01)
*B25J 15/00* (2006.01)
*H01L 21/67* (2006.01)

(52) U.S. Cl.
CPC .. *H01J 37/32642* (2013.01); *H01J 37/32807* (2013.01); *H01L 21/68707* (2013.01); *B25J 15/0014* (2013.01); *G05B 2219/36433* (2013.01); *G05B 2219/39001* (2013.01); *H01L 21/67173* (2013.01)

(56) References Cited

U.S. PATENT DOCUMENTS

| | | | | |
|---|---|---|---|---|
| 2006/0215152 A1* | 9/2006 | Hashimoto | ........... | H01L 21/681 356/237.2 |
| 2008/0220621 A1* | 9/2008 | Shinozaki | ............... | H01L 21/68 438/795 |
| 2012/0101633 A1* | 4/2012 | Rodnick | ........... | H01L 21/67259 700/253 |
| 2015/0287625 A1* | 10/2015 | Fujimoto | .......... | H01L 21/67253 382/151 |
| 2017/0032510 A1* | 2/2017 | Francken | .............. | G06T 7/0004 |
| 2020/0161154 A1* | 5/2020 | Sugita | ............... | H01L 21/68707 |
| 2022/0037177 A1* | 2/2022 | Fukuzaki | ................. | G01R 1/30 |

* cited by examiner

TRANSFER SYSTEM, TRANSFER DEVICE, AND TRANSFER METHOD

CROSS-REFERENCE TO RELATED APPLICATIONS

This application claims priorities to Japanese Patent Application No. 2021-030806, filed on Feb. 26, 2021, Japanese Patent Application No. 2021-095292 filed on Jun. 7, 2021, Japanese Patent Application No. 2021-114080 filed on Jul. 9, 2021, and Japanese Patent Application No. 2021-211397, filed on Dec. 24, 2021, the entire contents of which are incorporated herein by reference.

TECHNICAL FIELD

The present disclosure relates to a transfer system, a transfer device, and a transfer method.

BACKGROUND

A teaching method of a transfer device using an inspection wafer in which a plurality of cameras are disposed at an outer peripheral portion thereof has been known (for example, refer to Japanese Patent Application Publication No. 2019-102728).

A method for adjusting a transfer position of a focus ring (annular member) to improve accuracy of a placement position of the focus ring (annular member) has been known (for example, refer to Japanese Patent Application Publication No. 2020-096122).

SUMMARY

The present disclosure provides a technique capable of performing automation of teaching with respect to a transfer robot.

According to an aspect of the present disclosure, there is provided a transfer system comprising a transfer robot configured to transfer a transfer target object by an end effector based on an operation instruction, and a controller configured to output the operation instruction to the transfer robot, wherein at least any one of the end effector and the transfer target object has at least any one of a sensor and a camera, the controller calculates a relative position between the end effector and the transfer target object based on at least any one of a detected result of the sensor and a captured result of the camera, and the controller determines a teaching position of the end effector with respect to the transfer target object based on the relative position, and outputs the operation instruction to the transfer robot such that the end effector is disposed at the teaching position.

DETAILED DESCRIPTION

Figure 1:
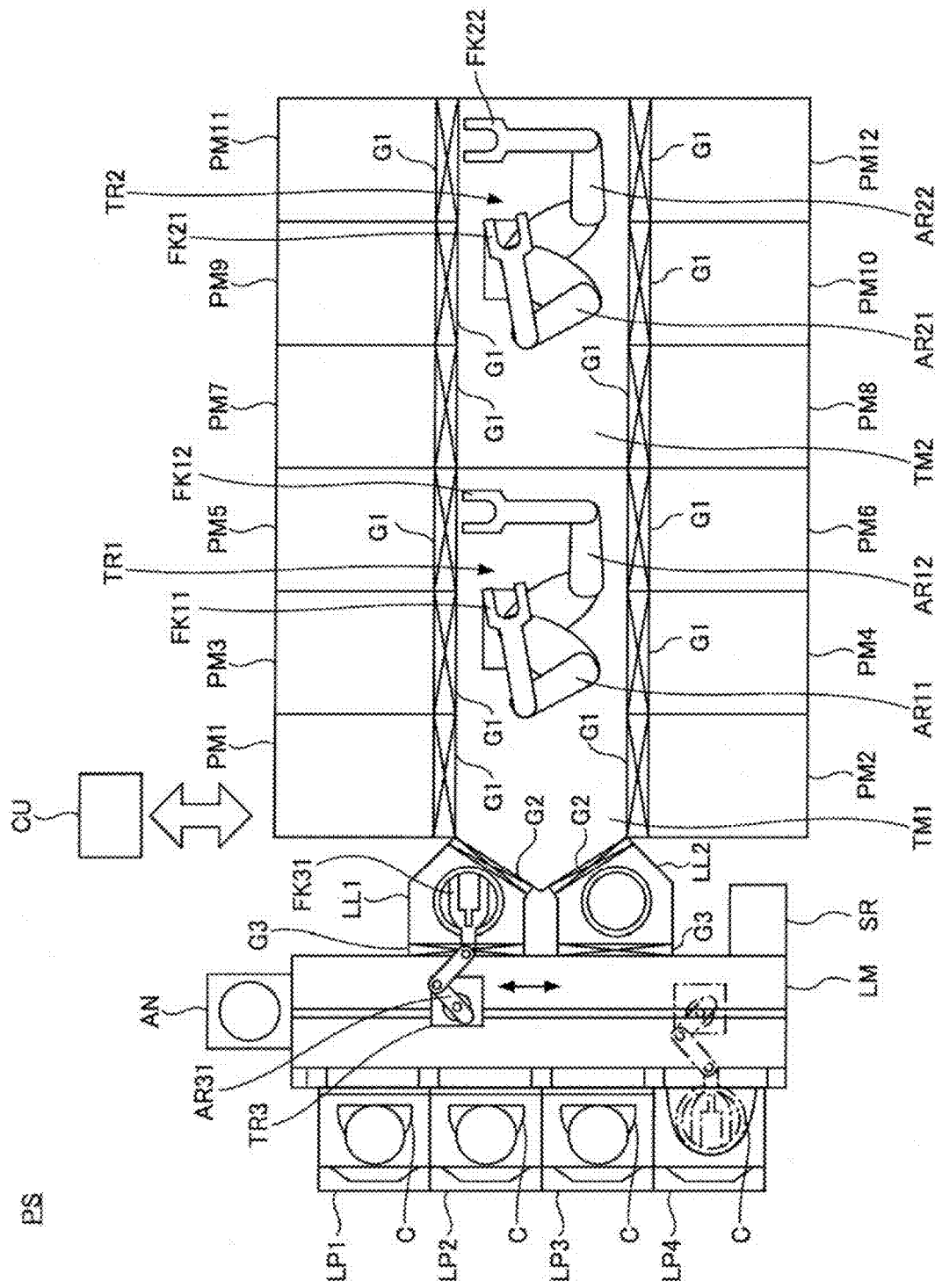
FIG. 1 is a view illustrating an example of a processing system according to an embodiment.

Hereinafter, non-limiting exemplary embodiments of the present disclosure will be described with reference to the accompanying drawings. In the drawings, the same or corresponding members or components are denoted by the same or corresponding reference symbols, and overlapping descriptions thereof will be omitted.

First Embodiment

[Processing System]

An example of a processing system of an embodiment will be described with reference to FIG. 1. As illustrated in FIG. 1, a processing system PS is a system capable of performing various types of processing, such as plasma processing, on a substrate.

The processing system PS includes vacuum transfer modules TM1 and TM2, process modules PM1 to PM12, load-lock modules LL1 and LL2, an atmospheric transfer module LM, an aligner AN, a storage SR, and the like.

The vacuum transfer modules TM1 and TM2 each have a substantially rectangular shape in a plan view. The process modules PM1 to PM6 are connected to two opposite side surfaces of the vacuum transfer module TM1. The load-lock modules LL1 and LL2 are connected to one side surface of the other two opposite side surfaces of the vacuum transfer module TM1, and a path (not illustrated) for connecting to the vacuum transfer module TM2 is connected to the other side surface of the vacuum transfer module TM1. The side surfaces, to which the load-lock modules LL1 and LL2 are connected, of the vacuum transfer module TM1 are angled according to the two load-lock modules LL1 and LL2. The process modules PM7 to PM12 are connected to two opposite side surfaces of the vacuum transfer module TM2. A path (not illustrated) for connecting to the vacuum transfer module TM1 is connected to one side surface of the other two opposite side surfaces of the vacuum transfer module TM2. The vacuum transfer modules TM1 and TM2 have vacuum chambers in a vacuum atmosphere, and vacuum transfer robots TR1 and TR2 are disposed therein, respectively.

The vacuum transfer robots TR1 and TR2 are configured to be rotatable, extensible, and vertically movable. The vacuum transfer robots TR1 and TR2 transfer a transfer target object based on an operation instruction output from a controller CU which will be described later. For example, the vacuum transfer robot TR1 holds the transfer target object with forks FK11 and FK12 disposed at tips thereof, and transfers the transfer target object between the load-lock modules LL1 and LL2, the process modules PM1 to PM6, and the path (not illustrated). For example, the vacuum transfer robot TR2 holds the transfer target object with forks FK21 and FK22 disposed at tips thereof, and transfers the transfer target object between the process modules PM7 to PM12 and the path (not illustrated). The fork is also referred to as a pick or an end effector.

The transfer target object includes a substrate and a consumable member. The substrate is, for example, a semiconductor wafer or a sensor wafer. The consumable member is a member that is attached in the process modules PM1 to PM12 in a replaceable manner, and is a member that is consumed when various types of processing, such as plasma processing, are performed in the process modules PM1 to PM12. The consumable member includes, for example, members constituting a ring assembly 112 and a shower head 13 which will be described later.

The process modules PM1 to PM12 each have a processing chamber and have a stage (placement table) disposed therein. After the substrate is installed on the stage, the inside of the process modules PM1 to PM12 are depressurized to introduce a processing gas thereinto, an RF power is applied to generate plasma, and plasma processing is performed on the substrate by the plasma. The vacuum transfer modules TM1 and TM2 and the process modules PM1 to PM12 are separated by openable/closable gate valves G1.

The load-lock modules LL1 and LL2 are disposed between the vacuum transfer module TM1 and the atmospheric transfer module LM. The load-lock modules LL1 and LL2 each have a chamber having variable internal pressure, whose inside can be switched to vacuum or atmospheric pressure. The load-lock modules LL1 and LL2 each have a stage disposed therein. When the substrate is loaded from the atmospheric transfer module LM into the vacuum transfer module TM1, the load-lock modules LL1 and LL2 receive the substrate from the atmospheric transfer module LM while maintaining the inside at the atmospheric pressure, and depressurize the inside to load the substrate into the vacuum transfer module TM1. When the substrate is unloaded from the vacuum transfer module TM1 to the atmospheric transfer module LM, the load-lock modules LL1 and LL2 receive the substrate from the vacuum transfer module TM1 while maintaining the inside at a vacuum, and pressurize the inside to the atmospheric pressure to load the substrate into the atmospheric transfer module LM. The load-lock modules LL1 and LL2 and the vacuum transfer module TM1 are separated by openable/closable gate valves G2. The load-lock modules LL1 and LL2 and the atmospheric transfer module LM are separated by openable/closable gate valves G3.

The atmospheric transfer module LM is disposed to face the vacuum transfer module TM1. The atmospheric transfer module LM may be, for example, an equipment front end module (EFEM). The atmospheric transfer module LM is an atmospheric transfer chamber that has a rectangular parallelepiped shape, includes a fan filter unit (FFU), and is maintained in an atmospheric pressure atmosphere. The two load-lock modules LL1 and LL2 are connected to one side surface of the atmospheric transfer module LM along a longitudinal direction. Load ports LP1 to LP4 are connected to the other side surface of the atmospheric transfer module LM along the longitudinal direction. Containers C that accommodate a plurality of substrates (for example, 25 substrates) are placed in the load ports LP1 to LP4. The container C may be, for example, a front-opening unified pod (FOUP). An atmospheric transfer robot TR3 that transfers the transfer target object is disposed in the atmospheric transfer module LM.

The atmospheric transfer robot TR3 is configured to be movable along the longitudinal direction of the atmospheric transfer module LM, and is also configured to be rotatable, extensible, and vertically movable. The atmospheric transfer robot TR3 transfers the transfer target object based on an operation instruction output from the controller CU which will be described later. For example, the atmospheric transfer robot TR3 holds the transfer target object with a fork FK31 disposed at a tip thereof, and transfers the transfer target object between the load ports LP1 to LP4, the load-lock modules LL1 and LL2, the aligner AN, and the storage SR.

The aligner AN is connected to one side surface of the atmospheric transfer module LM along a lateral direction. However, the aligner AN may be connected to a side surface of the atmospheric transfer module LM along the longitudinal direction. Further, the aligner AN may be provided inside the atmospheric transfer module LM. The aligner AN has a support stand, an optical sensor (neither of which is illustrated), and the like. The aligner referred to here is a device that detects a position of the transfer target object.

The support stand is a stand rotatable around a center of an axis extending in a vertical direction, and configured to support the substrate thereon. The support stand is rotated by a driving device (not illustrated). The driving device is controlled by the controller CU which will be described later. The support stand is configured such that when the support stand is rotated by the driving power from the driving device, the substrate installed on the support stand is also rotated.

The optical sensor detects an edge of the substrate while the substrate rotates. The optical sensor detects a misalignment amount of an angular position of a notch (or another marker) of the substrate with respect to a reference angular position, and a misalignment amount of a central position of the substrate with respect to the reference position, from a detected result of the edge. The optical sensor outputs a misalignment amount of the angular position of the notch and a misalignment amount of the central position of the substrate to the controller CU which will be described later. The controller CU calculates a rotation amount of a rotation support stand to correct the angular position of the notch to the reference angular position based on the misalignment amount of the angular position of the notch. The controller CU controls the driving device (not illustrated) to rotate the rotation support stand by the rotation amount. Accordingly, the angular position of the notch can be corrected to the reference angular position. Further, the controller CU controls a position of the fork FK31 of the atmospheric transfer robot TR3 when the substrate is received from the aligner AN, based on the misalignment amount of the central position of the substrate, so that the central position of the substrate coincides with a given position on the fork FK31 of the atmospheric transfer robot TR3.

The storage SR is connected to a side surface of the atmospheric transfer module LM along the longitudinal direction. However, the storage SR may be connected to a side surface of the atmospheric transfer module LM along the lateral direction. Further, the storage SR may be provided inside the atmospheric transfer module LM. The storage SR accommodates the transfer target object.

The processing system PS is provided with the controller CU. The controller CU may be, for example, a computer. The controller CU includes a central processing unit (CPU), a random access memory (RAM), a read only memory (ROM), an auxiliary storage device, and the like. The CPU operates based on a program stored in the ROM or the auxiliary storage device, and controls each part of the processing system PS. For example, the controller CU outputs an operation instruction to the vacuum transfer robots TR1 and TR2, the atmospheric transfer robot TR3, and the like. The operation instruction includes an instruction to align the forks FK11, FK12, FK21, FK22, and FK31, which are configured to transfer the transfer target object, with the transfer location of the transfer target object.

[Plasma Processing System]

Figure 2:
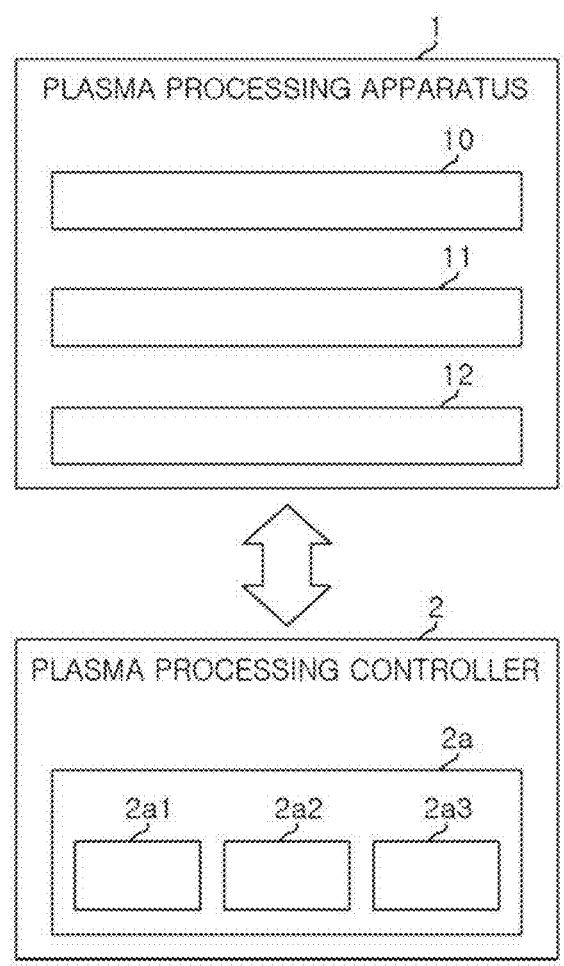
FIG. 2 is a view illustrating an example of a plasma processing system of the embodiment.

An example of the plasma processing system which may be adopted as any of the process modules PM1 to PM12 will be described with reference to FIG. 2.

In one embodiment, the plasma processing system includes a plasma processing apparatus 1 and a plasma processing controller 2. The plasma processing apparatus 1 includes a plasma processing chamber 10, a substrate support 11, and a plasma generator 12. The plasma processing chamber 10 has a plasma processing space. Further, the plasma processing chamber 10 has at least one gas supply port for supplying at least one processing gas into the plasma processing space, and at least one gas exhaust port for exhausting the gas from the plasma processing space. The gas supply port is connected to a gas supply 20 which will be described later, and the gas exhaust port is connected to an exhaust system 40 which will be described later. The substrate support 11 is disposed in the plasma processing space and has a substrate support surface for supporting the substrate.

The plasma generator 12 is configured to generate plasma from at least one processing gas supplied into the plasma processing space. The plasma formed in the plasma processing space may be capacitively coupled plasma (CCP), inductively coupled plasma (ICP), electron-cyclotron-resonance plasma (ECR plasma), helicon wave-excited plasma (HWP), surface wave plasma (SWP), or the like. Further, various types of plasma generators, including an alternating current (AC) plasma generator and a direct current (DC) plasma generator, may be used. In one embodiment, an AC signal (AC power) used by the AC plasma generator has a frequency in a range of 100 kHz to 10 GHz. Accordingly, the AC signal includes a radio frequency (RF) signal and a microwave signal. In one embodiment, the RF signal has a frequency in a range of 200 kHz to 150 MHz.

The plasma processing controller 2 processes a computer-executable instruction for causing the plasma processing apparatus 1 to execute various processes which will be described in the present disclosure. The plasma processing controller 2 may be configured to control each element of the plasma processing apparatus 1 to execute the various processes which will be described here. In one embodiment, a part or entirety of the plasma processing controller 2 may be included in the plasma processing apparatus 1. The plasma processing controller 2 may include, for example, a computer 2a. For example, the computer 2a may include a processor (central processing unit (CPU)) 2a1, a storage 2a2, and a communication interface 2a3. The processor 2a1 may be configured to perform various control operations based on a program stored in the storage 2a2. The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Figure 3:
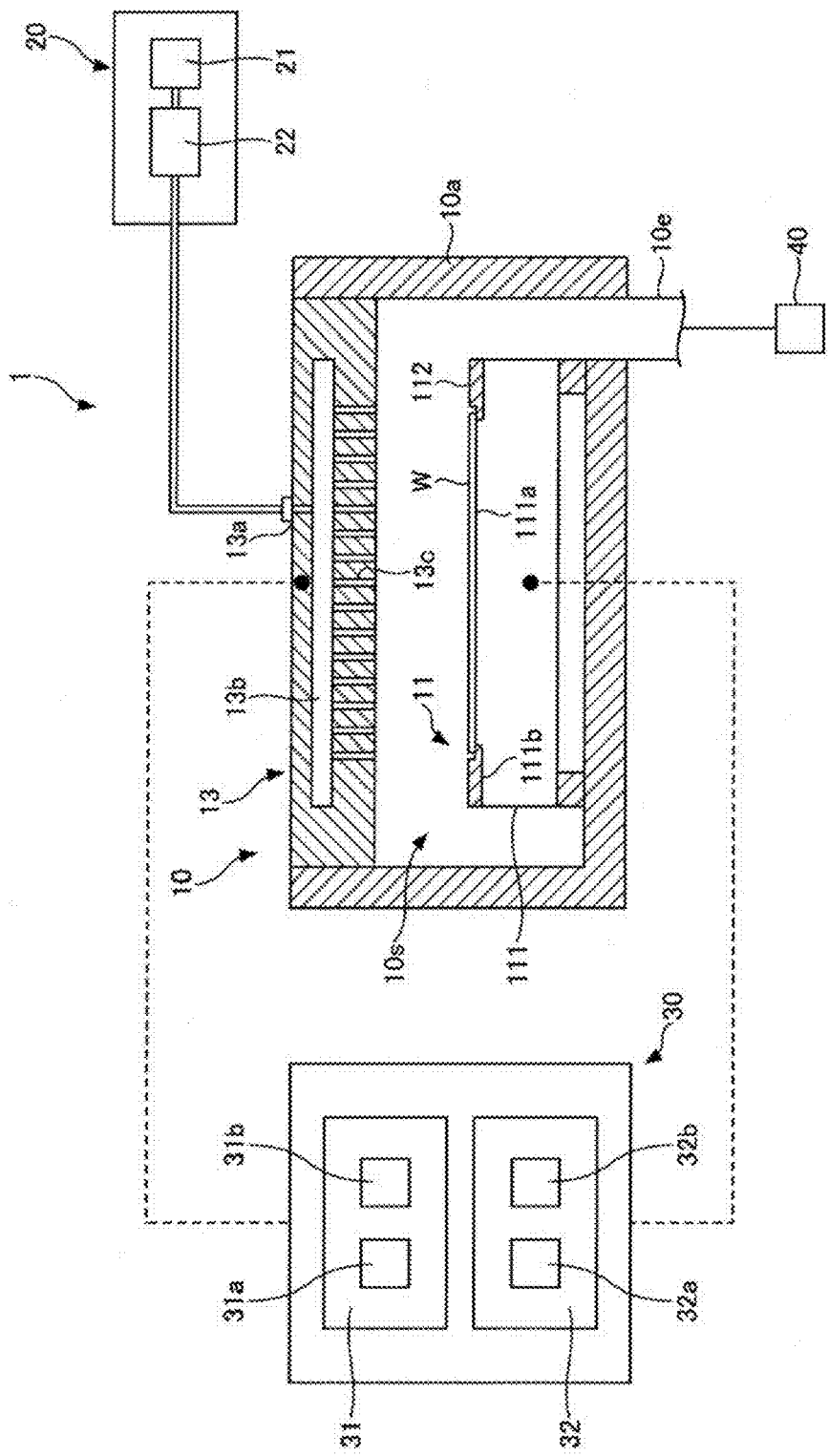
FIG. 3 is a view illustrating an example of a plasma processing apparatus of the embodiment.

Hereinafter, a configuration example of a capacitively coupled plasma processing apparatus as an example of the plasma processing apparatus 1 will be described with reference to FIG. 3.

A capacitively coupled plasma processing apparatus 1 includes a plasma processing chamber 10, a gas supply 20, a power source 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of the ceiling of the plasma processing chamber 10. The plasma processing chamber 10 has a plasma processing space 10*s* defined by the shower head 13, a sidewall 10*a* of the plasma processing chamber 10, and the substrate support 11. The sidewall 10*a* is grounded. The shower head 13 and the substrate support 11 are electrically insulated from a housing of the plasma processing chamber 10.

The substrate support 11 includes a main body 111 and a ring assembly 112. The main body 111 has a central region (substrate support surface) 111*a* for supporting the substrate (wafer) W, and an annular region (ring support surface) 111*b* for supporting the ring assembly 112. The annular region 111*b* of the main body 111 surrounds the central region 111*a* of the main body 111 in a plan view. The substrate W is disposed on the central region 111*a* of the main body 111, and the ring assembly 112 is disposed on the annular region 111*b* of the main body 111 to surround the substrate W on the central region 111*a* of the main body 111. In one embodiment, the main body 111 includes a base and an electrostatic chuck. The base includes a conductive member. The conductive member of the base functions as a lower electrode. The electrostatic chuck is disposed on the base. The upper surface of the electrostatic chuck has a substrate support surface 111*a*. The ring assembly 112 includes one or more annular members. At least one of the one or more annular members is an edge ring. Although not illustrated, the substrate support 11 may include a temperature control module configured to adjust at least one of the electrostatic chuck, the ring assembly 112, and the substrate to a target temperature. The temperature control module may include a heater, a heat transfer medium, a flow path, or a combination thereof. A heat transfer fluid, such as brine or gas, flows through the flow path. Further, the substrate support 11 may include a heat transfer gas supply configured to supply a heat transfer gas between the rear surface of the substrate W and the substrate support surface 111*a*.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes a conductive member. The conductive member of the shower head 13 functions as an upper electrode. The gas introduction unit may include, in addition to the shower head 13, one or more side gas injectors (SGI) that are attached to one or more openings formed in the sidewall 10*a*.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include at least one flow rate modulation device that modulates or causes the flow rate of at least one processing gas to pulsate.

The power source 30 includes an RF power source 31 coupled to the plasma processing chamber 10 via at least one impedance matching circuit. The RF power source 31 is configured to supply at least one RF signal (RF power), such as the source RF signal and the bias RF signal, to the conductive member of the substrate support 11 and/or the conductive member of the shower head 13. As a result, plasma is formed from at least one processing gas supplied into the plasma processing space 10*s*. Accordingly, the RF power source 31 may function as at least a part of the plasma generator 12. Further, the supply of the bias RF signal to the conductive member of the substrate support 11 can generate a bias potential in the substrate W to draw an ion component in the formed plasma to the substrate W.

In one embodiment, the RF power source 31 includes a first RF generator 31*a* and a second RF generator 31*b*. The first RF generator 31*a* is coupled to the conductive member of the substrate support 11 and/or the conductive member of the shower head 13 via at least one impedance matching circuit, and configured to generate a source RF signal (source RF power) for plasma generation. In one embodiment, the source RF signal has a frequency in the range of 13 MHz to 150 MHz. In one embodiment, the first RF generator 31*a* may be configured to generate a plurality of source RF signals having different frequencies. One or more source RF signals so generated are supplied to the conductive member of the substrate support 11 and/or the conductive member of the shower head 13. The second RF generator 31*b* is coupled to the conductive member of the substrate support 11 via at least one impedance matching circuit, and configured to generate a bias RF signal (bias RF power). In one embodiment, the bias RF signal has a lower frequency than the source RF signal. In one embodiment, the bias RF signal has a frequency in the range of 400 kHz to 13.56 MHz. In one embodiment, the second RF generator 31*b* may be configured to generate a plurality of bias RF signals having different frequencies. One or more bias RF signals so generated are supplied to the conductive member of the substrate support 11. Further, in various embodiments, at least one of the source RF signal and the bias RF signal may pulsate.

Further, the power source 30 may include a DC power source 32 coupled to the plasma processing chamber 10. The DC power source 32 includes a first DC generator 32*a* and a second DC generator 32*b*. In one embodiment, the first DC generator 32*a* is connected to the conductive member of the substrate support 11 and configured to generate a first DC signal. The generated first DC signal is applied to the conductive member of the substrate support 11. In one embodiment, the first DC signal may be applied to another electrode, such as an electrode in an electrostatic chuck. In one embodiment, the second DC generator 32*b* is configured to be connected to the conductive member of the shower head 13 and to generate a second DC signal. The generated second DC signal is applied to the conductive member of the shower head 13. In various embodiments, the first and second DC signals may pulsate. The first and second DC generators 32*a* and 32*b* may be provided in addition to the RF power source 31, and the first DC generator 32*a* may be provided instead of the second RF generator 31*b*.

The exhaust system 40 may be connected to, for example, a gas exhaust port 10*e* disposed at a bottom portion of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

[Calculation Method of Relative Position]

An example of a method for calculating a relative position between the fork FK11 of the vacuum transfer robot TR1 and the substrate W will be described with reference to FIGS. 4A and 4B. The same method may be used to calculate a relative positions between the forks FK12 of the vacuum transfer robot TR1 and the forks FK21 and FK22 of the vacuum transfer robot TR2 and the substrate W.

Figure 4A:
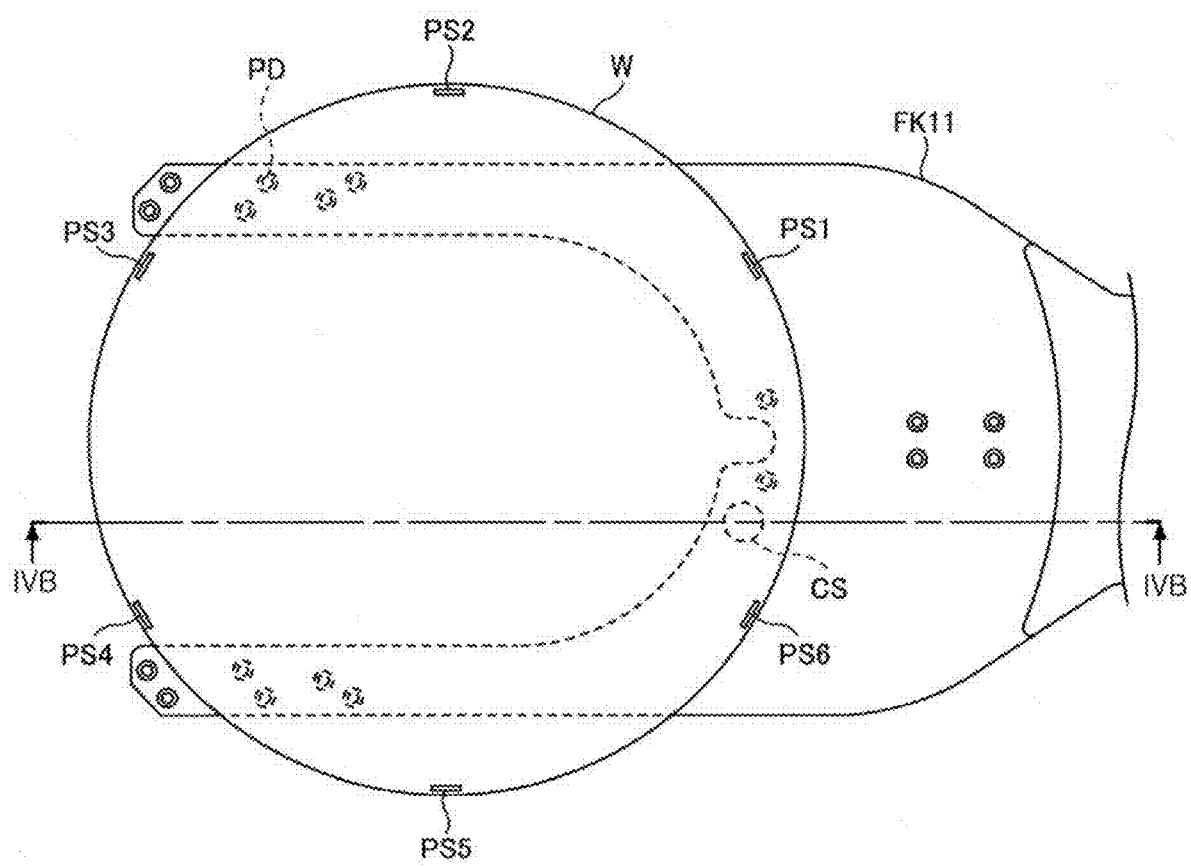
FIGS. 4A and 4B are explanatory views of a relative position between a fork of a vacuum transfer robot and a substrate.
Figure 4B:
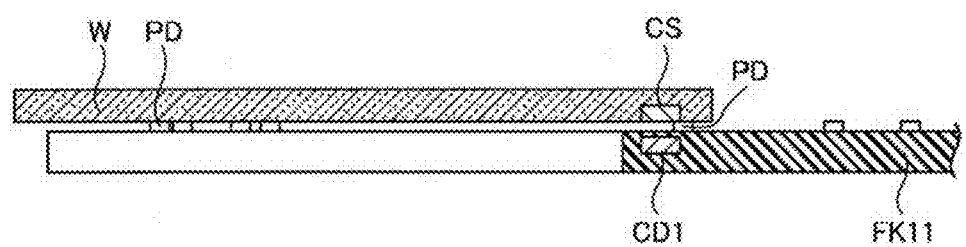

FIGS. 4A and 4B are explanatory views of the relative position between the fork FK11 of the vacuum transfer robot TR1 and the substrate W. FIG. 4A is a plan view of the fork FK11 holding the substrate W. FIG. 4B is a cross sectional view of the fork FK11 holding the substrate W, and illustrates a cross section taken along the chain line IVB-IVB in FIG. 4A.

The fork FK11 has a substantially U-shape in a plan view. The fork FK11 includes a plurality of pads PD, a conductor CD1, and the like. The plurality of pads PD comes into contact with a lower surface of the substrate W to hold the substrate W. The conductor CD1 is provided at a position where a center thereof coincides with a center of an electrostatic capacitance sensor CS in a plan view, when the substrate W is installed at a given position (for example, a central position) of the fork FK11. The conductor CD1 is, for example, aluminum.

The substrate W is a disk-shaped sensor wafer. The substrate W includes position detection sensors PS1 to PS6, the electrostatic capacitance sensor CS, and the like.

The position detection sensors PS1 to PS6 are disposed on the same circumference on, for example, an outer peripheral portion of a surface of the substrate W. The position detection sensors PS1 to PS6 may be, for example, cameras configured to be able to capture a lower part or a side part of the substrate W. However, types of the position detection sensors PS1 to PS6 are not limited thereto.

The electrostatic capacitance sensor CS is provided at a given position of the substrate W. When the substrate W is held by the fork FK11, the electrostatic capacitance sensor CS detects an electrostatic capacitance according to a positional relationship with the conductor CD1 provided in the fork FK11, and outputs a detected value (detected result) to the controller CU.

An example of a method for calculating a relative position between the fork FK31 of the atmospheric transfer robot TR3 and the substrate W will be described with reference to FIGS. 5A and 5B.

Figure 5A:
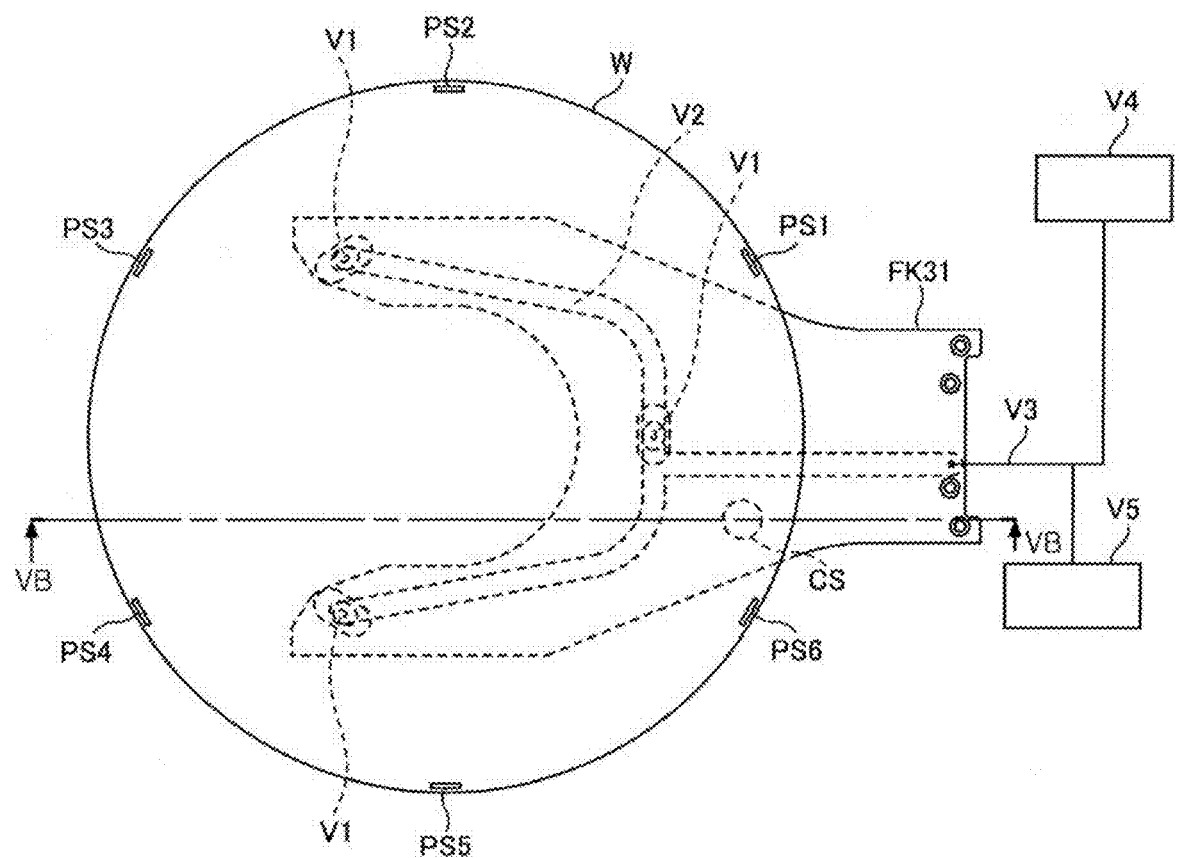
FIGS. 5A and 5B are explanatory views of the relative position between a fork of an atmospheric transfer robot and the substrate.
Figure 5B:
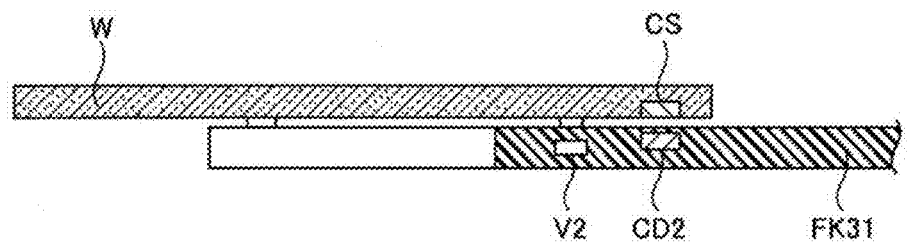

FIGS. 5A and 5B are explanatory views of the relative position between the fork FK31 of the atmospheric transfer robot TR3 and the substrate W. FIG. 5A is a plan view of the fork FK31 that holds the substrate W. FIG. 5B is a cross sectional view of the fork FK31 holding the substrate W, and illustrates a cross section taken along the chain line VB-VB in FIG. 5A.

The fork FK31 has a substantially U-shape in a plan view. The fork FK31 includes a plurality of suction holes V1, a suction path V2, and a conductor CD2. The fork FK31 vacuum-adsorbs the lower surface of the substrate W by the plurality of suction holes V1 and holds the substrate W. The plurality of suction holes V1 are connected to an exhaust device V4 via a suction path V2 and an exhaust pipe V3. The exhaust device V4 includes a valve, a regulator, a vacuum pump, and the like, and exhausts the inside of the suction path V2 and the exhaust pipe V3 while adjusting pressure.

An adsorption sensor V5 is interposed in the exhaust pipe V3. The adsorption sensor V5 detects the pressure in the exhaust pipe V3 (hereinafter, also referred to as an "adsorption pressure") and outputs the pressure to the controller CU. The controller CU calculates a height position when an upper surface of the fork FK31 comes into contact with the lower surface of the substrate W, based on the adsorption pressure detected by the adsorption sensor V5. The conductor CD2 is provided at a position where a center thereof coincides with a center of the electrostatic capacitance sensor CS in a plan view, when the substrate W is installed at a given position (for example, a central position) of the fork FK31. The conductor CD2 is, for example, aluminum.

The substrate W is the same as the substrate W illustrated in FIGS. 4A and 4B. That is, the substrate W is a disk-shaped sensor wafer. The substrate W includes position detection sensors PS1 to PS6, the electrostatic capacitance sensor CS, and the like.

The electrostatic capacitance sensor CS is provided at a given position of the substrate W. When the substrate W is adsorbed and held by the fork FK31, the electrostatic capacitance sensor CS detects an electrostatic capacitance according to a positional relationship with the conductor CD2 provided in the fork FK31, and outputs a detected value (detected result) to the controller CU.

Figure 6:
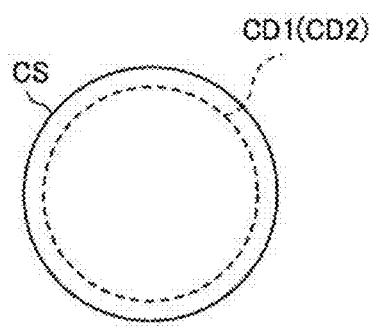
FIG. 6 is a view illustrating an example of an electrostatic capacitance sensor.

As illustrated in FIG. 6, for example, the electrostatic capacitance sensor CS has a circular shape larger than the conductor CD1 (CD2) in a plan view. However, the electrostatic capacitance sensor CS may have a circular shape having the same size as the conductor CD1 (CD2) in a plan view, or may have a circular shape smaller than the conductor CD1 (CD2) in a plan view. Further, the electrostatic capacitance sensor CS may have a shape different from a circular shape, for example, a polygonal shape such as a rectangular shape.

Figure 7:
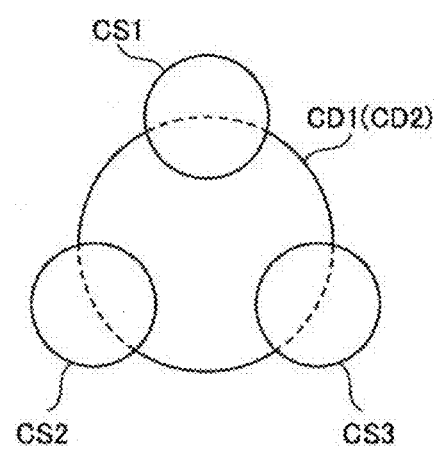
FIG. 7 is a view illustrating another example of the electrostatic capacitance sensor.

The electrostatic capacitance sensor CS may include, for example, three electrostatic capacitance sensors CS1 to CS3 disposed at vertices of an equilateral triangle in a plan view, as illustrated in FIG. 7. The three electrostatic capacitance sensors CS1 to CS3 each have a circular shape smaller than the conductor CD1 (CD2) in a plan view. However, each of the plurality of electrostatic capacitance sensors may have a shape different from a circular shape, for example, a polygonal shape such as a rectangular shape. Further, the electrostatic capacitance sensor CS may include two electrostatic capacitance sensors, or may include four or more electrostatic capacitance sensors.

In the examples of FIGS. 4A to 5B, a case where the electrostatic capacitance sensor CS is provided in the substrate W has been described. However, the present disclosure is not limited thereto. For example, the electrostatic capacitance sensor CS may be provided in the forks FK11 and FK31.

[Alignment Method]

An alignment method of the embodiment will be described by taking as an example a case where the alignment method is performed in the above-described processing system PS.

The alignment method of the embodiment is performed, for example, when the processing system PS is started. Further, the alignment method of the embodiment is performed, for example, when the forks FK11 and FK12 of the vacuum transfer robot TR1, the forks FK21 and FK22 of the vacuum transfer robot TR2, and the fork FK31 of the atmospheric transfer robot TR3 are replaced. Further, the alignment method of the embodiment is performed, for example, when components (for example, the electrostatic chuck and the edge ring) in the process modules PM1 to PM12 are replaced. However, a timing at which the alignment method of the embodiment is performed is not limited to the illustrated timing.

Further, it is preferable to perform rough teaching before the alignment method of the embodiment is performed. In the rough teaching, transfer position coordinates for the fork of the transfer robot are tentatively determined with respect to the transfer location of the transfer target object. The rough teaching is performed to prevent the transfer target object held by the fork from coming into contact with a member or the like in the processing system, and the transfer position coordinates are tentatively determined with a coarse accuracy. When an assembly error of the processing system is small, for example, the transfer position coordinates may be calculated from design numerical values of the processing system, and the rough teaching may be omitted.

Hereinafter, an alignment method of the atmospheric transfer robot TR3 will be described first, and then, an alignment method of the vacuum transfer robots TR1 and TR2 will be described subsequently.

(Alignment Method of Atmospheric Transfer Robot)

Figure 8:
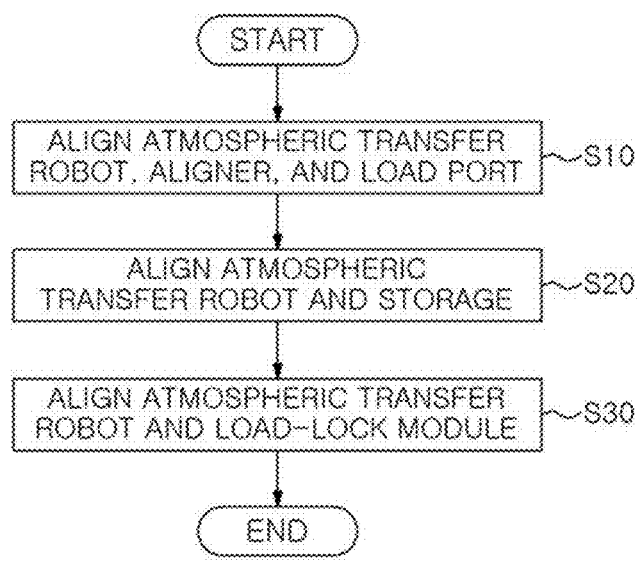
FIG. 8 is a flow chart illustrating an example of an alignment method of the atmospheric transfer robot.

An example of the alignment method of the atmospheric transfer robot TR3 will be described with reference to FIG. 8. As illustrated in FIG. 8, in the alignment method of the atmospheric transfer robot TR3, first, in step S10, the atmospheric transfer robot TR3, the aligner AN, and the load ports LP1 to LP4 are aligned with one another. Subsequently, in step S20, the atmospheric transfer robot TR3 and the storage SR are aligned with each other. Subsequently, in step S30, the atmospheric transfer robot TR3 is aligned with the load-lock modules LL1 and LL2. However, the order of step S20 and step S30 may be interchanged.

Figure 9:
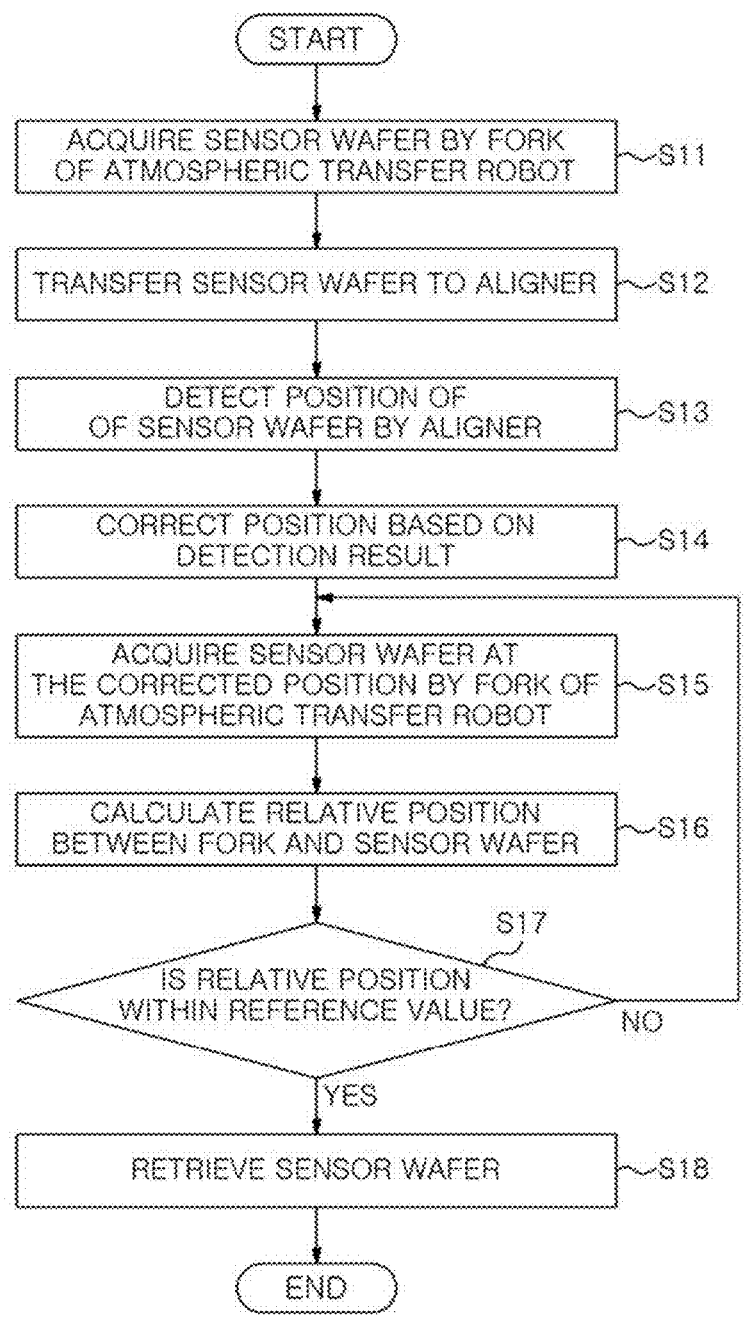
FIG. 9 is a flow chart illustrating an example of alignment of the atmospheric transfer robot, an aligner, and a load port.

An example of the alignment between the atmospheric transfer robot TR3, the aligner AN, and the load port LP1 (step S10) will be described with reference to FIG. 9. It is assumed that, at the start of step S10, the container C, in which the sensor wafer is accommodated, has been placed at the load port LP1.

In step S11, the controller CU controls the atmospheric transfer robot TR3 to acquire the sensor wafer from the container C placed at the load port LP1 by the fork FK31. At this time, the controller CU calculates the height position when the upper surface of the fork FK31 comes into contact with the lower surface of the sensor wafer, based on the detected value of the adsorption sensor V5 of the fork FK31. Further, the controller CU corrects a teaching position of the Z axis based on the calculated height position.

In step S12, the controller CU controls the atmospheric transfer robot TR3 to transfer the sensor wafer acquired by the fork FK31 to the aligner AN.

In step S13, the controller CU controls the aligner AN to detect a position of the sensor wafer in the horizontal direction. The position in the horizontal direction includes the angular position of the notch, the central position of the sensor wafer, and the like.

In step S14, the controller CU calculates the misalignment amount between the load port LP1 and the aligner AN in the horizontal direction based on the detected result of the aligner AN. Further, the controller CU corrects a teaching position of an X axis and a teaching position of a Y axis based on the calculated misalignment amount.

In step S15, the controller CU controls the atmospheric transfer robot TR3 to acquire the sensor wafer from the aligner AN by the fork FK31 at the corrected position.

In step S16, the controller CU calculates a relative position between the fork FK31 and the sensor wafer. For example, the controller CU calculates the relative position between the fork FK31 and the sensor wafer based on the detected value of the electrostatic capacitance sensor CS provided in the sensor wafer. Alternatively, the controller CU may calculate the relative position between the fork FK31 and the sensor wafer based on the detected values of the position detection sensors PS1 to PS6 provided in the sensor wafer.

In step S17, the controller CU determines whether or not the calculated relative position between the fork FK31 and the sensor wafer is within a reference value. When the relative position is within the reference value in step S17, the controller CU causes the process to proceed to step S18. Meanwhile, when the relative position is not within the reference value in step S17, the controller CU corrects the teaching position such that the relative position comes within the reference value, and returns the process to step S15.

In step S18, the controller CU controls the atmospheric transfer robot TR3 to transfer the sensor wafer acquired by the fork FK31 to a given retrieval position. The given retrieval position may be the container C placed at the load port LP1, the storage SR, or the like. After the sensor wafer is retrieved, the controller CU ends the process.

While an example of the alignment among the atmospheric transfer robot TR3, the aligner AN, and the load port LP1 has been described above, the load ports LP2 to LP4 can also be aligned by the same method as the load port LP1.

Figure 10:
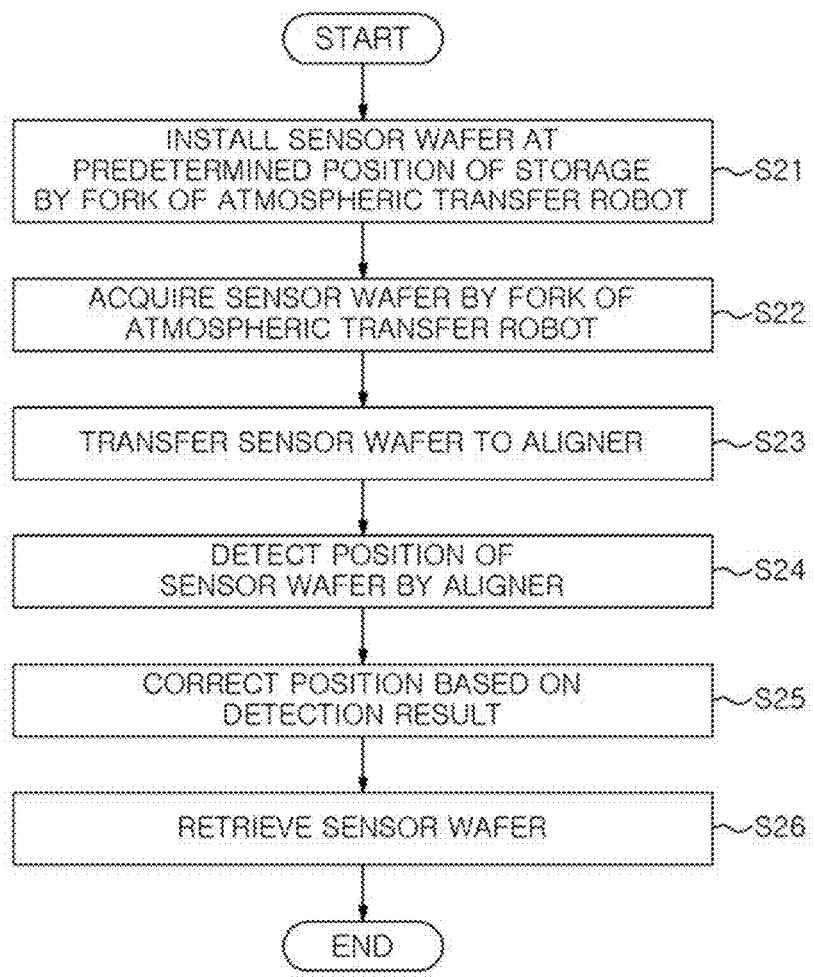
FIG. 10 is a flow chart illustrating an example of alignment between the atmospheric transfer robot and a storage.

An example of the alignment between the atmospheric transfer robot TR3 and the storage SR (step S20) will be described with reference to FIG. 10. It is assumed that, at the start of step S20, the alignment of the atmospheric transfer robot TR3, the aligner AN, and the load port LP1 (step S10) has been completed.

In step S21, the controller CU controls the atmospheric transfer robot TR3 to install the sensor wafer at a given position (for example, a central position) of the storage SR by the fork FK31. At this time, the controller CU controls the atmospheric transfer robot TR3 to install the sensor wafer at a given position of the storage SR, based on the detected values of the position detection sensors PS1 to PS6 of the sensor wafer.

In step S22, the controller CU controls the atmospheric transfer robot TR3 to acquire the sensor wafer from the storage SR by the fork FK31. At this time, the controller CU calculates the height position when the upper surface of the fork FK31 comes into contact with the lower surface of the sensor wafer, based on the detected value of the adsorption sensor V5 of the fork FK31. Further, the controller CU corrects the teaching position of the Z axis based on the calculated height position.

In step S23, the controller CU controls the atmospheric transfer robot TR3 to transfer the sensor wafer to the aligner AN by the fork FK31.

In step S24, the controller CU controls the aligner AN to detect the position of the sensor wafer in the horizontal direction.

In step S25, the controller CU calculates the misalignment amount between the storage SR and the aligner AN in the horizontal direction based on the detected result of the aligner AN. Further, the controller CU corrects the teaching position of the X axis and the teaching position of the Y axis based on the calculated misalignment amount.

In step S26, the controller CU controls the atmospheric transfer robot TR3 to transfer the sensor wafer to a given retrieval position by the fork FK31. The given retrieval position may be the container C placed at the load port LP1, the storage SR, or the like. After the sensor wafer is retrieved, the controller CU ends the process.

Figure 11:
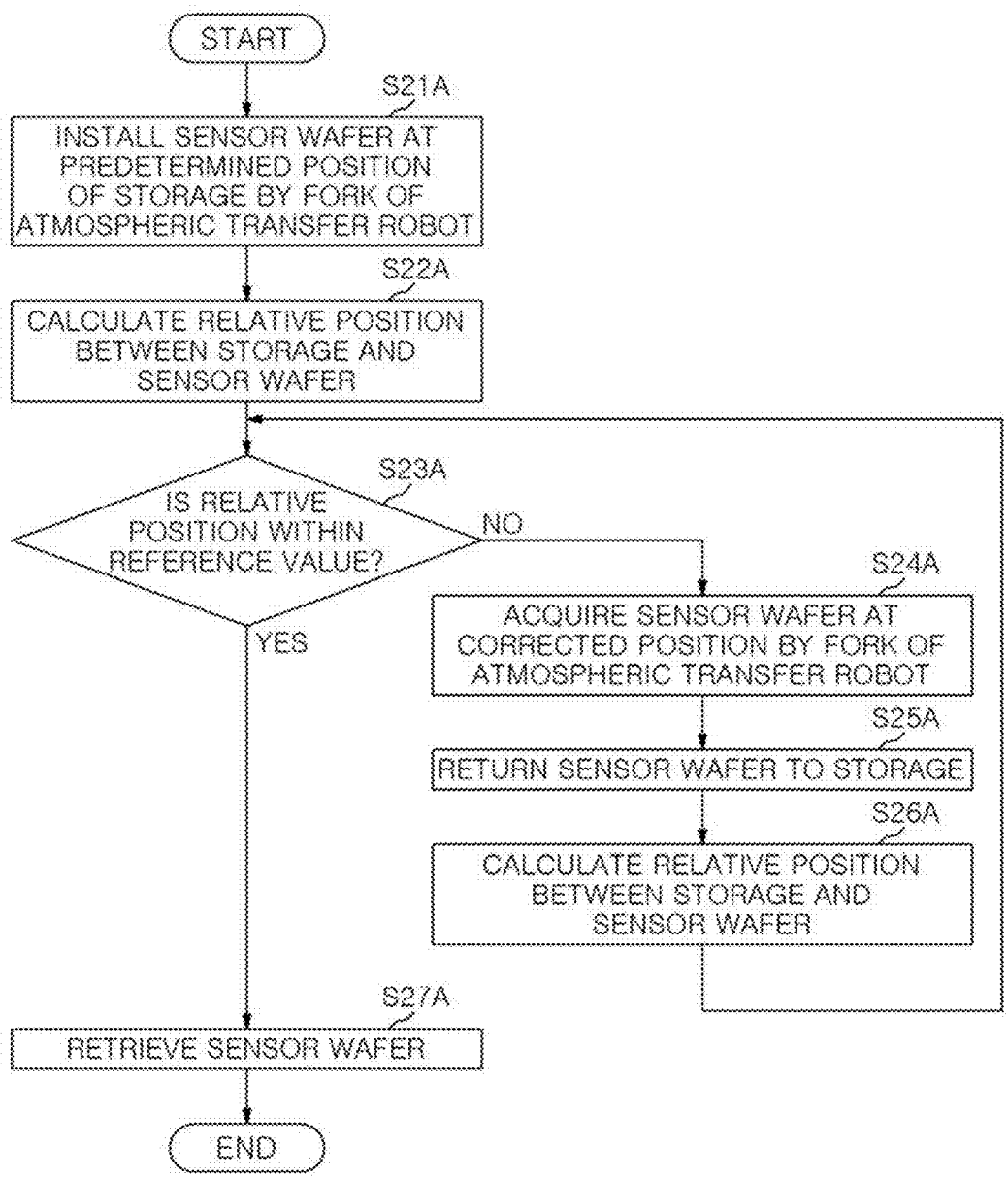
FIG. 11 is a flow chart illustrating another example of the alignment between the atmospheric transfer robot and the storage.

Another example of the alignment (step S20) between the atmospheric transfer robot TR3 and the storage SR will be described with reference to FIG. 11. It is assumed that, at the start of step S20, the alignment among the atmospheric transfer robot TR3, the aligner AN, and the load port LP1 (step S10) has been completed.

In step S21A, the controller CU controls the atmospheric transfer robot TR3 to install the sensor wafer at a given position (for example, a central position) of the storage SR by the fork FK31. Further, the controller CU calculates the height position when the upper surface of the fork FK31 comes into contact with the lower surface of the sensor wafer, based on the detected value of the adsorption sensor V5 of the fork FK31. Further, the controller CU corrects the teaching position of the Z axis based on the calculated height position.

In step S22A, the controller CU calculates a relative position between the storage SR and the sensor wafer. For example, the controller CU calculates the relative position between the storage SR and the sensor wafer based on the detected values of the position detection sensors PS1 to PS6 provided in the sensor wafer. Alternatively, the controller CU may calculate the relative position between the storage SR and the sensor wafer based on the detected value of the electrostatic capacitance sensor CS provided in the sensor wafer.

In step S23A, the controller CU determines whether or not the calculated relative position between the storage SR and the sensor wafer is within the reference value. When the relative position is within the reference value in step S23A, the controller CU causes the process to proceed to step S27A. Meanwhile, when the relative position is not within the reference value in step S23A, the controller CU corrects the teaching position such that the relative position comes within the reference value, and causes the process to proceed to step S24A.

In step S24A, the controller CU controls the atmospheric transfer robot TR3 to acquire the sensor wafer from the storage SR by the fork FK31 at the corrected position.

In step S25A, the controller CU controls the atmospheric transfer robot TR3 to return the sensor wafer, which is acquired by the fork FK31, to the storage SR.

In step S26A, the controller CU calculates the relative position between the storage SR and the sensor wafer. For example, the controller CU calculates the relative position between the storage SR and the sensor wafer based on the detected values of the position detection sensors PS1 to PS6 provided in the sensor wafer. Alternatively, the controller CU may calculate the relative position between the storage SR and the sensor wafer based on the detected value of the electrostatic capacitance sensor CS provided in the sensor wafer. After calculating the relative position, the controller CU returns the process to step S23A.

In step S27A, the controller CU controls the atmospheric transfer robot TR3 to transfer the sensor wafer to the given retrieval position by the fork FK31. The given retrieval position may be the container C placed at the load port LP1, the storage SR, or the like. After the sensor wafer is retrieved, the controller CU ends the process.

Figure 12:
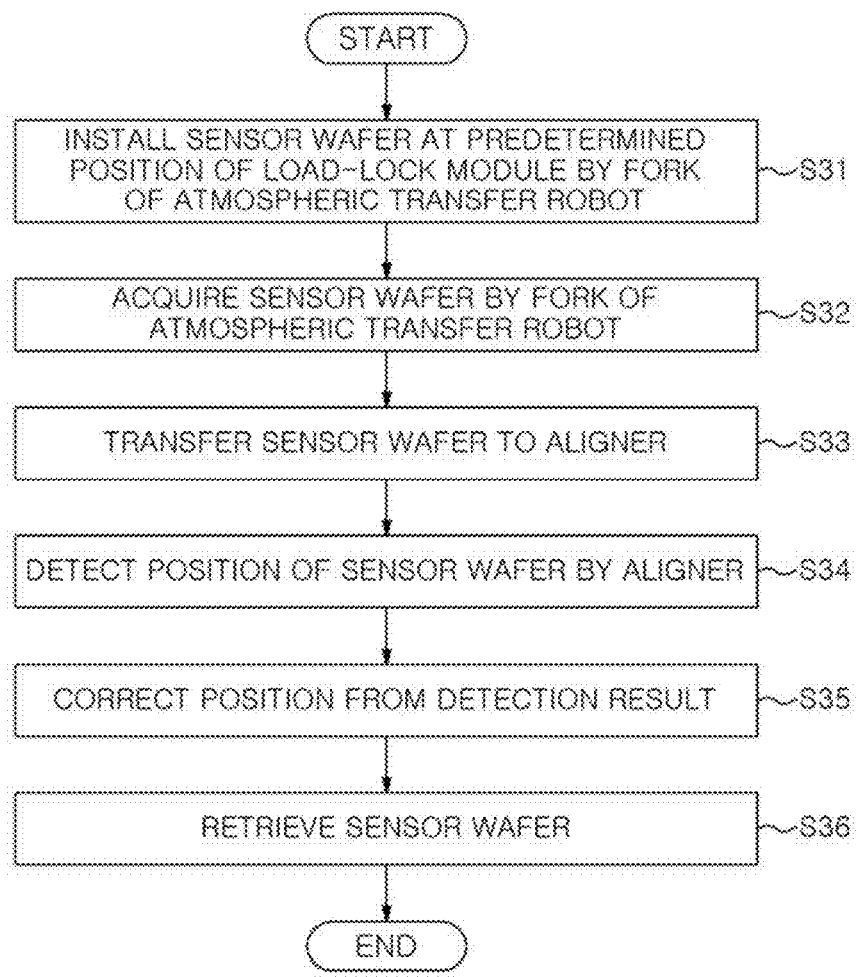
FIG. 12 is a flow chart illustrating an example of alignment between the atmospheric transfer robot and a load-lock module.

An example of the alignment (step S30) between the atmospheric transfer robot TR3 and the load-lock module LL1 will be described with reference to FIG. 12. It is assumed that, at the start of step S30, the alignment among the atmospheric transfer robot TR3, the aligner AN, and the load port LP1 (step S10) has been completed.

In step S31, the controller CU controls the atmospheric transfer robot TR3 to install the sensor wafer at a given position (for example, a central position) of the load-lock module LL1 by the fork FK31. At this time, the controller CU controls the atmospheric transfer robot TR3 to install the sensor wafer at the given position of the load-lock module LL1, based on the detected values of the position detection sensors PS1 to PS6 of the sensor wafer.

In step S32, the controller CU controls the atmospheric transfer robot TR3 to acquire the sensor wafer from the load-lock module LL1 by the fork FK31. At this time, the controller CU calculates the height position when the upper surface of the fork FK31 comes into contact with the lower surface of the sensor wafer, based on the detected value of the adsorption sensor V5 of the fork FK31. Further, the controller CU corrects the teaching position of the Z axis based on the calculated height position.

In step S33, the controller CU controls the atmospheric transfer robot TR3 to transfer the sensor wafer to the aligner AN by the fork FK31.

In step S34, the controller CU controls the aligner AN to detect the position of the sensor wafer in the horizontal direction.

In step S35, the controller CU calculates the misalignment amount between the load-lock module LL1 and the aligner AN in the horizontal direction based on the detected result of the aligner AN. Further, the controller CU corrects the teaching position of the X axis and the teaching position of the Y axis based on the calculated misalignment amount.

In step S36, the controller CU controls the atmospheric transfer robot TR3 to transfer the sensor wafer to a given retrieval position by the fork FK31. The given retrieval position may be the container C placed at the load port LP1, the storage SR, or the like. After the sensor wafer is retrieved, the controller CU ends the process.

While an example of the alignment between the atmospheric transfer robot TR3 and the load-lock module LL1 has been described above, the load-lock module LL2 can also be aligned by the same method as the load-lock module LL1.

Figure 13:
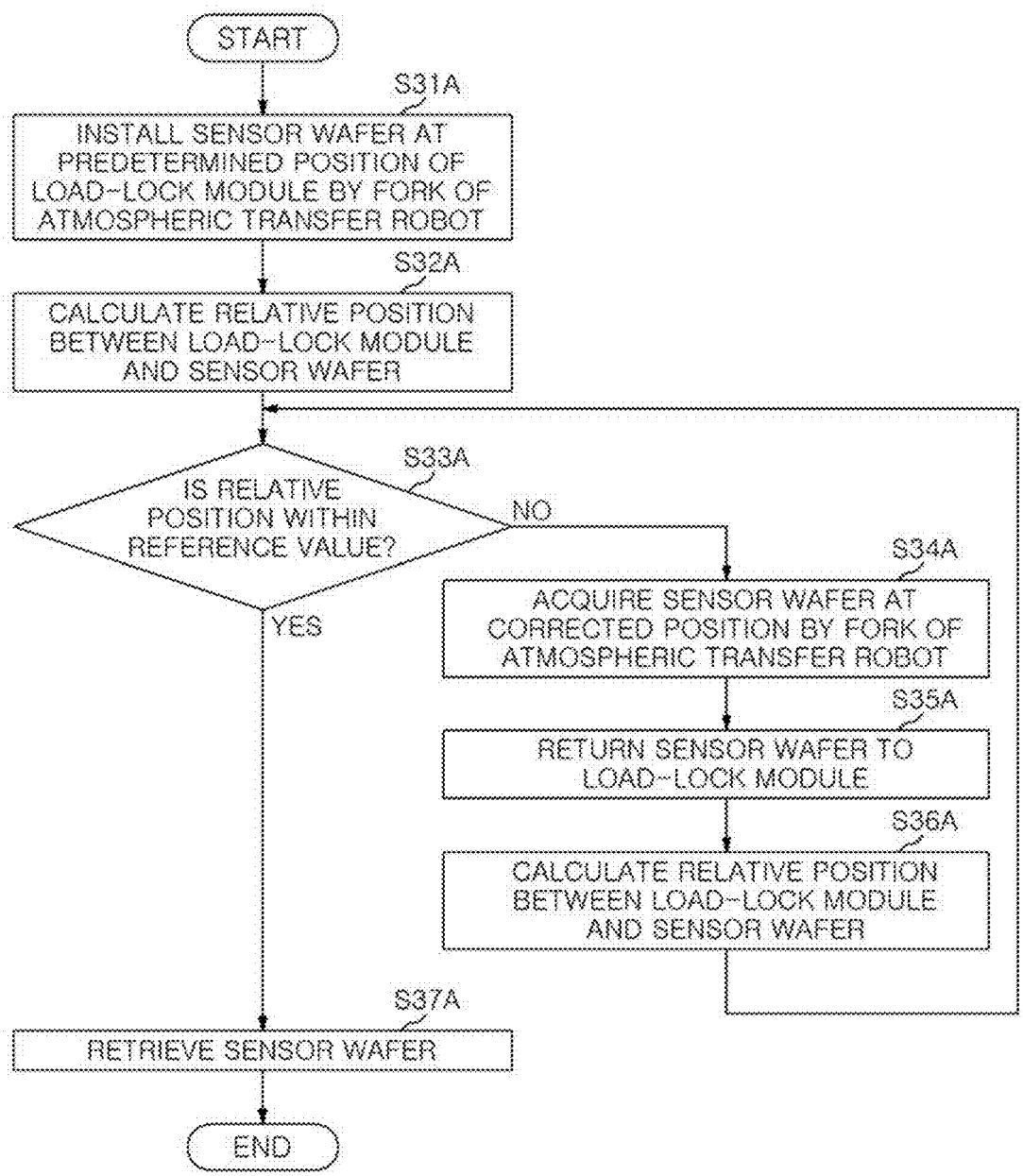
FIG. 13 is a flow chart illustrating another example of the alignment between the atmospheric transfer robot and the load-lock module.

Another example of the alignment (step S20) between the atmospheric transfer robot TR3 and the load-lock module LL1 will be described with reference to FIG. 13. It is assumed that, at the start of step S30, the alignment among the atmospheric transfer robot TR3, the aligner AN, and the load port LP1 (step S10) has been completed.

In step S31A, the controller CU controls the atmospheric transfer robot TR3 to install the sensor wafer at a given position (for example, a central position) of the load-lock module LL1 by the fork FK31. Further, the controller CU calculates the height position when the upper surface of the fork FK31 comes into contact with the lower surface of the sensor wafer, based on the detected value of the adsorption sensor V5 of the fork FK31. Further, the controller CU corrects the teaching position of the Z axis based on the calculated height position.

In step S32A, the controller CU calculates a relative position between the load-lock module LL1 and the sensor wafer. For example, the controller CU calculates the relative position between the load-lock module LL1 and the sensor wafer based on the detected values of the position detection sensors PS1 to PS6 provided in the sensor wafer. Alternatively, the controller CU may calculate the relative position between the load-lock module LL1 and the sensor wafer based on the detected value of the electrostatic capacitance sensor CS provided in the sensor wafer.

In step S33A, the controller CU determines whether or not the calculated relative position between the load-lock module LL1 and the sensor wafer is within the reference value. When the relative position is within the reference value in step S33A, the controller CU causes the process to proceed to step S37A. Meanwhile, when the relative position is not within the reference value in step S33A, the controller CU corrects the teaching position such that the relative position comes within the reference value, and causes the process to proceed to step S34A.

In step S34A, the controller CU controls the atmospheric transfer robot TR3 to acquire the sensor wafer from the load-lock module LL1 by the fork FK31 at the corrected position.

In step S35A, the controller CU controls the atmospheric transfer robot TR3 to return the sensor wafer acquired by the fork FK31 to the load-lock module LL1.

In step S36A, the controller CU calculates the relative position between the load-lock module LL1 and the sensor wafer. For example, the controller CU calculates the relative position between the load-lock module LL1 and the sensor wafer based on the detected values of the position detection sensors PS1 to PS6 provided in the sensor wafer. Alternatively, the controller CU may calculate the relative position between the load-lock module LL1 and the sensor wafer based on the detected value of the electrostatic capacitance sensor CS provided in the sensor wafer. After calculating the relative position, the controller CU returns the process to step S33A.

In step S37A, the controller CU controls the atmospheric transfer robot TR3 to transfer the sensor wafer to the given position by the fork FK31. The given retrieval position may be the container C placed at the load port LP1, the storage SR, or the like. After the sensor wafer is retrieved, the controller CU ends the process.

While another example of the alignment between the atmospheric transfer robot TR3 and the load-lock module LL1 has been described above, the load-lock module LL2 can also be aligned by the same method as the load-lock module LL1.

(Alignment of Vacuum Transfer Robot)

Figure 14:
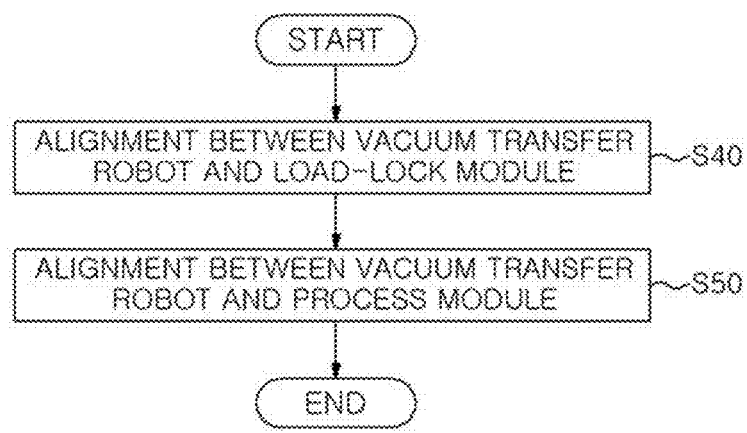
FIG. 14 is a flow chart illustrating an example of an alignment method of the vacuum transfer robot.

An example of an alignment method of the vacuum transfer robots TR1 and TR2 will be described with reference to FIG. 14. As illustrated in FIG. 14, in the alignment method of the vacuum transfer robots TR1 and TR2, first, in step S40, the vacuum transfer robots TR1 and TR2 and the load-lock modules LL1 and LL2 are aligned with each other. In step S50, the vacuum transfer robots TR1 and TR2 and the process modules PM1 to PM12 are aligned with each other.

Figure 15:
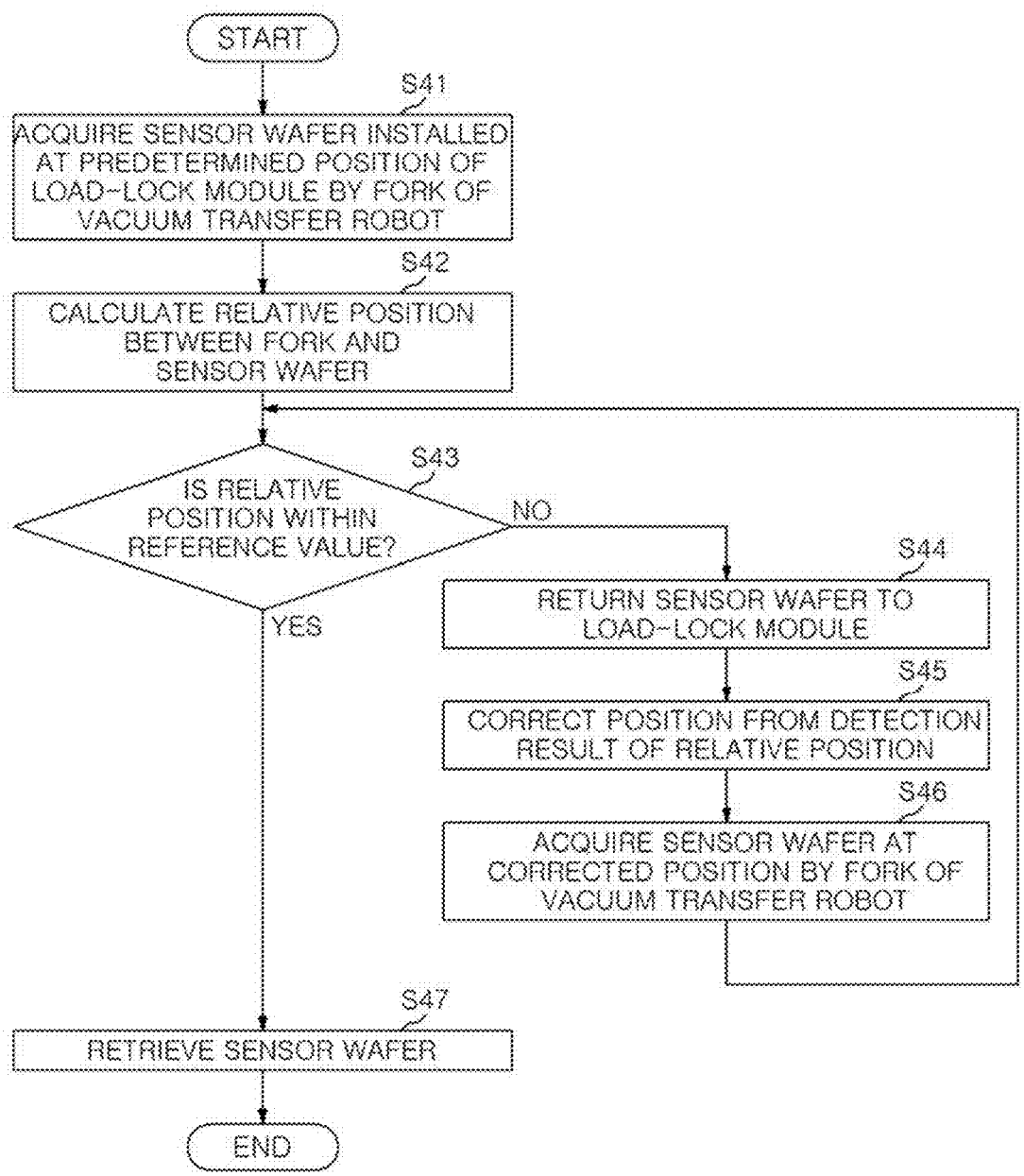
FIG. 15 is a flow chart illustrating an example of alignment between the vacuum transfer robot and the load-lock module.

An example of the alignment (step S40) between the fork FK11 of the vacuum transfer robot TR1 and the load-lock module LL1 will be described with reference to FIG. 15. At the start of step S40, the sensor wafer is to be installed at a given position (for example, a central position) of the load-lock module LL1.

In step S41, the controller CU controls the vacuum transfer robot TR1 to acquire the sensor wafer installed at a given position (for example, a central position) of the load-lock module LL1 by the fork FK11.

In step S42, the controller CU calculates a relative position between the fork FK11 and the sensor wafer. For example, the controller CU calculates the relative position between the fork FK11 and the sensor wafer based on the detected value of the electrostatic capacitance sensor CS provided in the sensor wafer. Alternatively, the controller CU may calculate the relative position between the fork FK11 and the sensor wafer based on the detected values of the position detection sensors PS1 to PS6 provided in the sensor wafer.

In step S43, the controller CU determines whether or not the calculated relative position between the fork FK11 and the sensor wafer is within the reference value. When the relative position is within the reference value in step S43, the controller CU causes the process to proceed to step S47. Meanwhile, when the relative position is not within the reference value in step S43, the controller CU corrects the teaching position such that the relative position comes within the reference value, and causes the process to proceed to step S43.

In step S44, the controller CU controls the vacuum transfer robot TR1 to return the sensor wafer to the load-lock module LL1 by the fork FK11.

In step S45, the controller CU calculates the misalignment amount between the fork FK11 and the load-lock module LL1 in the horizontal direction based on the detected result of the relative position. Further, the controller CU corrects the teaching position of the X axis and the teaching position of the Y axis based on the calculated misalignment amount.

In step S46, the controller CU controls the vacuum transfer robot TR1 to acquire the sensor wafer from the load-lock module LL1 by the fork FK11 at the corrected position.

In step S47, the controller CU controls the vacuum transfer robot TR1 to transfer the sensor wafer to a given retrieval position by the fork FK11. The given retrieval position may be the load-lock module LL1 or the like. After the sensor wafer is retrieved, the controller CU ends the process.

While an example of the alignment between the fork FK11 of the vacuum transfer robot TR1 and the load-lock module LL1 has been described above, the load-lock module LL2 can also be aligned by the same method as the load-lock module LL1.

Figure 16:
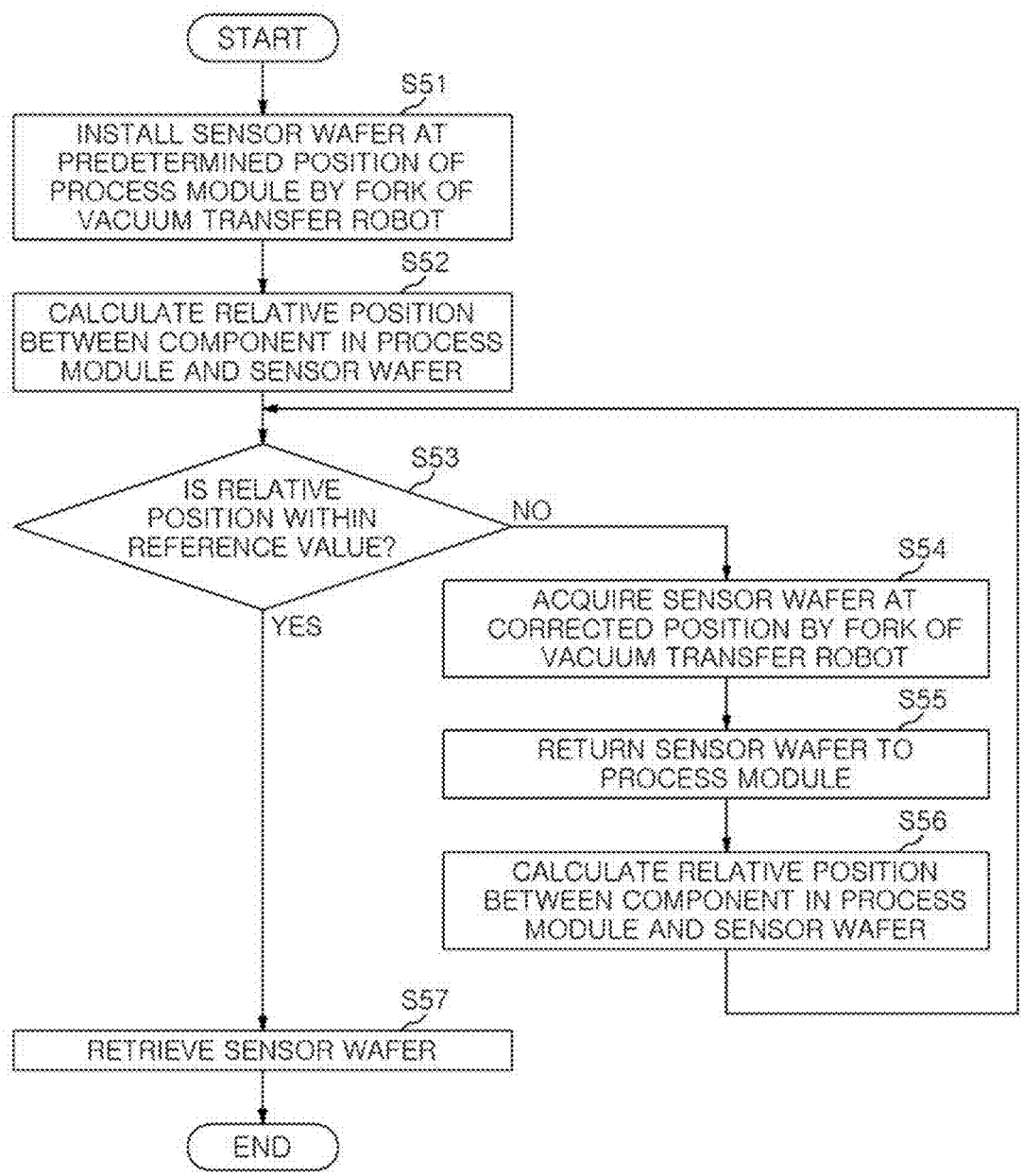
FIG. 16 is a flow chart illustrating an example of alignment between the vacuum transfer robot and a process module.

An example of the alignment (step S50) between the fork FK11 of the vacuum transfer robot TR1 and the process module PM1 will be described with reference to FIG. 16. It is assumed that, at the start of step S50, the sensor wafer has been installed at a given position (for example, a central position) of the load-lock module LL1.

In step S51, the controller CU controls the vacuum transfer robot TR1 to install the sensor wafer in the process module PM1 by the fork FK11.

In step S52, the controller CU calculates the relative position between a component (for example, the electrostatic chuck or the edge ring) in the process module PM1 and the sensor wafer. For example, the controller CU calculates the relative position between the component in the process module PM1 and the sensor wafer based on the detected values of the position detection sensors PS1 to PS6 provided in the sensor wafer. Alternatively, the controller CU may calculate the relative position between the component in the process module PM1 and the sensor wafer based on the detected value of the electrostatic capacitance sensor CS provided in the sensor wafer.

In step S53, the controller CU determines whether or not the calculated relative position between the process module PM1 and the sensor wafer is within the reference value. When the relative position is within the reference value in step S53, the controller CU causes the process to proceed to step S57. Meanwhile, when the relative position is not within the reference value in step S53, the controller CU corrects the teaching position such that the relative position comes within the reference value, and the process proceeds to step S54.

In step S54, the controller CU controls the vacuum transfer robot TR1 to acquire the sensor wafer from the process module PM1 by the fork FK11 at the corrected position.

In step S55, the controller CU controls the vacuum transfer robot TR1 to return the sensor wafer acquired by the fork FK11 to the process module PM1.

In step S56, the controller CU calculates the relative position between a component (for example, the electrostatic chuck or the edge ring) in the process module PM1 and the sensor wafer. For example, the controller CU calculates the relative position between the component in the process module PM1 and the sensor wafer based on the detected values of the position detection sensors PS1 to PS6 provided in the sensor wafer. Alternatively, the controller CU may calculate the relative position between the component in the process module PM1 and the sensor wafer based on the detected value of the electrostatic capacitance sensor CS provided in the sensor wafer. After calculating the relative position, the controller CU returns the process to step S53.

In step S57, the controller CU controls the vacuum transfer robot TR1 to transfer the sensor wafer to a given retrieval position by the fork FK11. The given retrieval position may be the load-lock module LL1 or the like. After the sensor wafer is retrieved, the controller CU ends the process.

While an example of the alignment between the fork FK11 of the vacuum transfer robot TR1 and the process module PM1 has been described above, the process modules PM2 to PM6 can also be aligned by the same method as the process module PM1.

As described above, according to the embodiment, the electrostatic capacitance sensor outputs the relative position between the fork and the substrate to the controller as disposition information, and the controller determines the teaching position of the fork with respect to the substrate based on the disposition information. As a result, the alignment between the fork and the substrate can be automatically adjusted.

Although the alignment method of the embodiment has been illustrated with reference to FIGS. 8 to 16, a specific method of the alignment method is not necessarily limited to those illustrated in the flow charts.

In the above embodiment, a case has been described in which the electrostatic capacitance sensor is used as a sensor that detects the relative position between the fork and the transfer target object. However, the type of the sensor is not limited thereto. For example, instead of the electrostatic capacitance sensor, a non-contact type sensor such as an optical sensor or a magnetic force sensor, a camera, or the like may be used. The optical sensor may be a light emitting diode (LED) sensor. The camera is, for example, a CCD camera.

By using the camera, an effect of improving positional accuracy of the substrate W and the end effector and an effect capable of observing a temporal change can be obtained. Further, by use of the camera, the entire inside of the plasma processing chamber 10 can be observed. The camera may be installed at the same position as the electrostatic capacitance sensor or may be installed at a base of the end effector. The camera may be installed on both the upper surface and the lower surface of the end effector, or may be installed on either one of the upper surface and the lower surface. When the camera is used, the end effector can also be aligned with a groove or a hole of the lower electrode (chuck) as a marker.

In a case where the camera is provided in the fork, the conditions of the plasma processing (for example, the internal pressure of the plasma processing chamber 10, the flow rate of the processing gas, the power of the RF signal, or the like) with respect to the subsequent substrate W can be controlled so that the deposits that adhere to the subsequent substrate W during the plasma processing later are not peeled off or scattered.

Specifically, for example, when the previous substrate W is unloaded from the plasma processing chamber 10, the wall surface of the plasma processing chamber 10 or the surface of the substrate support 11 is imaged by the camera. The conditions of the plasma processing with respect to the subsequent substrate W are optimized based on the amount of change between an adhesion state of the deposits inside the plasma processing chamber 10 obtained through the imaging and the adhesion state of the deposits which is a predetermined reference, so that occurrence of the peeling off or scattering of the deposits is suppressed during the plasma processing of the subsequent substrate W.

As the "adhesion state of the deposits serving as the reference" described above, for example, the imaged results obtained when the previous substrate W is unloaded may be used, and, for example, a state arbitrarily determined during, for example, the setup of the plasma processing chamber 10 may be used.

An imaging surface obtained by the camera can be appropriately determined according to, for example, conditions of the plasma processing with respect to the substrate W, and may be selectively imaged from a side wall surface or a ceiling surface inside the plasma processing chamber 10, the upper surface or the side surface of the substrate support 11, or the like. For example, when a surface on which the deposits easily adheres is already known under the condition of the plasma processing, only one surface on which the deposits easily adheres may be imaged, or a plurality of surfaces may be imaged. At this time, when the ceiling surface of the plasma processing chamber 10 is imaged, it is desirable that the camera be provided at a position which does not interfere with the substrate W held on the fork.

Further, the number of cameras installed in the fork is not particularly limited, and a plurality of cameras may be installed, or one camera may be configured to be able to image a plurality of surfaces in the plasma processing chamber 10.

In the above description, the conditions of the plasma processing with respect to the subsequent substrate W are changed according to the amount of change from the reference adhesion state. However, for example, when the amount of deposits in the plasma processing chamber 10 is large, control may be performed such that dry-cleaning processing, that is, deposits removal processing, is performed prior to the plasma processing on the subsequent substrate W. In this case, the conditions of the dry-cleaning processing (for example, the flow rate of the cleaning gas, the cleaning time, or the like) may be adjusted according to the amount of deposits.

In the above description, a case has been described in which the inside of the plasma processing chamber 10 is imaged when the previous substrate W is unloaded from the plasma processing chamber 10 as an example. However, independently of the unloading of the substrate W, the fork may be entered inside the plasma processing chamber 10 and the deposition may be imaged.

In the embodiment described above, a case where the substrate is a semiconductor wafer has been described. However, the present disclosure is not limited thereto. For example, the substrate may be various substrates used for a liquid crystal display (LCD), a flat panel display (FPD), a CD substrate, a printed substrate, or the like.

Second Embodiment

[Processing System]

An example of a processing system of an embodiment will be described with reference to FIG. 1. As illustrated in FIG. 1, a processing system PS is a system capable of performing various types of processing, such as plasma processing, on a substrate.

The processing system PS includes vacuum transfer modules TM1 and TM2, process modules PM1 to PM12, load-lock modules LL1 and LL2, an atmospheric transfer module LM, an aligner AN, a storage SR, and the like.

The vacuum transfer modules TM1 and TM2 each have a substantially rectangular shape in a plan view. The process modules PM1 to PM6 are connected to two opposite side surfaces of the vacuum transfer module TM1. The load-lock modules LL1 and LL2 are connected to one side surface of the other two opposite side surfaces of the vacuum transfer module TM1, and a path (not illustrated) for connecting to the vacuum transfer module TM2 is connected to the other side surface of the vacuum transfer module TM1. The side surface, to which the load-lock modules LL1 and LL2 are connected, of the vacuum transfer module TM1 are angled according to the two load-lock modules LL1 and LL2. In the vacuum transfer module TM2, the process modules PM7 to PM12 are connected to two opposite side surfaces. A path (not illustrated) for connecting to the vacuum transfer module TM1 is connected to one side surface of the other two opposite side surfaces of the vacuum transfer module TM2. The vacuum transfer modules TM1 and TM2 have vacuum chambers in a vacuum atmosphere, and vacuum transfer robots TR1 and TR2 are disposed therein, respectively.

The vacuum transfer robots TR1 and TR2 are configured to be rotatable, extensible, and vertically movable. The vacuum transfer robots TR1 and TR2 transfer a transfer target object based on an operation instruction output from a controller CU which will be described later. For example, the vacuum transfer robot TR1 holds a transfer target object by the end effectors FK11 and FK12 disposed at tips of arms AR11 and AR12, respectively, and transfers the transfer target object between the load-lock modules LL1 and LL2, the process modules PM1 to PM6, and the path (not illustrated). For example, the vacuum transfer robot TR2 holds the transfer target object with the end effectors FK21 and FK22 disposed at tips of arms AR21 and AR22, respectively, and transfers the transfer target object between the process modules PM7 to PM12 and the path (not illustrated). The end effector is also referred to as a fork or a pick.

The transfer target object includes a substrate and a consumable member. The substrate is, for example, a semiconductor wafer or a sensor wafer. The consumable member is a member that is attached in the process modules PM1 to PM12 in a replaceable manner, and is a member that is consumed when various types of processing, such as plasma processing, are performed in the process modules PM1 to PM12. The consumable member includes, for example, members constituting a ring assembly 112 and a shower head 13 which will be described later.

The process modules PM1 to PM12 each have a processing chamber and have a stage (placement table) disposed therein. After the substrate is installed on the stage, the inside of the process modules PM1 to PM12 each are depressurized interiorly to introduce a processing gas thereinto, an RF power is applied to generate plasma, and plasma processing is performed on the substrate by the plasma. The vacuum transfer modules TM1 and TM2 and the process modules PM1 to PM12 are separated by openable/closable gate valves G1.

The load-lock modules LL1 and LL2 are disposed between the vacuum transfer module TM1 and the atmospheric transfer module LM. The load-lock modules LL1 and LL2 each have a chamber having a variable internal pressure, whose inside can be switched to vacuum or atmospheric pressure. The load-lock modules LL1 and LL2 each have a stage disposed inside. When the substrate is loaded from the atmospheric transfer module LM into the vacuum transfer module TM1, the load-lock modules LL1 and LL2 receive the substrate from the atmospheric transfer module LM while maintaining the inside at the atmospheric pressure, and depressurize the pressure in the inside to load the substrate into the vacuum transfer module TM1. When the substrate is unloaded from the vacuum transfer module TM1 to the atmospheric transfer module LM, the load-lock modules LL1 and LL2 receive the substrate from the vacuum transfer module TM1 while maintaining the inside at a vacuum, and pressurize the inside to the atmospheric pressure to load the substrate into the atmospheric transfer module LM. The load-lock modules LL1 and LL2 and the vacuum transfer module TM1 are separated by openable/closable gate valves G2. The load-lock modules LL1 and LL2 and the atmospheric transfer module LM are separated by openable/closable gate valves G3.

The atmospheric transfer module LM is disposed to face the vacuum transfer module TM1. The atmospheric transfer module LM may be, for example, an equipment front end module (EFEM). The atmospheric transfer module LM is an atmospheric transfer chamber that has a rectangular parallelepiped shape, includes a fan filter unit (FFU), and is maintained in an atmospheric pressure atmosphere. The two load-lock modules LL1 and LL2 are connected to one side surface of the atmospheric transfer module LM along a longitudinal direction. Load ports LP1 to LP4 are connected to the other side surface of the atmospheric transfer module LM along the longitudinal direction. Containers C that accommodate a plurality of substrates (for example, 25 substrates) are placed in the load ports LP1 to LP4. The container C may be, for example, a front-opening unified pod (FOUP). An atmospheric transfer robot TR3 that transfers the transfer target object is disposed in the atmospheric transfer module LM.

The atmospheric transfer robot TR3 is configured to be movable along the longitudinal direction of the atmospheric transfer module LM, and is also configured to be rotatable, extensible, and vertically movable. The atmospheric transfer robot TR3 transfers the transfer target object based on an operation instruction output from the controller CU which will be described later. For example, the atmospheric transfer robot TR3 holds a transfer target object with the end effector FK31 disposed at a tip of an arm AR31, and transfers the transfer target object between the load ports LP1 to LP4, the load-lock modules LL1 and LL2, the aligner AN, and the storage SR.

The aligner AN is connected to one side surface of the atmospheric transfer module LM along a lateral direction. However, the aligner AN may be connected to a side surface of the atmospheric transfer module LM along the longitudinal direction. Further, the aligner AN may be provided inside the atmospheric transfer module LM. The aligner AN has a support stand, an optical sensor (neither of which is illustrated), and the like. The aligner referred to here is a device that detects a position of the transfer target object.

The support stand is a stand rotatable around a center of an axis extending in a vertical direction, and configured to support the substrate thereon. The support stand is rotated by a driving device (not illustrated). The driving device is controlled by the controller CU which will be described later. The support stand is configured such that when the support stand is rotate by the driving power from the driving device, the substrate installed on the support stand is also rotated.

The optical sensor detects an edge of the substrate while the substrate rotates. The optical sensor detects a misalignment amount of an angular position of a notch (or another marker) of the substrate with respect to a reference angular position, and a misalignment amount of a central position of the substrate with respect to the reference position, from a detected result of the edge. The optical sensor outputs a misalignment amount of the angular position of the notch and a misalignment amount of the central position of the substrate to the controller CU which will be described later. The controller CU calculates a rotation amount of a rotation support stand to correct the angular position of the notch to the reference angular position based on the misalignment amount of the angular position of the notch. The controller CU controls the driving device (not illustrated) to rotate the rotation support stand by the rotation amount. Accordingly, the angular position of the notch can be corrected to the reference angular position. Further, the controller CU controls a position of the end effector FK31 of the atmospheric transfer robot TR3 when the substrate is received from the aligner AN based on the misalignment amount of the central position of the substrate, such that the central position of the substrate coincides with a given position on the end effector FK31 of the atmospheric transfer robot TR3.

The storage SR is connected to a side surface of the atmospheric transfer module LM along the longitudinal direction. However, the storage SR may be connected to a side surface of the atmospheric transfer module LM along the lateral direction. Further, the storage SR may be provided inside the atmospheric transfer module LM. The storage SR accommodates the transfer target object.

The processing system PS is provided with the controller CU. The controller CU may be, for example, a computer. The controller CU includes a central processing unit (CPU), a random access memory (RAM), a read only memory (ROM), an auxiliary storage device, and the like. The CPU operates based on a program stored in the ROM or the auxiliary storage device, and controls each part of the processing system PS. For example, the controller CU outputs an operation instruction to the vacuum transfer robots TR1 and TR2, the atmospheric transfer robot TR3, and the like. The operation instruction includes an instruction to align the end effectors FK11, FK12, FK21, FK22 and FK31, which are configured to transfer the transfer target object, with the transfer location of the transfer target object.

[Plasma Processing System]

An example of the plasma processing system which may be adopted as any of the process modules PM1 to PM12 will be described with reference to FIG. 2.

In one embodiment, the plasma processing system includes a plasma processing apparatus 1 and a plasma processing controller 2. The plasma processing apparatus 1 includes a plasma processing chamber 10, a substrate support 11, and a plasma generator 12. The plasma processing chamber 10 has a plasma processing space. Further, the plasma processing chamber 10 has at least one gas supply port for supplying at least one processing gas into the plasma processing space, and at least one gas exhaust port for exhausting the gas from the plasma processing space. The gas supply port is connected to a gas supply 20 which will be described later, and the gas exhaust port is connected to an exhaust system 40 which will be described later. The substrate support 11 is disposed in the plasma processing space and has a substrate support surface for supporting the substrate.

The plasma generator 12 is configured to generate plasma from at least one processing gas supplied into the plasma processing space. The plasma formed in the plasma processing space may be capacitively coupled plasma (CCP), inductively coupled plasma (ICP), electron-cyclotron-resonance plasma (ECR plasma), helicon wave-excited plasma (HWP), surface wave plasma (SWP), or the like. Further, various types of plasma generators, including an alternating current (AC) plasma generator and a direct current (DC) plasma generator, may be used. In one embodiment, an AC signal (AC power) used by the AC plasma generator has a frequency in a range of 100 kHz to 10 GHz. Accordingly, the AC signal includes a radio frequency (RF) signal and a microwave signal. In one embodiment, the RF signal has a frequency in a range of 200 kHz to 150 MHz.

The plasma processing controller 2 processes a computer-executable instruction for causing the plasma processing apparatus 1 to execute various processes which will be described in the present disclosure. The plasma processing controller 2 may be configured to control each element of the plasma processing apparatus 1 to execute the various processes which will be described here. In one embodiment, a part or entirety of the plasma processing controller 2 may be included in the plasma processing apparatus 1. The plasma processing controller 2 may include, for example, a computer 2a. For example, the computer 2a may include a processor (central processing unit (CPU)) 2a1, a storage 2a2, and a communication interface 2a3. The processor 2a1 may be configured to perform various control operations based on a program stored in the storage 2a2. The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Hereinafter, a configuration example of a capacitively coupled plasma processing apparatus as an example of the plasma processing apparatus 1 will be described with reference to FIG. 3.

A capacitively coupled plasma processing apparatus 1 includes a plasma processing chamber 10, a gas supply 20, a power source 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of the ceiling of the plasma processing chamber 10. The plasma processing chamber 10 has a plasma processing space 10s defined by the shower head 13, a sidewall 10a of the plasma processing chamber 10, and the substrate support 11. The sidewall 10a is grounded. The shower head 13 and the substrate support 11 are electrically insulated from a housing of the plasma processing chamber 10.

The substrate support 11 includes a main body 111 and a ring assembly 112. The main body 111 has a central region (substrate support surface) 111a for supporting the substrate (wafer) W, and an annular region (ring support surface) 111b for supporting the ring assembly 112. The annular region 111b of the main body 111 surrounds the central region 111a of the main body ill in a plan view. The substrate W is disposed on the central region 111a of the main body 111, and the ring assembly 112 is disposed on the annular region 111b of the main body 111 to surround the substrate W on the central region 111a of the main body 111. In one embodiment, the main body 111 includes a base and an electrostatic chuck. The base includes a conductive member. The conductive member of the base functions as a lower electrode. The electrostatic chuck is disposed on the base. The upper surface of the electrostatic chuck has a substrate support surface 111a. The ring assembly 112 includes one or more annular members. At least one of the one or more annular members is an edge ring. Although not illustrated, the substrate support 11 may include a temperature control module configured to adjust at least one of the electrostatic chuck, the ring assembly 112, and the substrate to a target temperature. The temperature control module may include a heater, a heat transfer medium, a flow path, or a combination thereof. A heat transfer fluid, such as brine or gas, flows through the flow path. Further, the substrate support 11 may include a heat transfer gas supply configured to supply a heat transfer gas between the rear surface of the substrate W and the substrate support surface 111a.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes a conductive member. The conductive member of the shower head 13 functions as an upper electrode. The gas introduction unit may include, in addition to the shower head 13, one or more side gas injectors (SGI) that are attached to one or more openings formed in the sidewall 10a.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include at least one flow rate modulation device that modulates or causes the flow rate of at least one processing gas to pulsate.

The power source 30 includes an RF power source 31 coupled to plasma processing chamber 10 via at least one impedance matching circuit. The RF power source 31 is configured to supply at least one RF signal (RF power), such as the source RF signal and the bias RF signal, to the conductive member of the substrate support 11 and/or the conductive member of the shower head 13. As a result, plasma is formed from at least one processing gas supplied into the plasma processing space 10s. Accordingly, the RF power source 31 may function as at least a part of the plasma generator 12. Further, the supply of the bias RF signal to the conductive member of the substrate support 11 can generate a bias potential in the substrate W to draw an ion component in the formed plasma to the substrate W.

In one embodiment, the RF power source 31 includes a first RF generator 31a and a second RF generator 31b. The first RF generator 31a is coupled to the conductive member of the substrate support 11 and/or the conductive member of the shower head 13 via at least one impedance matching circuit, and configured to generate a source RF signal (source RF power) for plasma generation. In one embodiment, the source RF signal has a frequency in the range of 13 MHz to 150 MHz. In one embodiment, the first RF generator 31a may be configured to generate a plurality of source RF signals having different frequencies. One or more source RF signals so generated are supplied to the conductive member of the substrate support 11 and/or the conductive member of the shower head 13. The second RF generator 31b is coupled to the conductive member of the substrate support 11 via at least one impedance matching circuit, and configured to generate a bias RF signal (bias RF power). In one embodiment, the bias RF signal has a lower frequency than the source RF signal. In one embodiment, the bias RF signal has a frequency in the range of 400 kHz to 13.56 MHz. In one embodiment, the second RF generator 31b may be configured to generate a plurality of bias RF signals having different frequencies. One or more bias RF signals so generated are supplied to the conductive member of the substrate support 11. Further, in various embodiments, at least one of the source RF signal and the bias RF signal may pulsate.

Further, the power source 30 may include a DC power source 32 coupled to the plasma processing chamber 10. The DC power source 32 includes a first DC generator 32a and a second DC generator 32b. In one embodiment, the first DC generator 32a is connected to the conductive member of the substrate support 11 and configured to generate a first DC signal. The generated first DC signal is applied to the conductive member of the substrate support 11. In one embodiment, the first DC signal may be applied to another electrode, such as an electrode in an electrostatic chuck. In one embodiment, the second DC generator 32b is configured to be connected to the conductive member of the shower head 13 and to generate a second DC signal. The generated second DC signal is applied to the conductive member of the shower head 13. In various embodiments, the first and second DC signals may pulsate. The first and second DC generators 32a and 32b may be provided in addition to the RF power source 31, and the first DC generator 32a may be provided instead of the second RF generator 31b.

The exhaust system 40 may be connected to, for example, a gas exhaust port 10e disposed at a bottom portion of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

First Configuration Example of Embodiment

Figure 17:
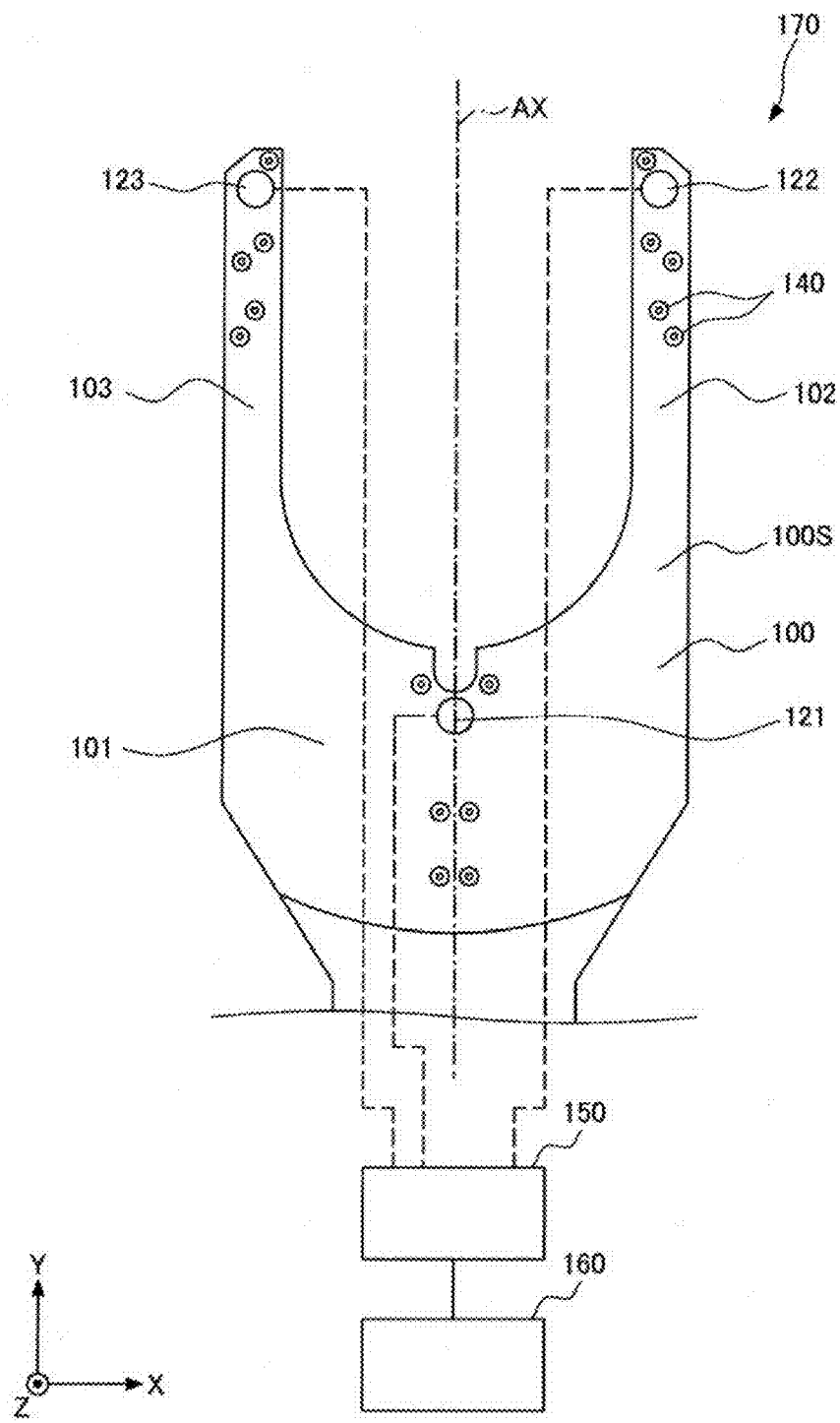
FIG. 17 is a top view of an end effector of a transfer device according to a first configuration example of the embodiment.

An end effector 100 of a transfer device 170 according to a first configuration example of the embodiment will be described. FIG. 17 is a top view of the end effector 100 of the transfer device 170 according to the first configuration example of the embodiment.

In the drawing, an XYZ orthogonal coordinate system may be set for convenience of description. With respect to a coordinate axis perpendicular to a paper plane of the drawing, a cross mark in a circle of the coordinate axis indicates that a backward direction with respect to the paper plane is positive, and a black circle in the circle indicates that a forward direction with respect to the paper plane is positive. However, the coordinate system is determined for description, and a posture of the end effector or the like is not limited thereby.

In the present disclosure, an X axis and a Y axis are axes in parallel with a placement surface of the end effector, unless otherwise described. The Y axis is an axis in a direction in which a tip portion of the end effector extends. The X axis is an axis perpendicular to the Y axis. The Z axis is an axis in a direction perpendicular to the X axis and the Y axis. The Z-axis direction may be referred to as a vertical direction.

The transfer device 170 represents, for example, at least any one of the vacuum transfer robot TR1, the vacuum transfer robot TR2, and the atmospheric transfer robot TR3. The transfer device 170 transfers the substrate W and consumable components provided in the plasma processing apparatus 1 (substrate processing apparatus).

The transfer device 170 includes the end effector 100, an arm 160, and a control device 150.

The end effector 100 represents, for example, at least any one of the end effector FK11, the end effector FK12, the end effector FK22, and the end effector FK31. The arm 160 is, for example, any one of the arms AR11, AR12, AR21, AR22, and AR31 corresponding to the end effector 100. The end effector 100 transfers the transfer target object under at least one of an atmospheric pressure atmosphere and a vacuum atmosphere.

The control device 150 controls the arm 160. Further, the control device 150 is connected to each of an electrostatic capacitance sensor 121, an electrostatic capacitance sensor 122, and an electrostatic capacitance sensor 123 which will be described later. The control device 150 measures a positional relationship between the substrate W and the end effector 100 based on a result measured by each of the electrostatic capacitance sensor 121, the electrostatic capacitance sensor 122, and the electrostatic capacitance sensor 123. The control device 150 corrects misalignment when the position of the substrate W is misaligned from a desired position based on the measured positional relationship between the substrate W and the end effector 100.

In the end effector 100, the substrate and the consumable components provided in the plasma processing apparatus 1 are placed. The consumable component provided in the plasma processing apparatus 1 is, for example, an annular member of the ring assembly 112.

The end effector 100 has a substantially U-shape in a plan view. The end effector 100 has a shape symmetrical in a plan view with respect to a central axis AX passing through a center in an X-axis direction.

The end effector 100 has a base portion 101, a tip portion 102, and a tip portion 103. Each of the tip portion 102 and the tip portion 103 is provided to extend in a +Y-axis direction from the base portion 101. Each of the tip portion 102 and the tip portion 103 has a substantially rectangular shape in a plan view that is short in the X-axis direction and long in the Y-axis direction. The tip portion 102 is provided to be separated from the tip portion 103 in the +X-axis direction. The end effector 100 is made of, for example, ceramic.

The end effector 100 has a placement surface 100S on which any of the substrate and the consumable component is placed. The end effector 100 includes an electrostatic capacitance sensor 121, an electrostatic capacitance sensor 122, and an electrostatic capacitance sensor 123 on the placement surface 100S, and a plurality of pads 140 that protect to prevent the substrate W from coming into contact with the placement surface 100S.

Each of the electrostatic capacitance sensor 121, the electrostatic capacitance sensor 122, and the electrostatic capacitance sensor 123 includes an electrode having a substantially circular shape in a plan view. Each of the electrostatic capacitance sensor 121, the electrostatic capacitance sensor 122, and the electrostatic capacitance sensor 123 measures the electrostatic capacitance between each electrode and the substrate W placed on the placement surface 100S. That is, each of the electrostatic capacitance sensor 121, the electrostatic capacitance sensor 122, and the electrostatic capacitance sensor 123 measures the overlap between each electrode and the substrate W in a plan view.

The electrostatic capacitance sensor 121 is provided at the center of the base portion 101 in the X-axis direction. That is, the electrostatic capacitance sensor 121 is provided on the central axis AX. The electrostatic capacitance sensor 122 is provided at the tip of the tip portion 102 on the +Y side in the Y-axis direction. The electrostatic capacitance sensor 123 is provided at the tip of the tip portion 103 on the +Y side in the Y-axis direction.

Figure 18:
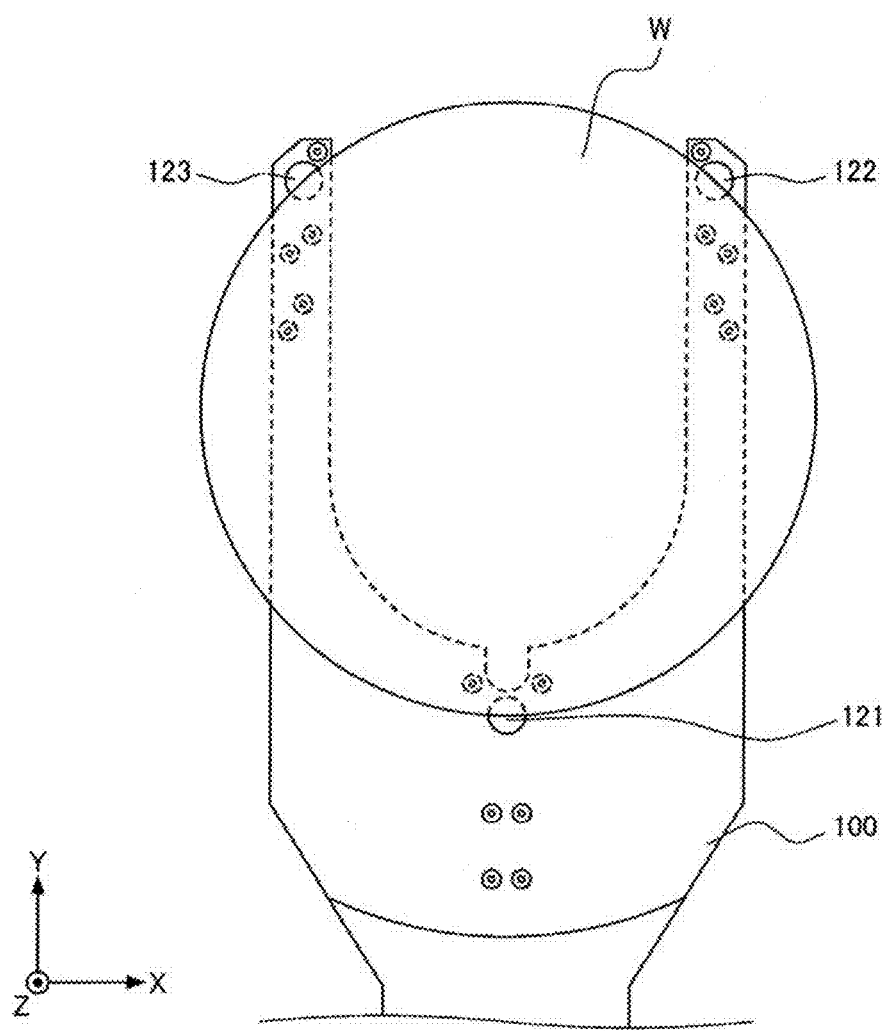
FIG. 18 is a view illustrating a relative position between the end effector of the transfer device and the substrate according to the first configuration example of the embodiment.

The position of each of the electrostatic capacitance sensor 121, the electrostatic capacitance sensor 122, and the electrostatic capacitance sensor 123 will be described. FIG. 18 is a view illustrating a relative position between the end effector 100 of the transfer device 170 and the substrate W according to the first configuration example of the embodiment. FIG. 18 illustrates a state where the substrate W is placed at a reference position where there is no misalignment with respect to the end effector 100.

The electrostatic capacitance sensor 121, the electrostatic capacitance sensor 122, and the electrostatic capacitance sensor 123 are respectively provided at positions where respective electrodes of the electrostatic capacitance sensor 121, the electrostatic capacitance sensor 122, and the electrostatic capacitance sensor 123 are substantially half-covered by the substrate W in a top view when the substrate W is placed at the reference position.

Each of the electrostatic capacitance sensor 121, the electrostatic capacitance sensor 122, and the electrostatic capacitance sensor 123 is connected to the control device 150. When the substrate W is received, the control device 150 calculates the misalignment amount of the substrate W with respect to the reference position on which the substrate of the end effector 100 is placed, based on the electrostatic capacitance measured by each of the electrostatic capacitance sensors 121, the electrostatic capacitance sensor 122, and the electrostatic capacitance sensor 123. For example, the control device 150 obtains a central position of the substrate W. The misalignment amount of the substrate W is calculated based on the misalignment amount of the central position with respect to the reference position. The electrostatic capacitance sensor 121, the electrostatic capacitance sensor 122, and the electrostatic capacitance sensor 123 may measure the substrate W while the substrate W is being transferred.

When the substrate W is located at the reference position, the electrostatic capacitances detected by the electrostatic capacitance sensor 121, the electrostatic capacitance sensor 122, and the electrostatic capacitance sensor 123 are equal to each other. On the other hand, when the substrate W is misaligned from the reference position, the electrostatic capacitance detected by the electrostatic capacitance sensor located in the direction in which the substrate W is misaligned becomes large. Therefore, the central position of the substrate W is obtained based on the electrostatic capacitance detected by each of the electrostatic capacitance sensor 121, the electrostatic capacitance sensor 122, and the electrostatic capacitance sensor 123.

When the calculated misalignment amount is larger than the desired range, that is, when the substrate W is misaligned from the desired position, the control device 150 corrects misalignment of the substrate W and places the substrate W again.

The number of electrostatic capacitance sensors is not limited to three, and, for example, four or more thereof may be provided. That is, the end effector 100 may include electrostatic capacitance sensors provided in at least two or more locations. Further, the electrostatic capacitance sensors may be provided in at least three or more locations on the same circumference of the end effector 100.

Figure 19:
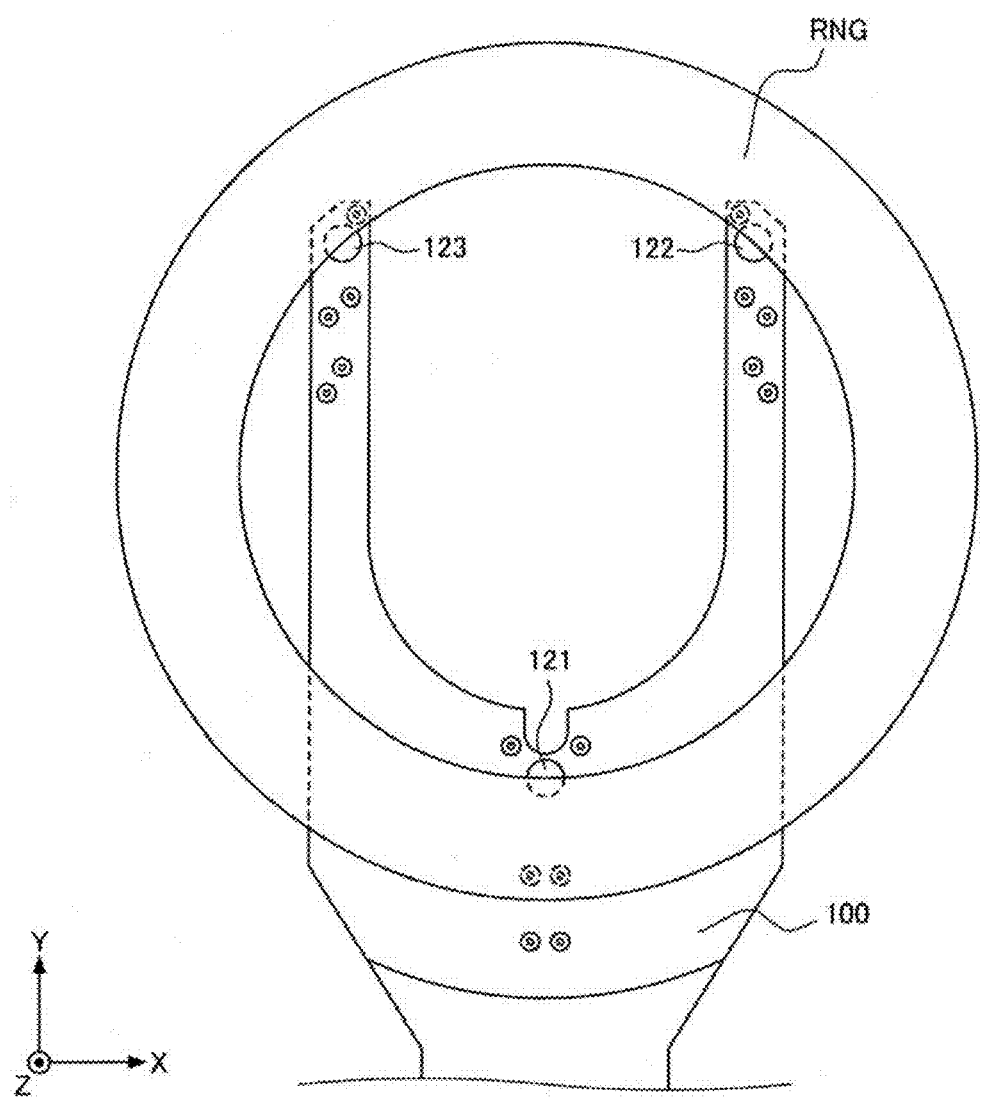
FIG. 19 is a view illustrating the relative position between the end effector of the transfer device and an annular member according to the first configuration example of the embodiment.

Further, the transfer target object of the end effector 100 is not limited to the substrate W. For example, the annular member of the ring assembly 112 or the upper electrode (for example, the shower head 13) may be the transfer target object. FIG. 19 is a view illustrating a relative position between the end effector 100 of the transfer device 170 and an annular member RNG according to the first configuration example of the embodiment.

An inner diameter of the annular member RNG of the ring assembly 112 is substantially equal to an outer diameter of the substrate W. Accordingly, as illustrated in FIG. 19, the end effector 100 can measure misalignment of the annular member RNG.

<Operations and Effects>

The end effector 100 of the transfer device 170 according to the first configuration example of the embodiment can detect the misalignment of the substrate W with respect to the end effector 100. Detecting the misalignment of the substrate W with respect to the end effector 100 and correcting the position of the substrate W may improve positional accuracy with respect to the end effector 100 when the substrate W is transferred. When the positional accuracy of the substrate W is improved with respect to the end effector 100, the transfer accuracy may be improved, and the performance of the transfer device may be improved.

Further, according to the end effector 100 of the transfer device 170 in the first configuration example of the embodiment, a mounting position of the substrate W can be corrected in real time. Therefore, the reliability of the transfer device can be improved.

Further, according to the end effector 100 of the transfer device 170 in the first configuration example of the embodiment, when a plurality of substrates W are processed, the mounting position of each substrate W can be corrected by measuring of the misalignment. Therefore, performance of the transfer device can be improved.

Further, according to the end effector 100 of the transfer device 170 in the first configuration example of the embodiment, since the misalignment can be corrected, high-accuracy teaching of the transfer device is not necessary, so that the automation of the teaching can be performed. Therefore, labor saving can be achieved. Further, productivity can be improved.

Further, according to the end effector 100 of the transfer device 170 in the first configuration example of the embodiment, since misalignment can be corrected, a transfer device having low repetitive transfer performance can be applied. Therefore, the cost of the transfer device can be reduced.

Further, according to the end effector 100 in the first configuration example of the embodiment, since the misalignment can be corrected, it is possible to follow the change of the shape due to the temperature change and the consumption of the target.

For example, even in a case where the central position of the annular member of the ring assembly 112 can be measured using a sensor wafer or the like, the substrate W cannot be placed at the central position of the annular member when the positions of the end effector and the substrate W are misaligned from the reference position. According to the end effector 100 in the first configuration example of the embodiment, since the misalignment of the substrate W with respect to the end effector 100 can be corrected, the substrate W can be placed at the central position of the annular member of the ring assembly 112.

Even in a case where the transfer robot is taught using the sensor wafer or the like, the substrate W may not be transported with the same accuracy as when the teaching is performed during transportation of the substrate W, due to a change in the environment (for example, temperature) or a difference between the sensor wafer and the substrate W that is actually transferred. According to the end effector 100 in the first configuration example of the embodiment, since the misalignment of the substrate W with respect to the end effector 100 can be corrected, the substrate W can be transferred with high positional accuracy.

Second Configuration Example of Embodiment

Figure 20:
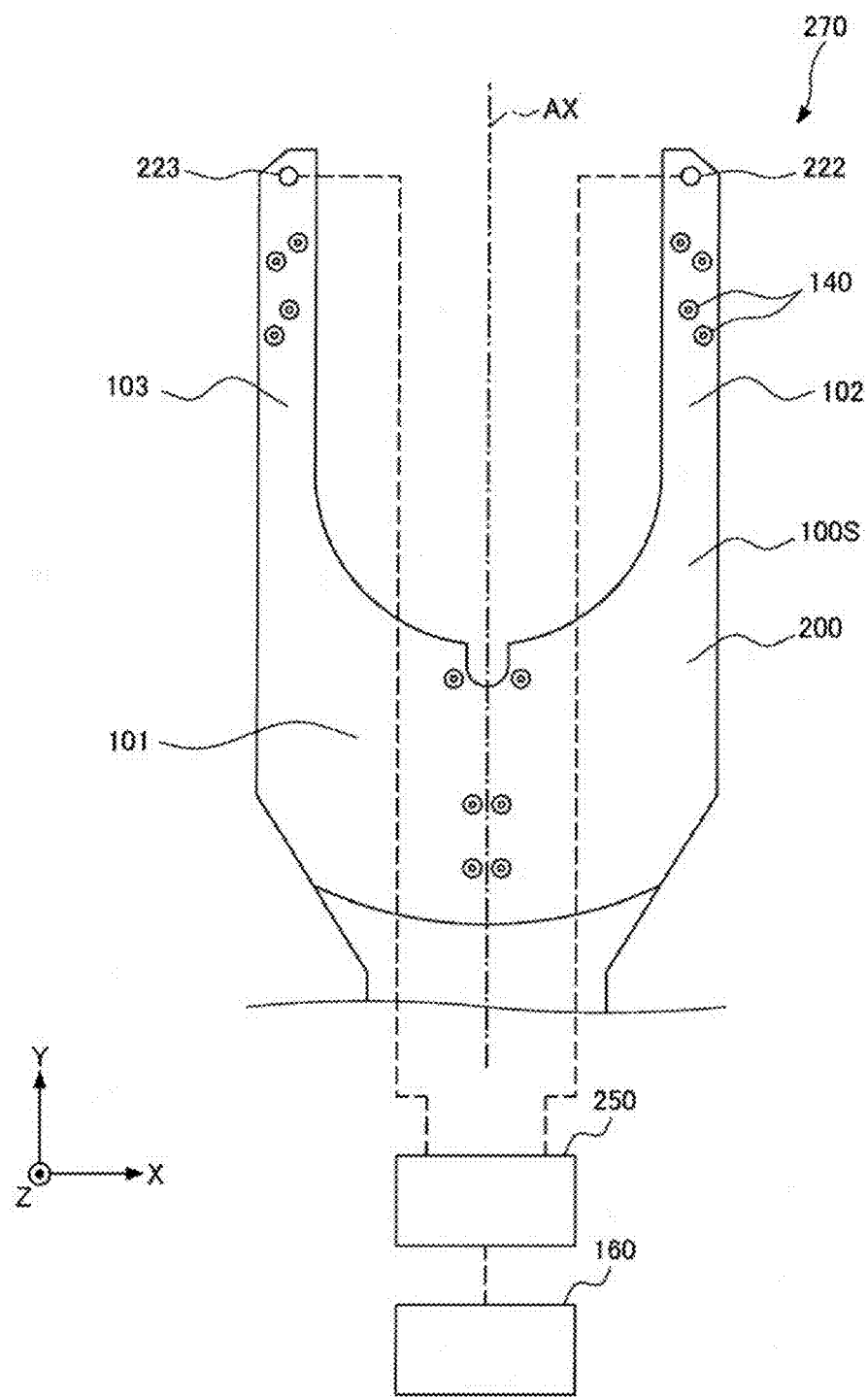
FIG. 20 is a top view of an end effector of a transfer device according to a second configuration example of the embodiment.

Next, an end effector 200 of a transfer device 270 according to a second configuration example of the embodiment will be described. FIG. 20 is a top view of the end effector 200 of the transfer device 270 according to the second configuration example of the embodiment. The end effector 200 includes an optical sensor 222 and an optical sensor 223, instead of the electrostatic capacitance sensor 121, the electrostatic capacitance sensor 122, and the electrostatic capacitance sensor 123 of the end effector 100 in the transfer device 170 according to the first configuration example of the embodiment.

The transfer device 270 includes the end effector 200, the arm 160, and a control device 250.

The respective optical sensor 222 and optical sensor 223 detect optically whether the substrate W is present on respective upper sides of the optical sensor 222 and the optical sensor 223. Each of the optical sensor 222 and the optical sensor 223 is connected to the control device 250.

For example, each of the optical sensor 222 and the optical sensor 223 is an image sensor. The respective optical sensor 222 and optical sensor 223 serving as the image sensor image respective upper sides of the optical sensor 222 and the optical sensor 223. The control device 250 determines whether or not the substrate W is present on the respective upper sides of the optical sensor 222 and the optical sensor 223 based on the images obtained through imaging.

Further, each of the optical sensor 222 and the optical sensor 223 is, for example, a distance sensor. The respective optical sensor 222 and optical sensor 223 serving as the distance sensor measure a distance to an object positioned on the respective upper sides of the optical sensor 222 and the optical sensor 223. The control device 250 determines whether or not the substrate W is present on the respective upper sides of the optical sensor 222 and the optical sensor 223 based on the measured distance.

Further, each of the optical sensor 222 and the optical sensor 223 is, for example, a reflection-type light intensity sensor. The respective optical sensor 222 and optical sensor 223 serving as the reflection-type light intensity sensor irradiate the respective upper sides of the optical sensor 222 and the optical sensor 223 with light, and measure intensity of light to be reflected and returned from an object positioned on the upper sides. The control device 250 determines whether or not the substrate W is present on the respective upper sides of the optical sensor 222 and the optical sensor 223 based on the measured intensity of light.

Further, each of the optical sensor 222 and the optical sensor 223 may be, for example, an LED sensor.

Figure 21:
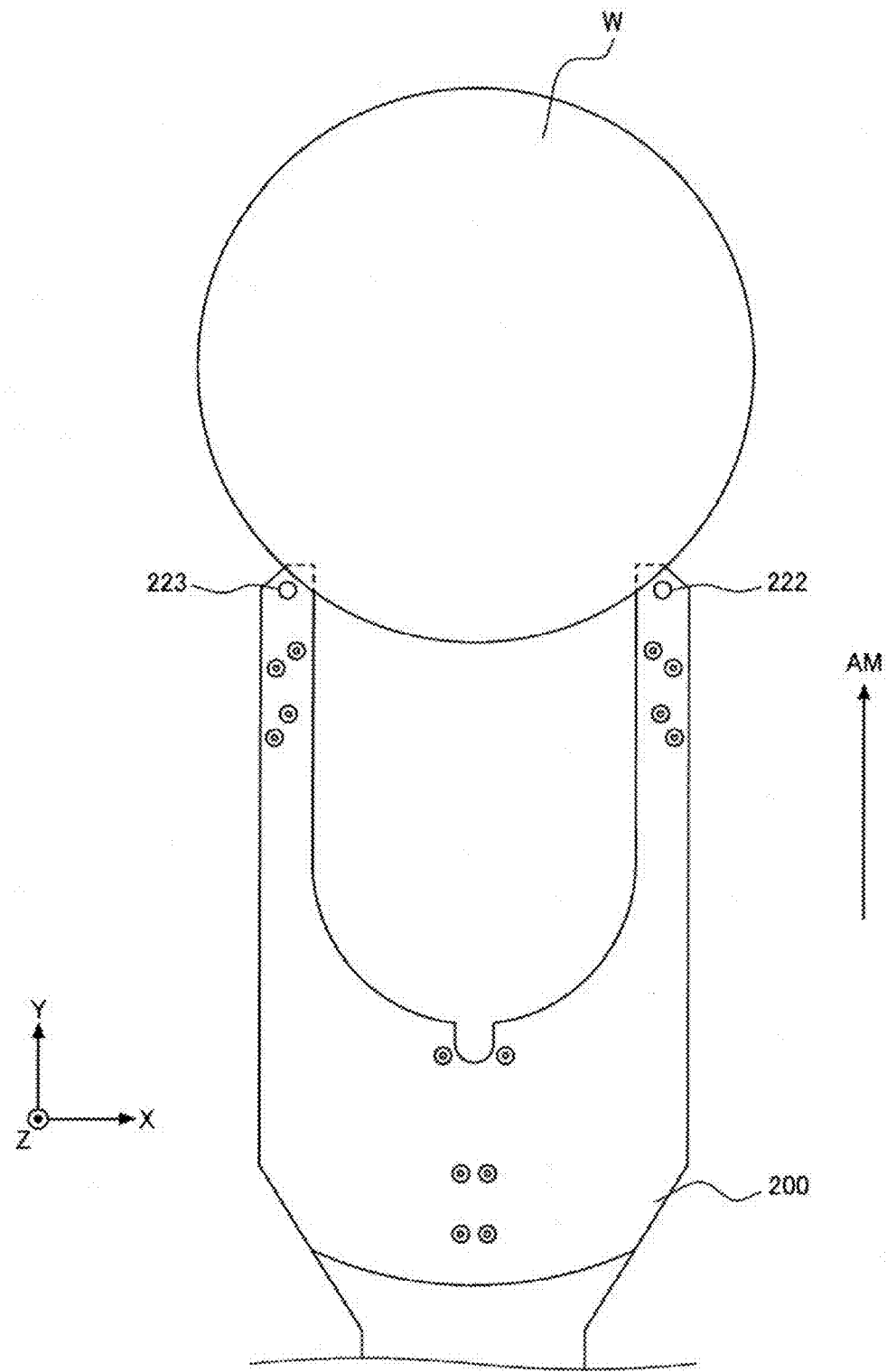
FIG. 21 is a view illustrating measurement of misalignment of a substrate by the end effector of the transfer device according to the second configuration example of the embodiment.
Figure 22:
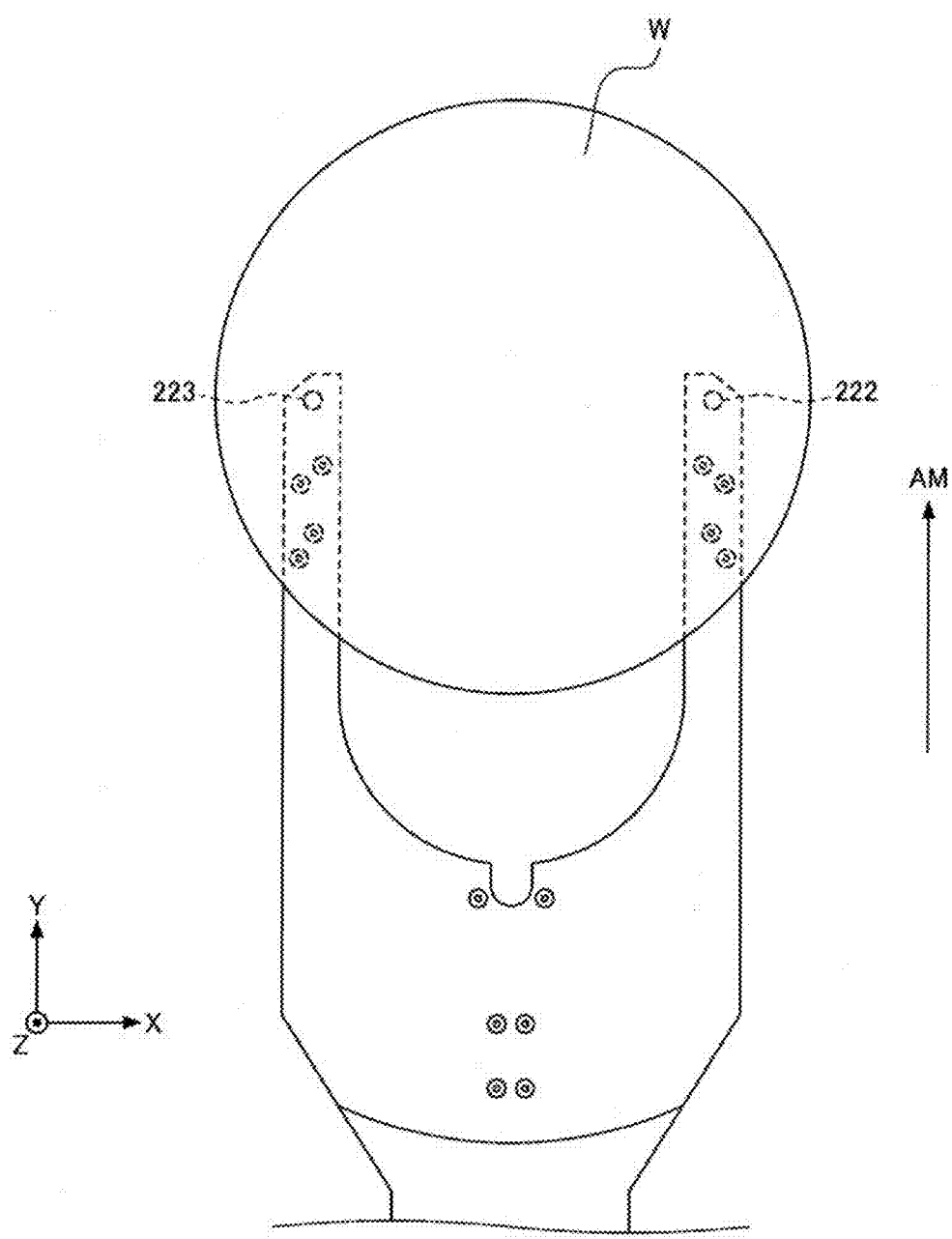
FIG. 22 is a view illustrating the measurement of the misalignment of the substrate by the end effector of the transfer device according to the second configuration example of the embodiment.
Figure 23:
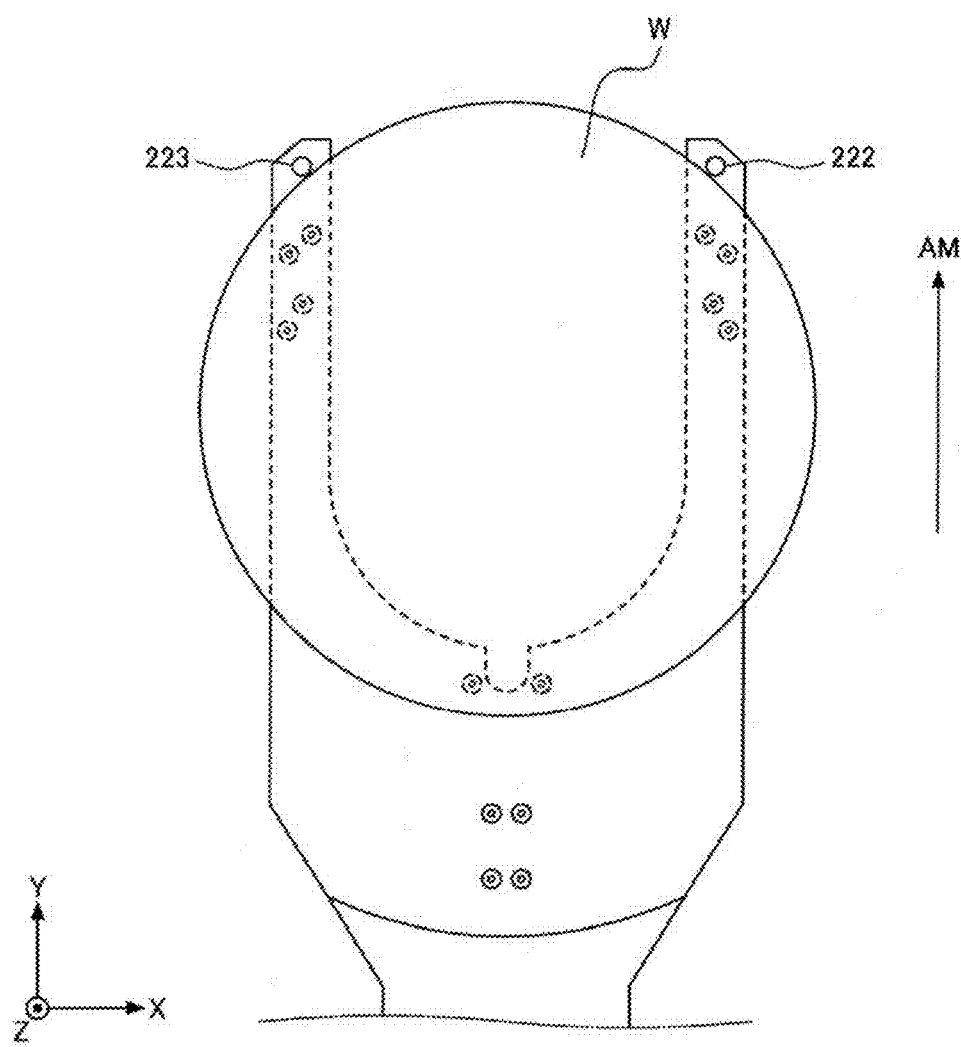
FIG. 23 is a view illustrating the measurement of the misalignment of the substrate by the end effector of the transfer device according to the second configuration example of the embodiment.

A method for measuring the misalignment will be described. FIGS. 21 to 23 are views illustrating measurement of the misalignment of the substrate by the end effector 200 of the transfer device 270 according to the second configuration example of the embodiment.

The end effector 200 is moved along an arrow AM to a lower side of the substrate W placed on the substrate support 11. As illustrated in FIG. 21, initially, the substrate W is not positioned on the respective upper sides of the optical sensor 222 and the optical sensor 223. Therefore, each of the optical sensor 222 and the optical sensor 223 does not detect the substrate W.

Further, when the end effector 200 is moved along the arrow AM, the substrate W is positioned on the respective upper sides of the optical sensor 222 and the optical sensor 223 as illustrated in FIG. 22. Each of the optical sensor 222 and the optical sensor 223 detects the substrate W.

Further, when the end effector 200 is moved along the arrow AM, the substrate W is not positioned on the respective upper sides of the optical sensor 222 and the optical sensor 223 as illustrated in FIG. 23. Therefore, each of the optical sensor 222 and the optical sensor 223 does not detect the substrate W.

The control device 250 detects the misalignment of the substrate W with respect to the end effector 200 using information of the position on which the substrate W is present, which position is detected by each of the optical sensor 222 and the optical sensor 223. For example, the control device 250 obtains the central position of the substrate W. The control device 250 calculates the misalignment amount of the substrate W based on the misalignment amount of the central position with respect to the reference position.

For example, the control device 250 may obtain the central position of the substrate W from the information on end points of the substrate W, detected by each of the optical sensor 222 and the optical sensor 223. Four end points in total of the substrate W, which are detected by the optical sensor 222 and the optical sensor 223, are obtained by the optical sensor 222 and the optical sensor 223. For example, center coordinates of the substrate W may be obtained by the least squares method based on the coordinates of the four end points, or when three end points may be extracted from the four end points, the center coordinates of a circle passing through the three end points may be set as the center coordinates of the substrate W. A method for obtaining the center coordinates is not limited to the above, and a known method may be applied.

In the above description, a case of moving the substrate W along the arrow AM, that is, a case of placing (receiving) the substrate W has been described. However, the position of the substrate W may be measured when the substrate W is moved in the reverse direction of the arrow AM, that is, when the end effector 200 is retracted after the substrate W is placed.

Further, the optical sensor 222 and the optical sensor 223 may detect the position of a consumable component provided in the plasma processing apparatus 1 (substrate processing apparatus), for example, of the annular member of the ring assembly 112, without being limited to the substrate W. The number of optical sensors is not limited to two, and for example, two or more optical sensors may be provided. That is, the optical sensors may be provided in at least two or more locations.

<Operations and Effects>

According to the end effector 200 in the second configuration example of the embodiment, in addition to the effects of the end effector 100 in the first configuration example of the embodiment, the position of the transfer target object can be detected after the transfer target object is placed on the substrate support 11 or the like.

Third Configuration Example of Embodiment

Figure 24:
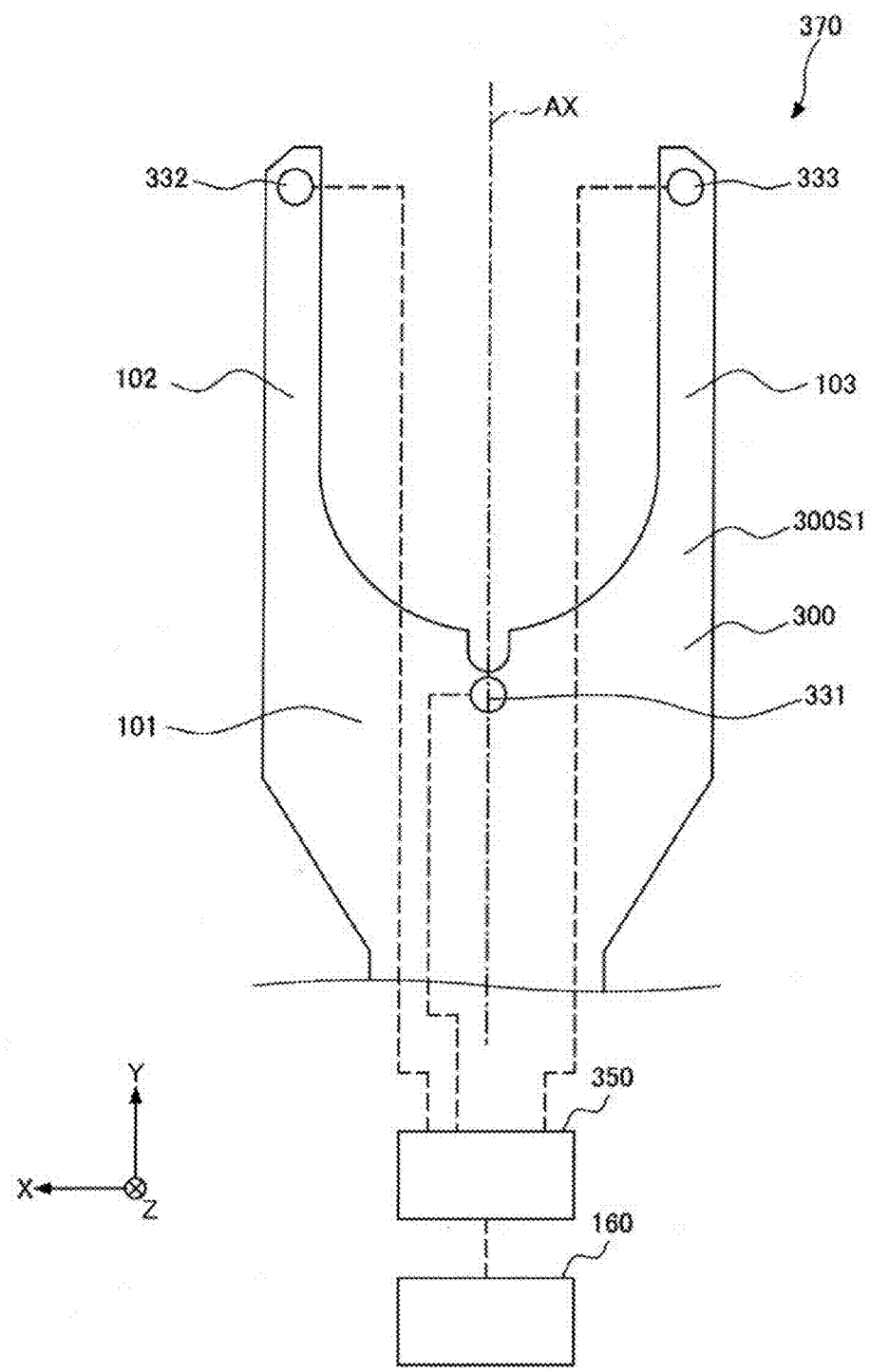
FIG. 24 is a bottom view of an end effector of a transfer device according to a third configuration example of the embodiment.

Next, an end effector 300 of a transfer device 370 according to a third configuration example of the embodiment will be described. FIG. 24 is a bottom view of the end effector 300 of the transfer device 370 according to the third configuration example of the embodiment. The end effector 300 further includes an electrostatic capacitance sensor 331, an electrostatic capacitance sensor 332, and an electrostatic capacitance sensor 333 in the end effector 100 of the transfer device 170 according to the first configuration example of the embodiment. A top view of the end effector 300 is similar to FIG. 17, thereby being omitted.

The transfer device 370 includes the end effector 300, the arm 160, and a control device 350.

The end effector 300 includes the electrostatic capacitance sensor 331, the electrostatic capacitance sensor 332, and the electrostatic capacitance sensor 333 on a bottom surface 300S1 opposite to a placement surface. That is, the end effector 300 includes the electrostatic capacitance sensor 331, the electrostatic capacitance sensor 332, and the electrostatic capacitance sensor 333 on a lower side thereof.

Each of the electrostatic capacitance sensor 331, the electrostatic capacitance sensor 332, and the electrostatic capacitance sensor 333 includes an electrode having a substantially circular shape in a plan view. Each of the electrostatic capacitance sensor 331, the electrostatic capacitance sensor 332, and the electrostatic capacitance sensor 333 measures each electrostatic capacitance between each electrode and the substrate W positioned on a lower side of the bottom surface 300S1. Each of the electrostatic capacitance sensor 331, the electrostatic capacitance sensor 332, and the electrostatic capacitance sensor 333 measures the overlap between each electrode and the substrate W in a plan view.

The electrostatic capacitance sensor 331 is provided at a center of a base portion 101 in the X-axis direction. The electrostatic capacitance sensor 331 is provided at a position corresponding to the electrostatic capacitance sensor 121. The electrostatic capacitance sensor 332 is provided at the tip of the tip portion 102 on the +Y side in the Y-axis direction. The electrostatic capacitance sensor 332 is provided at a position corresponding to the electrostatic capacitance sensor 122. The electrostatic capacitance sensor 333 is provided at the tip of the tip portion 103 on the +Y side in the Y-axis direction. The electrostatic capacitance sensor 333 is provided at a position corresponding to the electrostatic capacitance sensor 123.

The electrostatic capacitance sensor 331, the electrostatic capacitance sensor 332, and the electrostatic capacitance sensor 333 detect the position of the substrate W after the substrate W is placed at a placement target, for example, the substrate support 11. Detecting the position of the substrate W after the placement enables to detect whether the substrate W is placed at a correct position after the placement of the substrate W. For example, when the substrate W is placed with misalignment, the control device 350 places the substrate W again by correcting the position of the substrate W.

Further, the electrostatic capacitance sensor 331, the electrostatic capacitance sensor 332, and the electrostatic capacitance sensor 333 may detect the position of a consumable component provided in the plasma processing apparatus 1 (substrate processing apparatus), for example, of an annular member of the ring assembly 112, without being limited to the substrate W.

Each of the electrostatic capacitance sensor 331, the electrostatic capacitance sensor 332, and the electrostatic capacitance sensor 333 is an example of a second sensor.

<Operations and Effects>

According to the end effector 300 in the third configuration example of the embodiment, in addition to the effects of the end effector 100 in the first configuration example of the embodiment, the position of the transfer target object can be detected after the transfer target object is placed on the substrate support 11 or the like.

Instead of the electrostatic capacitance sensor 331, the electrostatic capacitance sensor 332, and the electrostatic capacitance sensor 333, an optical sensor described in the second configuration example of the embodiment may be used on the bottom surface. Further, the sensor on the placement surface is not limited to the electrostatic capacitance sensor, and may be an optical sensor.

In the embodiment described above, the calculation of the positional relationship between the substrate and the end effector is performed by the control device. However, the calculation of the positional relationship between the substrate and the end effector is not limited to the control device. For example, the controller CU may calculate the relative position (positional relationship) with the transfer target object based on detected results from at least any one of the electrostatic capacitance sensor and the optical sensor provided in the end effector attached to the transfer device (transfer robot). Further, the controller CU may determine the teaching position for the transfer device (transfer robot) based on the calculated relative position. Further, an operation instruction may be output to the transfer device (transfer robot) such that the end effector is disposed at the teaching position determined by the controller CU. The system that includes the controller CU and the transfer device is referred to as a transfer system.

In the above embodiment, a case has been described in which the electrostatic capacitance sensor and the optical sensor are used as the sensors that detect the relative position between the fork and the transfer target object. However, the type of the sensors is not limited thereto. For example, instead of the electrostatic capacitance sensor or the optical sensor, a non-contact type sensor such as a magnetic force sensor or the like may be used. Further, as in the first embodiment, a camera may be used as the sensor.

In the embodiment described above, a case where the substrate is a semiconductor wafer has been described. However, the present disclosure is not limited thereto. For example, the substrate may be various substrates used for a liquid crystal display (LCD), a flat panel display (FPD), a CD substrate, a printed substrate, or the like.

Third Embodiment

[Processing System]

An example of a processing system of an embodiment will be described with reference to FIG. 1. As illustrated in FIG. 1, a processing system PS is a system capable of performing various types of processing, such as plasma processing, on a substrate.

The processing system PS includes vacuum transfer modules TM1 and TM2, process modules PM1 to PM12, load-lock modules LL1 and LL2, an atmospheric transfer module LM, an aligner AN, a storage SR, and the like.

The vacuum transfer modules TM1 and TM2 each have a substantially rectangular shape in a plan view. The process modules PM1 to PM6 are connected to two opposite side surfaces of the vacuum transfer module TM1. The load-lock modules LL1 and LL2 are connected to one side surface of the other two opposite side surfaces of the vacuum transfer module TM1, and a path (not illustrated) for connecting to the vacuum transfer module TM2 is connected to the other side surface of the vacuum transfer module TM1. The side surface, to which the load-lock modules LL1 and LL2 are connected, of the vacuum transfer module TM1 are angled according to the two load-lock modules LL1 and LL2. The process modules PM7 to PM12 are connected to two opposite side surfaces of the vacuum transfer module TM2. A path (not illustrated) for connecting to the vacuum transfer module TM1 is connected to one side surface of the other two opposite side surfaces of the vacuum transfer module TM2. The vacuum transfer modules TM1 and TM2 have vacuum chambers in a vacuum atmosphere, and vacuum transfer robots TR1 and TR2 are disposed therein, respectively.

The vacuum transfer robots TR1 and TR2 are configured to be rotatable, extensible, and vertically movable. The vacuum transfer robots TR1 and TR2 transfer a transfer target object based on an operation instruction output from a controller CU which will be described later. For example, the vacuum transfer robot TR1 holds a transfer target object by the end effectors FK11 and FK12 disposed at tips of arms AR11 and AR12, respectively, and transfers the transfer target object between the load-lock modules LL1 and LL2, the process modules PM1 to PM6, and the path (not illustrated). For example, the vacuum transfer robot TR2 holds the transfer target object with the end effectors FK21 and FK22 disposed at tips of arms AR21 and AR22, respectively, and transfers the transfer target object between the process modules PM7 to PM12 and the path (not illustrated). The end effector is also referred to as a fork or a pick.

The transfer target object includes a substrate and a consumable member. The substrate is, for example, a semiconductor wafer or a sensor wafer. The consumable member is a member that is attached in the process modules PM1 to PM12 in a replaceable manner, and is a member that is consumed when various types of processing, such as plasma processing, are performed in the process modules PM1 to PM12. The consumable member includes, for example, members constituting a ring assembly 112 and a shower head 13 which will be described later.

The process modules PM1 to PM12 each have a processing chamber and have a stage (placement table) disposed inside. After the substrate is installed on the stage, the inside of the process modules PM1 to PM12 are depressurized to introduce a processing gas thereinto, an RF power is applied to generate plasma, and plasma processing is performed on the substrate by the plasma. The vacuum transfer modules TM1 and TM2 and the process modules PM1 to PM12 are separated by an openable/closable gate valve G1.

The load-lock modules LL1 and LL2 are disposed between the vacuum transfer module TM1 and the atmospheric transfer module LM. The load-lock modules LL1 and LL2 each have a chamber having a variable internal pressure, whose inside can be switched to vacuum or atmospheric pressure. The load-lock modules LL1 and LL2 each have a stage disposed therein. When the substrate is loaded from the atmospheric transfer module LM into the vacuum transfer module TM1, the load-lock modules LL1 and LL2 receive the substrate from the atmospheric transfer module LM while maintaining the inside at the atmospheric pressure, and depressurize the pressure in the inside to load the substrate into the vacuum transfer module TM1. When the substrate is unloaded from the vacuum transfer module TM1 to the atmospheric transfer module LM, the load-lock modules LL1 and LL2 receive the substrate from the vacuum transfer module TM1 while maintaining the inside at a vacuum, and pressurize the inside to the atmospheric pressure to load the substrate into the atmospheric transfer module LM. The load-lock modules LL1 and LL2 and the vacuum transfer module TM1 are separated by openable/closable gate valves G2. The load-lock modules LL1 and LL2 and the atmospheric transfer module LM are separated by an openable/closable gate valve G3.

The atmospheric transfer module LM is disposed to face the vacuum transfer module TM1. The atmospheric transfer module LM may be, for example, an equipment front end module (EFEM). The atmospheric transfer module LM is an atmospheric transfer chamber that has a rectangular parallelepiped shape, includes a fan filter unit (FFU), and is maintained in an atmospheric pressure atmosphere. The two load-lock modules LL1 and LL2 are connected to one side surface of the atmospheric transfer module LM along a longitudinal direction. Load ports LP1 to LP4 are connected to the other side surface of the atmospheric transfer module LM along the longitudinal direction. Containers C that accommodate a plurality of substrates (for example, 25 substrates) are placed in the load ports LP1 to LP4. The container C may be, for example, a front-opening unified pod (FOUP). An atmospheric transfer robot TR3 that transfers the transfer target object is disposed in the atmospheric transfer module LM.

The atmospheric transfer robot TR3 is configured to be movable along the longitudinal direction of the atmospheric transfer module LM, and is also configured to be rotatable, extensible, and vertically movable. The atmospheric transfer robot TR3 transfers the transfer target object based on an operation instruction output from the controller CU which will be described later. For example, the atmospheric transfer robot TR3 holds a transfer target object with the end effector FK31 disposed at a tip of an arm AR31, and transfers the transfer target object between the load ports LP1 to LP4, the load-lock modules LL1 and LL2, the aligner AN, and the storage SR.

The aligner AN is connected to one side surface of the atmospheric transfer module LM along a lateral direction. However, the aligner AN may be connected to a side surface of the atmospheric transfer module LM along the longitudinal direction. Further, the aligner AN may be provided inside the atmospheric transfer module LM. The aligner AN has a support stand, an optical sensor (neither of which is illustrated), and the like. The aligner referred to here is a device that detects a position of the transfer target object.

The support stand is a stand rotatable around a center of an axis extending in a vertical direction, and configured to support the substrate thereon. The support stand is rotated by a driving device (not illustrated). The driving device is controlled by the controller CU which will be described later. The support stand is configured such that when the support stand is rotated by the driving power from the driving device, the substrate installed on the support stand is also rotated.

The optical sensor detects an edge of the substrate while the substrate rotates. The optical sensor detects a misalignment amount of an angular position of a notch (or another marker) of the substrate with respect to a reference angular position, and a misalignment amount of a central position of the substrate with respect to the reference position, from a detected result of the edge. The optical sensor outputs a misalignment amount of the angular position of the notch and a misalignment amount of the central position of the substrate to the controller CU which will be described later. The controller CU calculates a rotation amount of a rotation support stand to correct the angular position of the notch to the reference angular position based on the misalignment amount of the angular position of the notch. The controller CU controls the driving device (not illustrated) to rotate the rotation support stand by the rotation amount. Accordingly, the angular position of the notch can be corrected to the reference angular position. Further, the controller CU controls a position of the end effector FK31 of the atmospheric transfer robot TR3 when the substrate is received from the aligner AN based on the misalignment amount of the central position of the substrate, such that the central position of the substrate coincides with a given position on the end effector FK31 of the atmospheric transfer robot TR3.

The storage SR is connected to a side surface of the atmospheric transfer module LM along the longitudinal direction. However, the storage SR may be connected to a side surface of the atmospheric transfer module LM along the lateral direction. Further, the storage SR may be provided inside the atmospheric transfer module LM. The storage SR accommodates the transfer target object.

The processing system PS is provided with the controller CU. The controller CU may be, for example, a computer. The controller CU includes a central processing unit (CPU), a random access memory (RAM), a read only memory (ROM), an auxiliary storage device, and the like. The CPU operates based on a program stored in the ROM or the auxiliary storage device, and controls each part of the processing system PS. For example, the controller CU outputs an operation instruction to the vacuum transfer robots TR1 and TR2, the atmospheric transfer robot TR3, and the like. The operation instruction includes an instruction to align the end effectors FK11, FK12, FK21, FK22 and FK31, which are configured to transfer the transfer target object, with the transfer location of the transfer target object.

[Plasma Processing System]

An example of the plasma processing system which may be adopted as any of the process modules PM1 to PM12 will be described with reference to FIG. 2.

In one embodiment, the plasma processing system includes a plasma processing apparatus 1 and a plasma processing controller 2. The plasma processing apparatus 1 includes a plasma processing chamber 10, a substrate support 11, and a plasma generator 12. The plasma processing chamber 10 has a plasma processing space. Further, the plasma processing chamber 10 has at least one gas supply port for supplying at least one processing gas into the plasma processing space, and at least one gas exhaust port for exhausting the gas from the plasma processing space. The gas supply port is connected to a gas supply 20 which will be described later, and the gas exhaust port is connected to an exhaust system 40 which will be described later. The substrate support 11 is disposed in the plasma processing space and has a substrate support surface for supporting the substrate.

The plasma generator 12 is configured to generate plasma from at least one processing gas supplied into the plasma processing space. The plasma formed in the plasma processing space may be capacitively coupled plasma (CCP), inductively coupled plasma (ICP), electron-cyclotron-resonance plasma (ECR plasma), helicon wave-excited plasma (HWP), surface wave plasma (SWP), or the like. Further, various types of plasma generators, including an alternating current (AC) plasma generator and a direct current (DC) plasma generator, may be used. In one embodiment, an AC signal (AC power) used by the AC plasma generator has a frequency in a range of 100 kHz to 10 GHz. Accordingly, the AC signal includes a radio frequency (RF) signal and a microwave signal. In one embodiment, the RF signal has a frequency in a range of 200 kHz to 150 MHz.

The plasma processing controller 2 processes a computer-executable instruction for causing the plasma processing apparatus 1 to execute various processes which will be described in the present disclosure. The plasma processing controller 2 may be configured to control each element of the plasma processing apparatus 1 to execute the various processes which will be described here. In one embodiment, a part or entirety of the plasma processing controller 2 may be included in the plasma processing apparatus 1. The plasma processing controller 2 may include, for example, a computer 2a. For example, the computer 2a may include a processor (central processing unit (CPU)) 2a1, a storage 2a2, and a communication interface 2a3. The processor 2a1 may be configured to perform various control operations based on a program stored in the storage 2a2. The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Hereinafter, a configuration example of a capacitively coupled plasma processing apparatus as an example of the plasma processing apparatus 1 will be described with reference to FIG. 3.

A capacitively coupled plasma processing apparatus 1 includes a plasma processing chamber 10, a gas supply 20, a power source 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of the ceiling of the plasma processing chamber 10. The plasma processing chamber 10 has a plasma processing space 10s defined by the shower head 13, a sidewall 10a of the plasma processing chamber 10, and the substrate support 11. The sidewall 10a is grounded. The shower head 13 and the substrate support 11 are electrically insulated from a housing of the plasma processing chamber 10.

The substrate support 11 includes a main body 111 and a ring assembly 112. The main body 111 has a central region (substrate support surface) 111a for supporting the substrate (wafer) W, and an annular region (ring support surface) 111b for supporting the ring assembly 112. The annular region 111b of the main body 111 surrounds the central region 111a of the main body 111 in a plan view. The substrate W is disposed on the central region 111a of the main body 111, and the ring assembly 112 is disposed on the annular region 111b of the main body 111 to surround the substrate W on the central region 111a of the main body 111. In one embodiment, the main body 111 includes a base and an electrostatic chuck. The base includes a conductive member. The conductive member of the base functions as a lower electrode. The electrostatic chuck is disposed on the base. The upper surface of the electrostatic chuck has a substrate support surface 111a. The ring assembly 112 includes one or more annular members. At least one of the one or more annular members is an edge ring. Although not illustrated, the substrate support 11 may include a temperature control module configured to adjust at least one of the electrostatic chuck, the ring assembly 112, and the substrate to a target temperature. The temperature control module may include a heater, a heat transfer medium, a flow path, or a combination thereof. A heat transfer fluid, such as brine or gas, flows through the flow path. Further, the substrate support 11 may include a heat transfer gas supply configured to supply a heat transfer gas between the rear surface of the substrate W and the substrate support surface 111a.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes a conductive member. The conductive member of the shower head 13 functions as an upper electrode. The gas introduction unit may include, in addition to the shower head 13, one or more side gas injectors (SGI) that are attached to one or more openings formed in the sidewall 10a.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include at least one flow rate modulation device that modulates or causes the flow rate of at least one processing gas to pulsate.

The power source 30 includes an RF power source 31 coupled to the plasma processing chamber 10 via at least one impedance matching circuit. The RF power source 31 is configured to supply at least one RF signal (RF power), such as the source RF signal and the bias RF signal, to the conductive member of the substrate support 11 and/or the conductive member of the shower head 13. As a result, plasma is formed from at least one processing gas supplied into the plasma processing space 10s. Accordingly, the RF power source 31 may function as at least a part of the plasma generator 12. Further, the supply of the bias RF signal to the conductive member of the substrate support 11 can generate a bias potential in the substrate W to draw an ion component in the formed plasma to the substrate W.

In one embodiment, the RF power source 31 includes a first RF generator 31a and a second RF generator 31b. The first RF generator 31a is coupled to the conductive member of the substrate support 11 and/or the conductive member of the shower head 13 via at least one impedance matching circuit, and configured to generate a source RF signal (source RF power) for plasma generation. In one embodiment, the source RF signal has a frequency in the range of 13 MHz to 150 MHz. In one embodiment, the first RF generator 31a may be configured to generate a plurality of source RF signals having different frequencies. One or more source RF signals so generated are supplied to the conductive member of the substrate support 11 and/or the conductive member of the shower head 13. The second RF generator 31b is coupled to the conductive member of the substrate support 11 via at least one impedance matching circuit, and configured to generate a bias RF signal (bias RF power). In one embodiment, the bias RF signal has a lower frequency than the source RF signal. In one embodiment, the bias RF signal has a frequency in the range of 400 kHz to 13.56 MHz. In one embodiment, the second RF generator 31b may be configured to generate a plurality of bias RF signals having different frequencies. One or more bias RF signals so generated are supplied to the conductive member of the substrate support 11. Further, in various embodiments, at least one of the source RF signal and the bias RF signal may pulsate.

Further, the power source 30 may include a DC power source 32 coupled to the plasma processing chamber 10. The DC power source 32 includes a first DC generator 32a and a second DC generator 32b. In one embodiment, the first DC generator 32a is connected to the conductive member of the substrate support 11 and configured to generate a first DC signal. The generated first DC signal is applied to the conductive member of the substrate support 11. In one embodiment, the first DC signal may be applied to another electrode, such as an electrode in an electrostatic chuck. In one embodiment, the second DC generator 32b is configured to be connected to the conductive member of the shower head 13 and to generate a second DC signal. The generated second DC signal is applied to the conductive member of the shower head 13. In various embodiments, the first and second DC signals may pulsate. The first and second DC generators 32a and 32b may be provided in addition to the RF power source 31, and the first DC generator 32a may be provided instead of the second RF generator 31b.

The exhaust system 40 may be connected to, for example, a gas exhaust port 10e disposed at a bottom portion of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

End Effector 400 of Transfer Robot 470 of Present Embodiment

Figure 25:
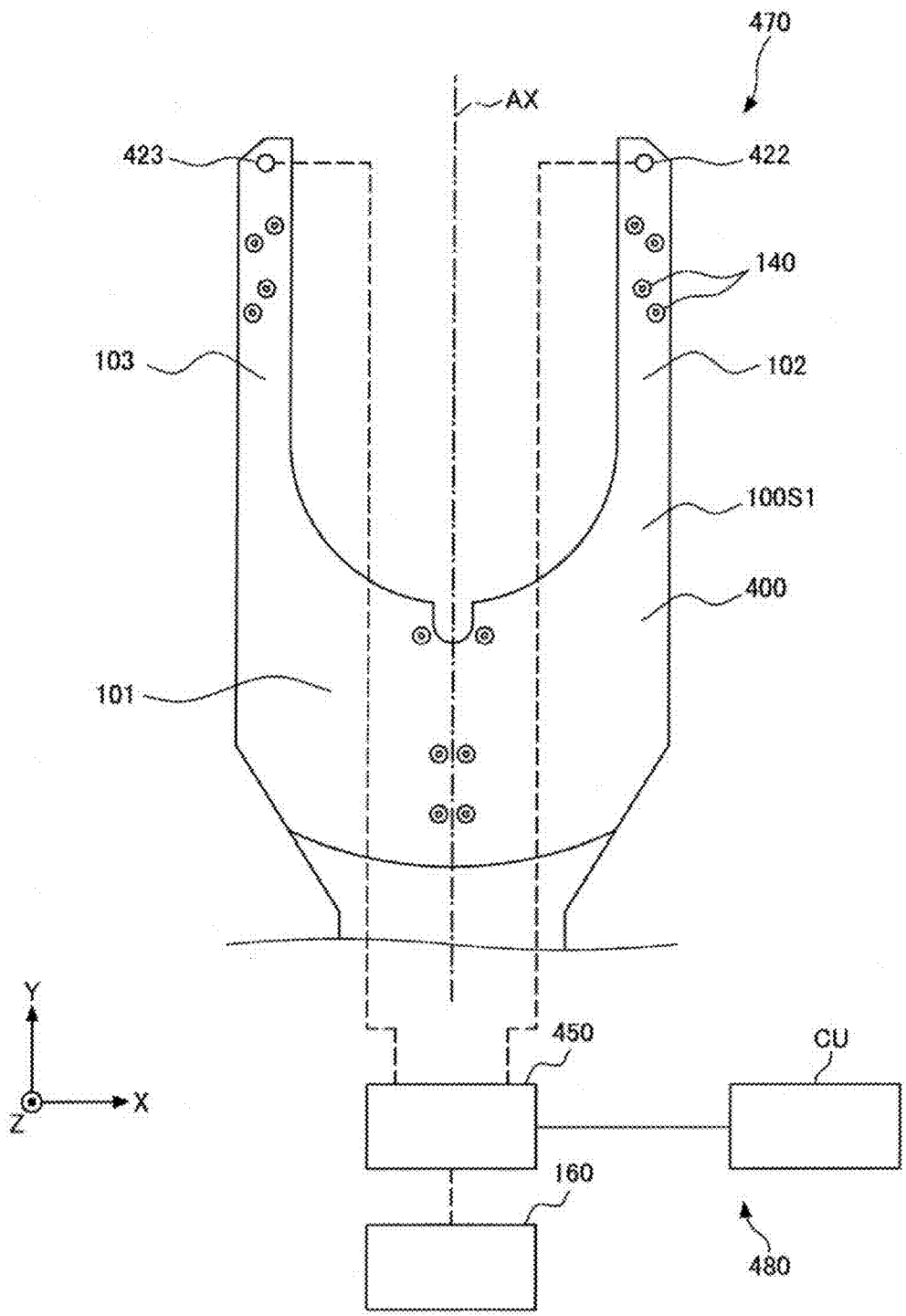
FIG. 25 is a top view of an end effector of a transfer robot according to the present embodiment.
Figure 26:
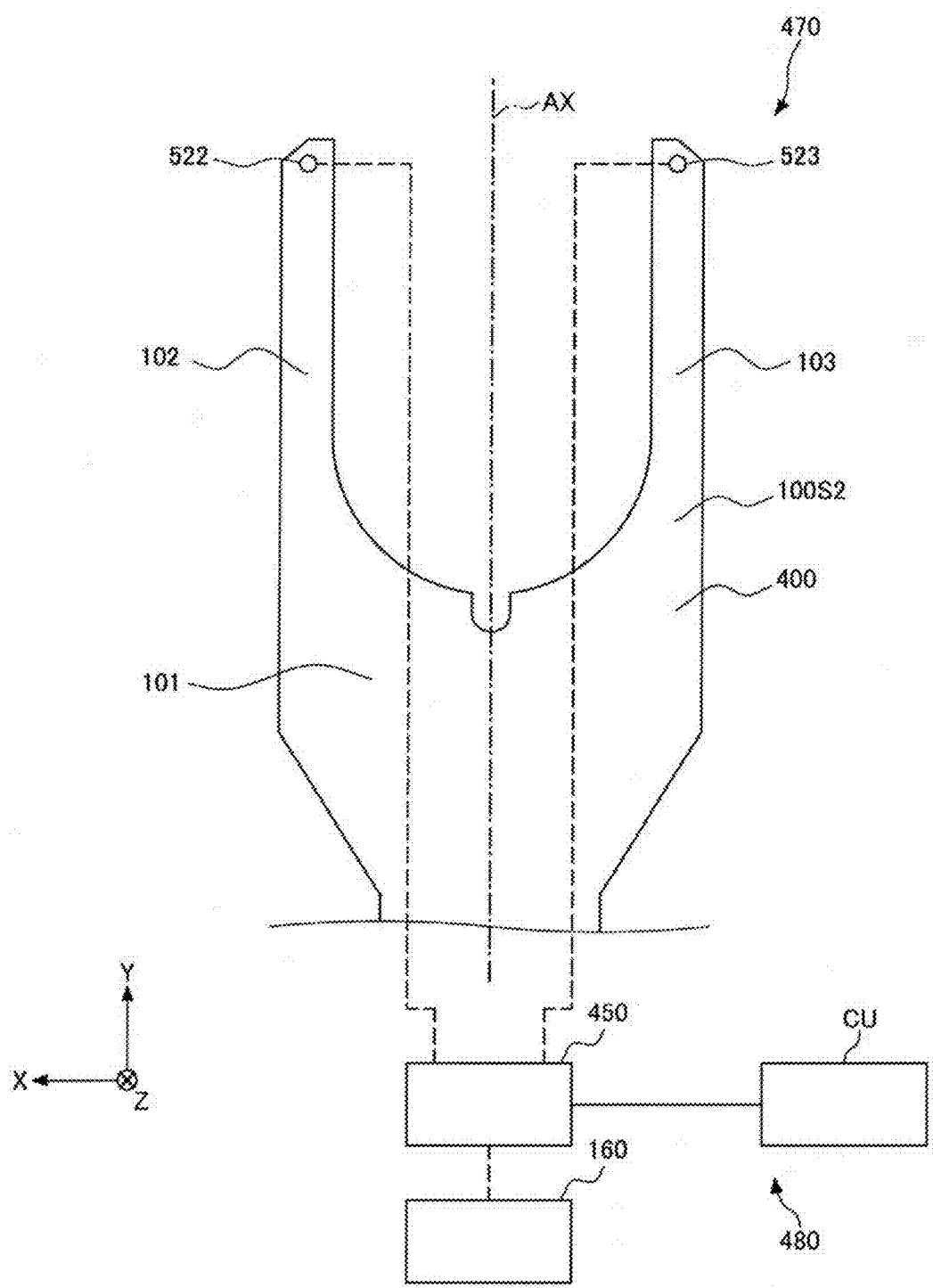
FIG. 26 is a bottom view of the end effector of the transfer robot according to the present embodiment.

An end effector 400 of a transfer robot 470 according to the present embodiment will be described. FIG. 25 is a top view of the end effector 400 of the transfer robot 470 according to the present embodiment. FIG. 26 is a bottom view of the end effector 400 of the transfer robot 470 according to the present embodiment.

In the drawing, an XYZ orthogonal coordinate system may be set for convenience of description. With respect to a coordinate axis perpendicular to a paper plane of the drawing, a cross mark in a circle of the coordinate axis indicates that a backward direction with respect to the paper plane is positive, and a black circle in the circle indicates that a forward direction with respect to the paper plane is positive. However, the coordinate system is determined for description, and a posture of the end effector or the like is not limited thereby.

In the present disclosure, an X axis and a Y axis are axes in parallel with a placement surface of the end effector, unless otherwise described. The Y axis is an axis in a direction in which a tip portion of the end effector extends. The X axis is an axis perpendicular to the Y axis. The Z axis is an axis in a direction perpendicular to the X axis and the Y axis. The Z-axis direction may be referred to as a vertical direction.

The transfer robot 470 represents, for example, at least any one of the vacuum transfer robot TR1, the vacuum transfer robot TR2, and the atmospheric transfer robot TR3. The transfer robot 470 transfers the substrate W and the consumable components provided in the plasma processing apparatus 1 (substrate processing apparatus) based on an operation instruction from the controller CU.

The transfer robot 470 includes the end effector 400, the arm 160, and a control device 450. The control device 450 of the transfer robot 470 is communicably connected to the controller CU. The controller CU outputs the operation instruction to the transfer robot 470. The transfer robot 470 transfers the transfer target object by the end effector 400 based on the operation instruction output by the controller CU. The combination of the transfer robot 470 and the controller CU is referred to as a transfer system 480.

The end effector 400 represents, for example, at least any one of the end effector FK11, the end effector FK12, the end effector FK21, the end effector FK22, and the end effector FK31. The arm 160 is, for example, any one of the arm AR11, the arm AR12, the arm AR21, the arm AR22, and the arm AR31 corresponding to the end effector 400. The end effector 400 transfers the transfer target object under at least one of the atmospheric pressure atmosphere and the vacuum atmosphere.

The control device 450 controls the arm 160. Further, the control device 450 is connected to an optical sensor 422 and an optical sensor 423, which will be described later, respectively. The control device 450 measures a positional relationship between the substrate W and the end effector 400 based on a result measured by each of the optical sensor 422 and the optical sensor 423. The control device 450 transmits the measured positional relationship between the substrate W and the end effector 400 to the controller CU. The controller CU may measure the positional relationship between the substrate W and the end effector 400 based on the result measured by each of the optical sensor 422 and the optical sensor 423.

In the end effector 400, the substrate and the consumable components provided in the plasma processing apparatus 1 are placed. The consumable component provided in the plasma processing apparatus 1 is, for example, an annular member of the ring assembly 112.

The end effector 400 has a substantially U-shape in a plan view. The end effector 400 has a shape symmetrical in a plan view with respect to a central axis AX extending in the Y-axis direction through a center in the X-axis direction.

The end effector 400 has a base portion 101, a tip portion 102, and a tip portion 103. Each of the tip portion 102 and the tip portion 103 is provided to extend in a +Y-axis direction from the base portion 101. Each of the tip portion 102 and the tip portion 103 has a substantially rectangular shape in a plan view that is short in the X-axis direction and long in the Y-axis direction. The tip portion 102 is provided to be separated from the tip portion 103 in the +X-axis direction. The end effector 400 is formed of, for example, ceramic.

The end effector 400 has a placement surface 100S1 on which either the substrate or the consumable component is placed. The end effector 400 includes an optical sensor 422 and an optical sensor 423 on the placement surface 100S1, and a plurality of pads 140 that protect to prevent the substrate W from coming into contact with the placement surface 100S1. The optical sensor 422 is provided at the tip of the tip portion 102 on the +Y side in the Y-axis direction. The optical sensor 423 is provided at the tip of the tip portion 103 on the +Y side in the Y-axis direction.

Further, the end effector 400 includes an optical sensor 522 and an optical sensor 523 on a bottom surface 100S2 opposite to the placement surface 100S1. The optical sensor 522 and the optical sensor 523 are provided on a backside of the optical sensor 422 and the optical sensor 423, respectively.

The respective optical sensor 422 and optical sensor 423 detect optically whether the substrate W is present on respective upper sides of the optical sensor 422 and the optical sensor 423. Each of the optical sensor 422 and the optical sensor 423 is connected to the control device 450.

The respective optical sensor 522 and optical sensor 523 detect optically whether the substrate W is present on respective lower sides of the optical sensor 522 and the optical sensor 523. Further, the respective optical sensor 522 and optical sensor 523 detect, for example, an annular member of the substrate placement surface or a ring assembly to be located on the respective lower sides of the optical sensor 522 and the optical sensor 523. The respective optical sensor 522 and optical sensor 523 detect, for example, the substrate placement surface or the annular member of the ring assembly to be located on the respective lower sides of the optical sensor 522 and the optical sensor 523, thereby detecting a state of a placement location of the substrate or the annular member. Each of the optical sensor 522 and the optical sensor 523 is connected to the control device 450.

For example, each of the optical sensor 422, the optical sensor 423, the optical sensor 522, and the optical sensor 523 is an image sensor. The respective optical sensor 422 and optical sensor 423 serving as the image sensor image respective upper sides of the optical sensor 422 and the optical sensor 423. Further, the respective optical sensor 522 and optical sensor 523 serving as the image sensor image the respective lower sides of the optical sensor 522 and the optical sensor 523.

The control device 450 determines whether or not the substrate W is present on the respective upper sides of the optical sensor 422 and the optical sensor 423 based on the image obtained through imaging. Further, the control device 450 determines whether or not the substrate W is present on the respective lower sides of the optical sensor 522 and the optical sensor 523 based on the image obtained through imaging. Further, the control device 450 determines, for example, the state (position or the like) of the substrate placement surface or the annular member of the ring assembly to be located on the respective lower sides of the optical sensor 522 and the optical sensor 523.

Further, each of the optical sensor 422, the optical sensor 423, the optical sensor 522, and the optical sensor 523 is, for example, a distance sensor. The respective optical sensor 422 and optical sensor 423 serving as the distance sensor measure a distance to an object positioned on the respective upper sides of the optical sensor 422 and the optical sensor 423. Further, the respective optical sensor 522 and optical sensor 523 serving as the distance sensor measure the distance to the object positioned on the respective lower sides of the optical sensor 522 and the optical sensor 523.

The control device 450 determines whether or not the substrate W is present on the respective upper sides of the optical sensor 422 and the optical sensor 423 based on the measured distance. Further, based on the measured distance, it is determined whether or not the substrate W is positioned on the respective lower sides of the optical sensor 522 and the optical sensor 523. Further, the control device 450 determines, for example, the state (position or the like) of the substrate placement surface or the annular member of the ring assembly to be located on the respective lower sides of the optical sensor 522 and the optical sensor 523.

Further, each of the optical sensor 422, the optical sensor 423, the optical sensor 522, and the optical sensor 523 is, for example, a reflection-type light intensity sensor. The respective optical sensor 422 and optical sensor 423, which are reflection-type light intensity sensors, irradiate light onto the respective upper sides of the optical sensor 422 and the optical sensor 423, and measure the intensity of light to be reflected and returned from an object positioned on the upper side. Further, the respective optical sensor 522 and optical sensor 523 serving as the reflection-type light intensity sensor irradiate the respective lower sides of the optical sensor 522 and optical sensor 523 with light, and measures the intensity of light to be reflected and returned from the object positioned on the lower side.

The control device 450 determines whether or not the substrate W is present on the respective upper sides of the optical sensor 422 and the optical sensor 423 based on the measured light intensity. Further, the control device 450 also determines whether or not the substrate W is positioned on the respective lower sides of the optical sensor 522 and the optical sensor 523 based on the measured intensity of light. Further, the control device 450 determines, for example, the state (position or the like) of the substrate placement surface or the annular member of the ring assembly to be located on the respective lower sides of the optical sensor 522 and the optical sensor 523.

Further, each of the optical sensor 422, the optical sensor 423, the optical sensor 522, and the optical sensor 523 may be, for example, an LED sensor.

Figure 27:
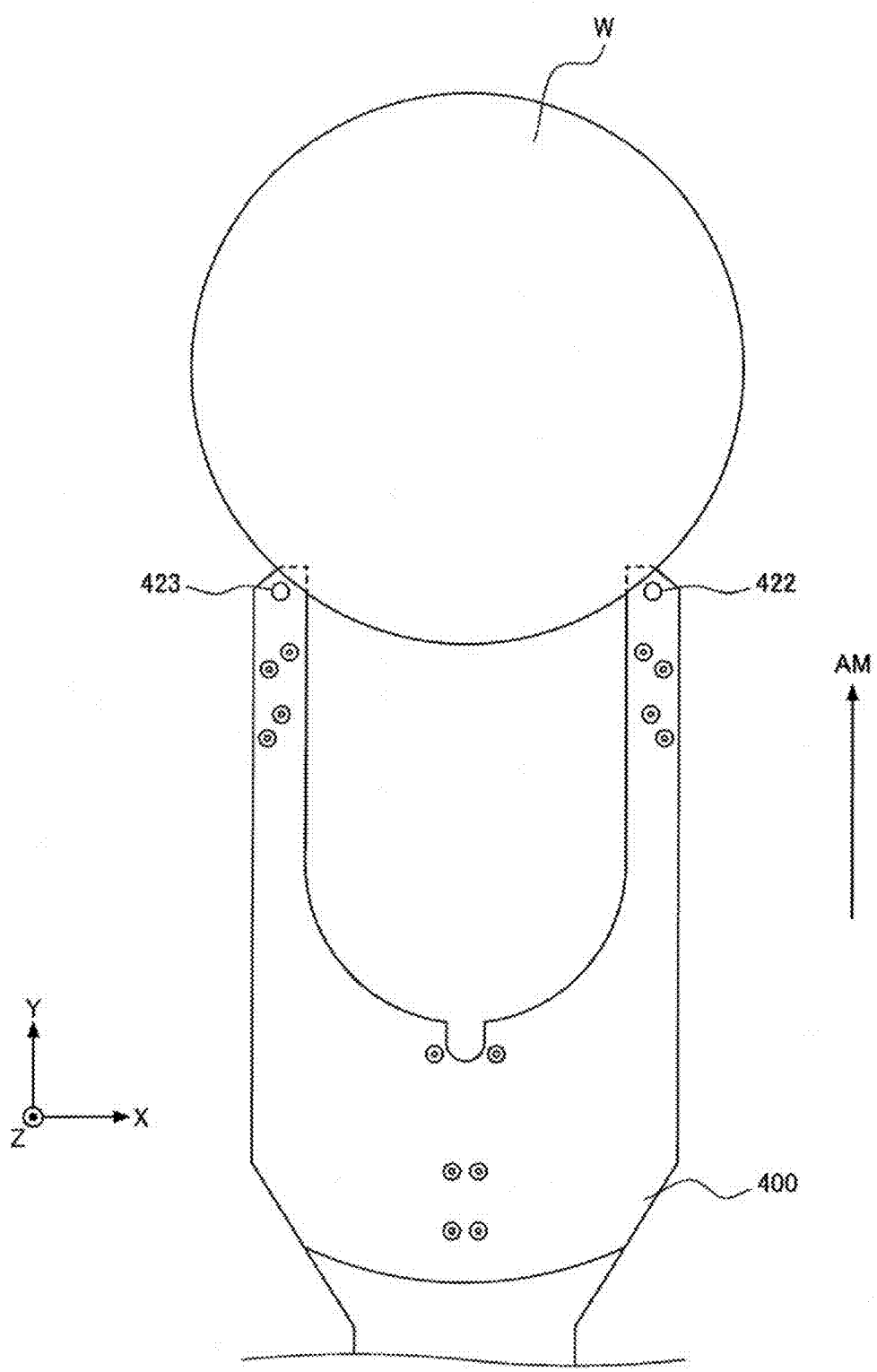
FIG. 27 is a view illustrating measurement of misalignment of a substrate by the end effector of the transfer robot according to the present embodiment.
Figure 28:
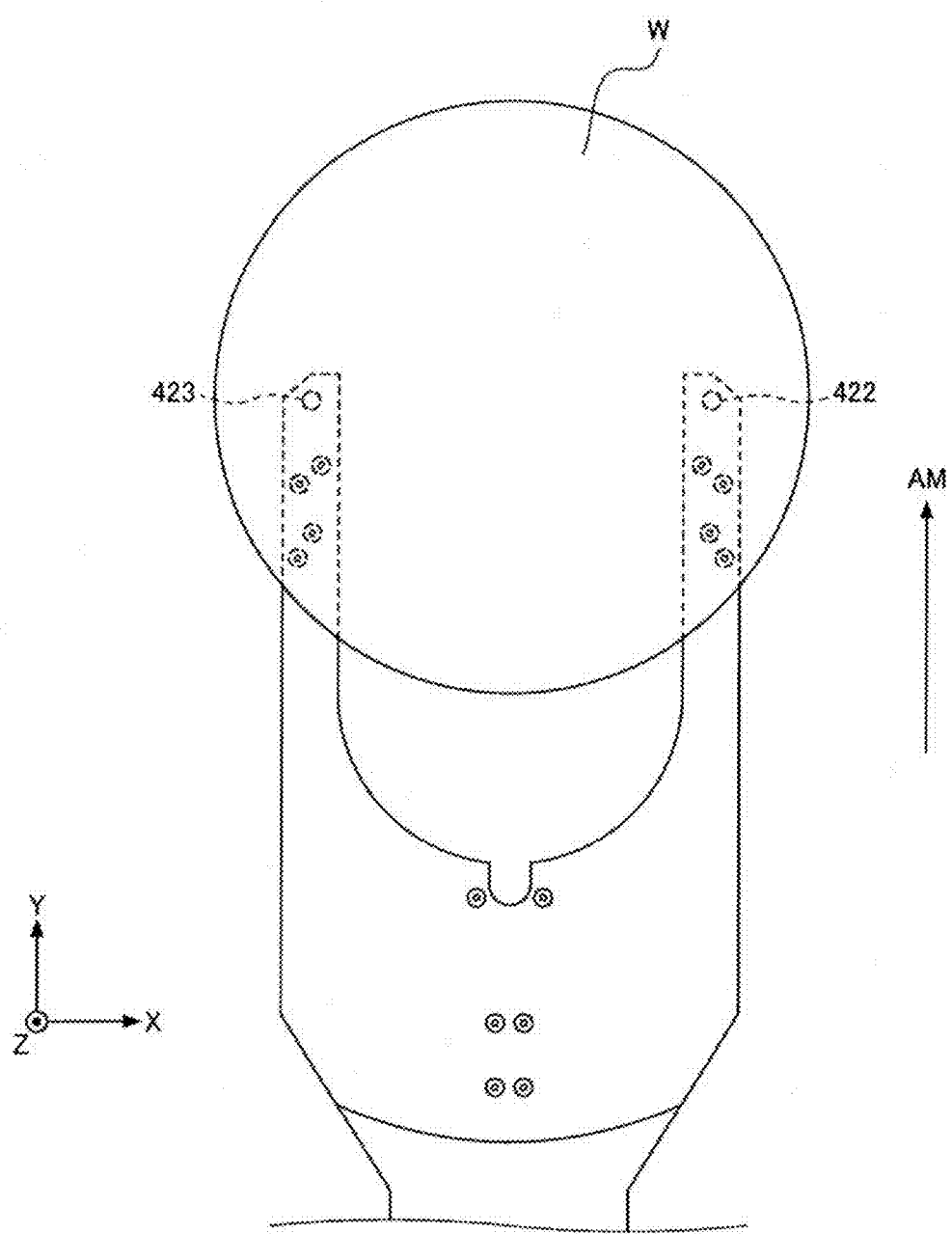
FIG. 28 is a view illustrating the measurement of the misalignment of the substrate by the end effector of the transfer robot according to the present embodiment.
Figure 29:
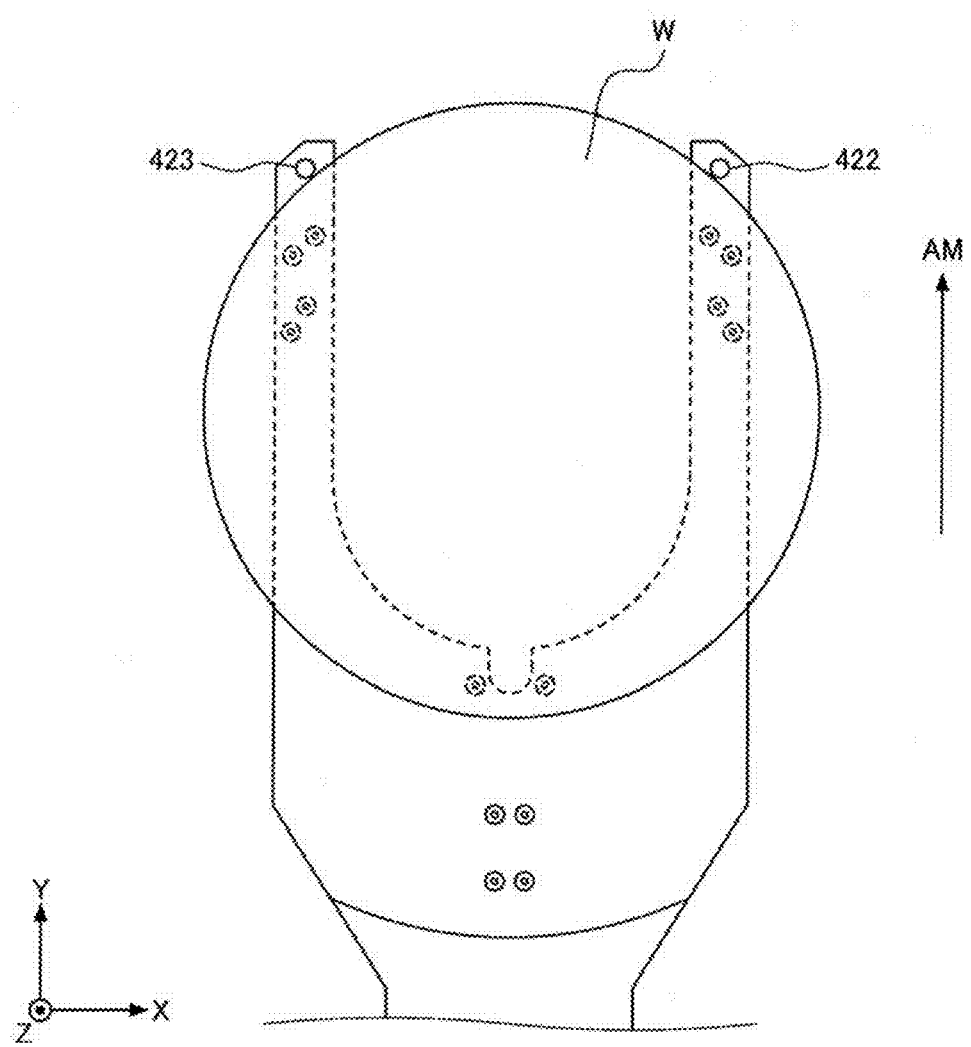
FIG. 29 is a view illustrating the measurement of the misalignment of the substrate by the end effector of the transfer robot according to the present embodiment.

A method for measuring the misalignment will be described. FIGS. 27 to 29 are views illustrating measurement of misalignment of the substrate by the end effector 400 of the transfer robot 470 according to the present embodiment. Here, the measurement of the misalignment of the substrate W placed on the substrate support 11 will be described. For example, the measurement of the substrate W in the load-lock module can be also performed in the same manner. The substrate W is positioned on an upper side of the end effector 400. The measurement of a lower side of the end effector 400 can also be performed in the same manner.

The end effector 400 is moved along an arrow AM to a lower side of the substrate W placed on the substrate support 11. As illustrated in FIG. 27, initially, the substrate W is not positioned on the respective upper sides of the optical sensor 422 and the optical sensor 423. Therefore, each of the optical sensor 422 and the optical sensor 423 does not detect the substrate W.

Further, when the end effector 400 is moved along the arrow AM, the substrate W is positioned on the respective upper sides of the optical sensor 422 and the optical sensor 423 as illustrated in FIG. 28. Each of the optical sensor 422 and the optical sensor 423 detect the substrate W.

Further, when the end effector 400 is moved along the arrow AM, the substrate W is not positioned on the respective upper sides of the optical sensor 422 and the optical sensor 423 as illustrated in FIG. 29. Therefore, each of the optical sensor 422 and the optical sensor 423 does not detect the substrate W.

The control device 450 detects the misalignment of the substrate W with respect to the end effector 400 using information of the position on which the substrate W is present, which position is detected by each of the optical sensor 422 and the optical sensor 423. For example, the control device 450 obtains a central position of the substrate W. The control device 450 calculates the misalignment amount of the substrate W based on the misalignment amount of the central position with respect to the reference position. The controller CU may calculate the misalignment amount of the substrate W instead of the control device 450.

For example, the control device 450 may obtain the central position of the substrate W from the information on the end points of the substrate W detected by each of the optical sensor 422 and the optical sensor 423. The optical sensor 422 and the optical sensor 423 detects four end points in total of substrates W. For example, center coordinates of the substrate W may be obtained by the least squares method based on the coordinates of the four end points, or when three end points may be extracted from the four end points, the center coordinates of a circle passing through the three end points may be set as the center coordinates of the substrate W. A method for obtaining the center coordinates is not limited to the above, and a known method may be applied.

In the above description, s case of moving the substrate W along the arrow AM, that is, a case of placing (receiving) the substrate W has been described. However, the position of the substrate W may be measured when the substrate W is moved in a direction reverse to the arrow AM, that is, when the end effector 400 is retracted after the substrate W is placed.

Further, the optical sensor 522 and the optical sensor 523 may detect the position of a consumable component provided in the plasma processing apparatus 1 (substrate processing apparatus), for example, of an annular member of the ring assembly 112, without being limited to the substrate W. Since the inner diameter of the annular member (edge ring) of the ring assembly 112 is substantially equal to the outer diameter of the substrate W, the misalignment amount of the annular member can be calculated similarly to the calculation of the misalignment amount of the substrate W. The number of optical sensors is not limited to two, and for example, two or more optical sensors may be provided. That is, the optical sensors may be provided in at least two or more locations.

Processing of Transfer System 480 of Present Embodiment

Figure 30:
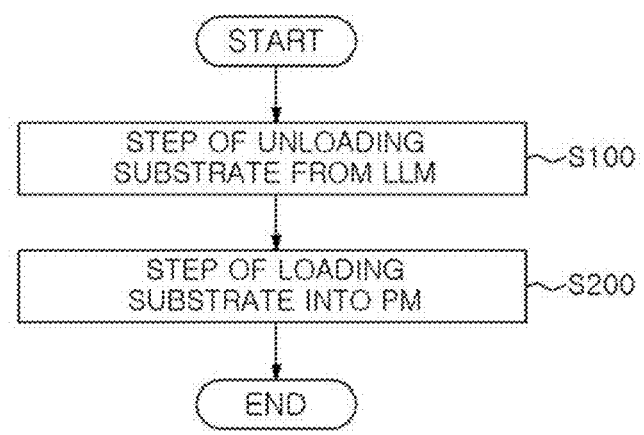
FIG. 30 is a flow chart illustrating processing of a transfer system according to the present embodiment.
Figure 31:
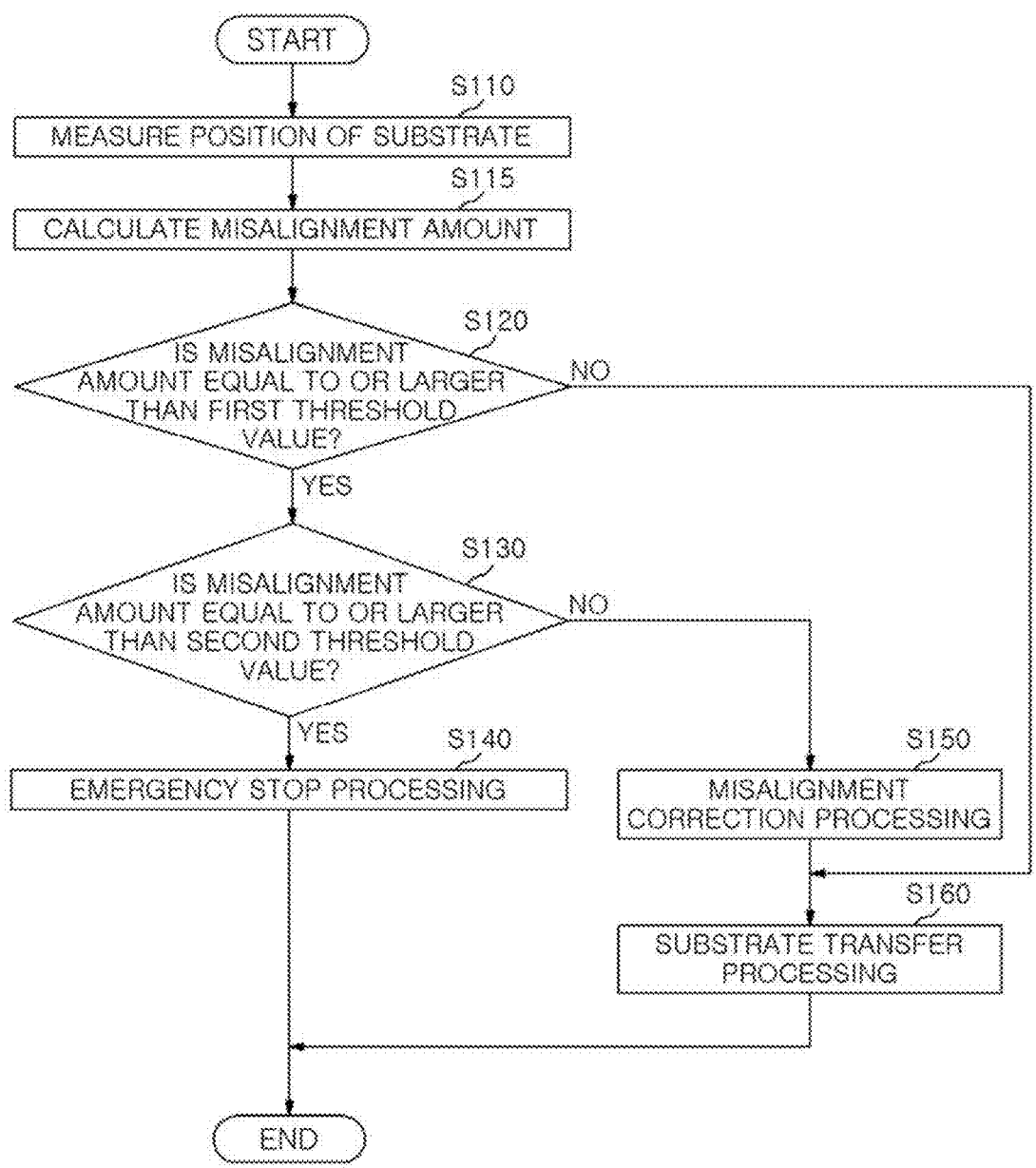
FIG. 31 is a flow chart illustrating the processing of the transfer system according to the present embodiment.
Figure 32:
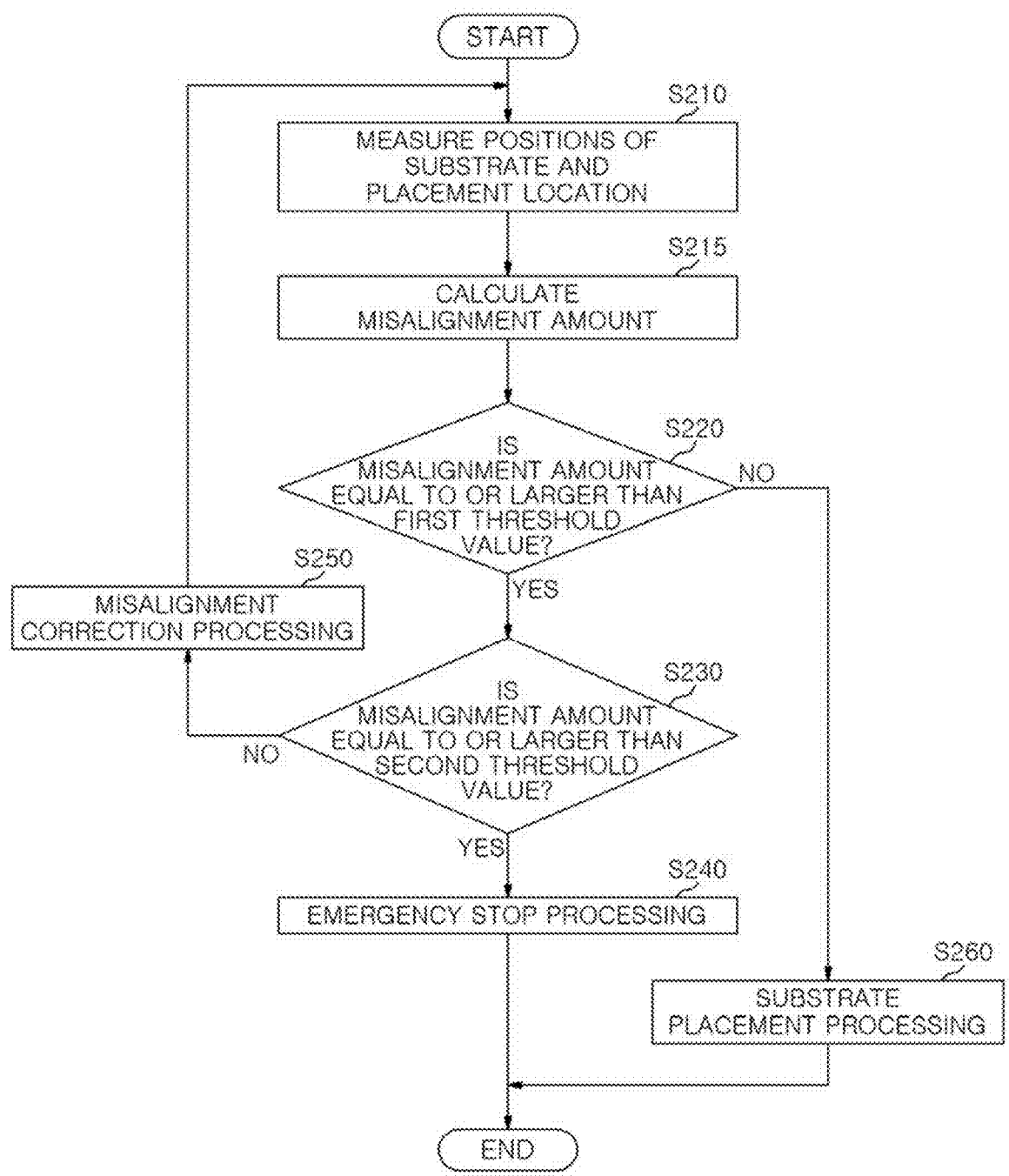
FIG. 32 is a flow chart illustrating the processing of the transfer system according to the present embodiment.

Processing of a transfer system 480 according to the present embodiment will be described. FIGS. 30 to 32 are flow charts illustrating the processing of the transfer system 480 according to the present embodiment. FIGS. 33A to 33F are views illustrating the processing of the transfer system 480 according to the present embodiment. FIGS. 33A to 33F illustrate the end effector 400 of the transfer robot 470 as the end effector FK.

Hereinafter, a transfer method for unloading the substrate W illustrated in FIG. 30 from the load-lock module LLM and loading the substrate W into the process module PM will be described.

[Step of Unloading Substrate W from Load-Lock Module LLM]

First, the substrate W is unloaded from the load-lock module LLM (step S100). A process of unloading the substrate W in step S100 from the load-lock module LLM (step S100) will be described in detail with reference to FIG. 31.

Figure 33A:
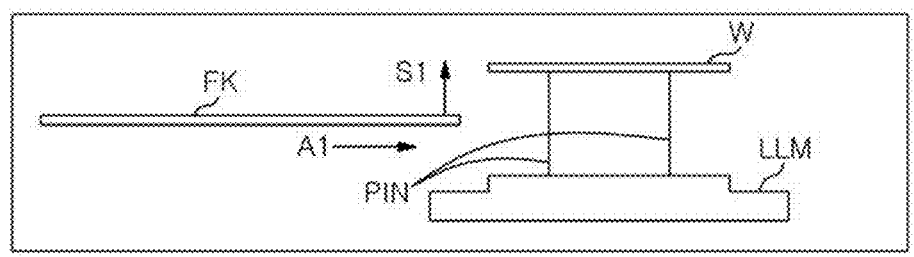
FIGS. 33A to 33F are views illustrating the processing of the transfer system according to the present embodiment.

As illustrated in FIG. 33A, when the substrate W is unloaded from the load-lock module LLM, the substrate W is in a state of being lifted on an upper side from the load-lock module LLM by pins PIN. The controller CU measures the position of the substrate W. Specifically, the control device 450 of the transfer robot 470 measures the position of the substrate W while moving the end effector FK in the direction of an arrow A1 (step S110). In order to measure the position of the substrate W, measurement is performed using the optical sensor 422 and the optical sensor 423 on a side of the placement surface 100S1 with respect to a direction of an arrow S1 in FIG. 33A.

Figure 33B:
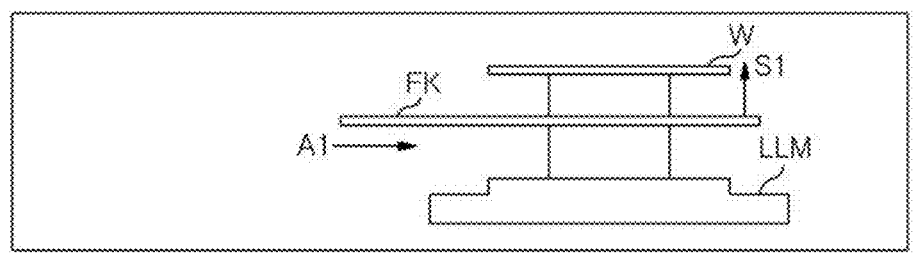

The measurement in step S110 is performed until the end effector FK moves to a position opposite to an insertion side of the substrate W, as illustrated in FIG. 33B. The control device 450 of the transfer robot 470 transmits to the controller CU a result obtained by measuring the position of the substrate W.

The controller CU calculates the misalignment amount between the position of the substrate W and the desired position (step S115). The controller CU determines whether or not the calculated misalignment amount is equal to or larger than a first threshold value (step S120). When the calculated misalignment amount is equal to or larger than the first threshold value (YES in step S120), the controller CU determines whether the calculated misalignment amount is equal to or larger than a second threshold value which is larger than the first threshold value (step S130).

When the calculated misalignment amount is equal to or larger than the second threshold value (YES in step S130), the controller CU executes emergency stop processing on assumption that a problem difficult for restoration has occurred (step S140). As the emergency stop processing, for example, the controller CU issues an alert to stop the system.

Meanwhile, when the misalignment amount is less than the second threshold value in step S130 (NO in step S130), the controller CU determines that the misalignment of the substrate W can be corrected and performs misalignment correction processing (step S150). The controller CU corrects the position of the end effector FK to correct the misalignment amount, for example.

Figure 33C:
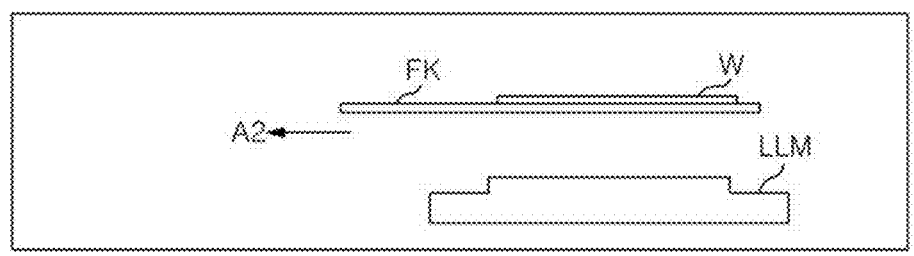

When the misalignment amount is less than the first threshold value in step S120 (NO in step S120), and after the processing in step S150 is completed, the substrate transfer processing is executed (step S160). In step S160, the substrate W is placed on the end effector FK, the end effector FK on which the substrate W is placed is moved in a direction of an arrow A2, and the substrate W is unloaded, as illustrated in FIG. 33C.

(Step of Loading Substrate W into Process Module PM)

Next, the substrate W is loaded into the process module PM (step S200). A process of loading the substrate W in step S200 into the process module PM (step S200) will be described in detail with reference to FIG. 32.

Figure 33D:
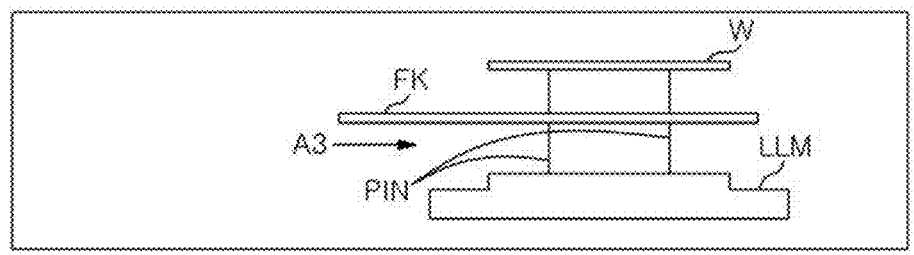
Figure 33E:
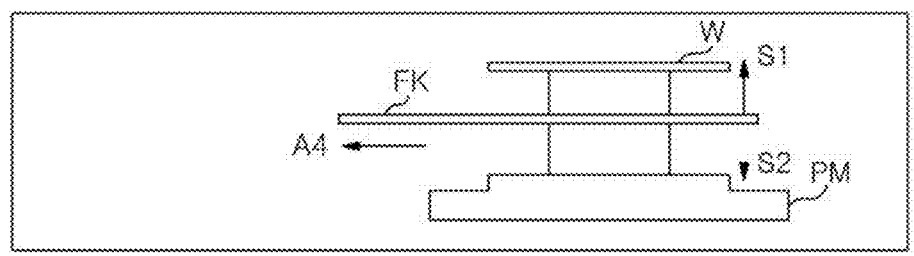

As illustrated in FIG. 33D, when the substrate W is loaded into the process module, the end effector FK is moved in a direction of an arrow A3. The substrate W is in a state of being lifted on an upper side from the process module PM by the pins PIN.

While moving the end effector FK in a direction of an arrow A4, the control device 450 of the transfer robot 470 measures the positions of the substrate W and the placement location where the substrate W is placed (step S210). In order to measure the positions of the substrate W and the placement location where the substrate W is placed, the measurement is performed using the optical sensor 422 and the optical sensor 423 on the side of the placement surface 100S1 with respect to the direction of the arrow S1 in FIG. 33E. Further, the measurements are performed using the optical sensor 522 and the optical sensor 523 on a side of the bottom surface 100S2 in a direction of an arrow S2 in FIG. 33E.

The measurement of the position of the placement location where the substrate W is placed may be performed by measuring the end portion of the annular member (edge ring) of the ring assembly 112, or may be performed by measuring the substrate support surface 111a or the edge ring support surface 111b.

After performing the measurement in step S210, the control device 450 of the transfer robot 470 transmits to the controller CU a result of measuring the position of the substrate W.

The controller CU calculates the misalignment amount between the position of the substrate W and the position of the placement location (step S215). The controller CU determines whether the calculated misalignment amount is equal to or larger than the first threshold value (step S220). When the calculated misalignment amount is equal to or larger than the first threshold value (YES in step S220), the controller CU determines whether the calculated misalignment amount is equal to or larger than the second threshold value which is larger than the first threshold value (step S230).

When the calculated misalignment amount is equal to or larger than the second threshold value (YES in step S230), the controller CU assumes that a problem difficult for restoration has occurred and executes the emergency stop processing (step S240). As the emergency stop processing, for example, the controller CU issues an alert to stop the system.

Meanwhile, when the misalignment amount is less than the second threshold value in step S230 (NO in step S230), the controller CU determines that the misalignment of the substrate W can be corrected and performs the misalignment correction processing (step S250). The controller CU places the substrate W on the end effector FK again, and corrects the position of the end effector FK, for example, to correct the misalignment amount. The substrate W is placed again in the process module PM. Next, the process returns to step S210 to repeat the processing again.

Figure 33F:
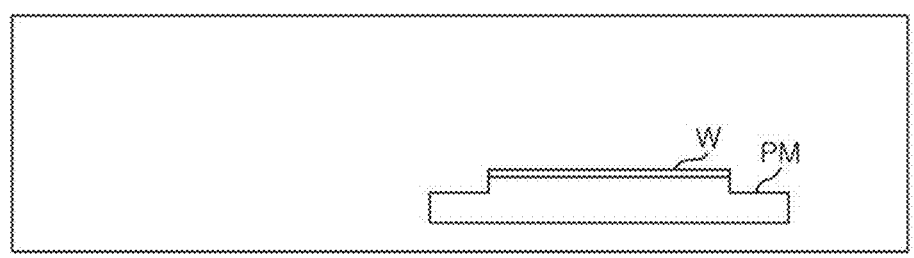

When the misalignment amount is less than the first threshold value in step S220 (NO in step S220), the substrate placement process is executed (step S260). When step S260 is executed, the substrate W is placed on the process module PM as illustrated in FIG. 33F.

In the above description, the determination is performed based on the same first threshold value in step S120 and step S220. However, different threshold values may be used in step S120 and step S220. The same applies to the second threshold values of step S130 and step S230.

<Operations and Effects>

According to the transfer system 480 of the present embodiment, misalignment of the substrate W can be self-diagnosed and self-corrected by the transfer system 480. Therefore, according to the transfer system 480, it is possible to improve the positional accuracy when the substrate W is transferred. The improvement of the positional accuracy on the transferring of the substrate W improves the transfer accuracy, so that the performance of the transfer robot can be improved. Further, the performing of the self-correction enables to extend an apparatus operating time.

Further, according to the transfer system 480 of the present embodiment, the mounting position of the substrate W can be corrected in real time. Therefore, the reliability of the transfer robot can be improved.

Further, according to the transfer system 480 of the present embodiment, since the misalignment can be corrected, high-accuracy teaching of the transfer robot is not necessary, so that the automation of the teaching can be performed. Therefore, labor saving can be achieved. Further, adjustment time may be shortened, so that the productivity may be improved. When the high-accuracy teaching is performed, the adjustment is performed by opening the chamber to the atmosphere. However, since the high-accuracy teaching of the transfer robot is not necessary, the time for opening the chamber to the atmosphere can be shortened.

Further, according to the transfer system 480 of the present embodiment, since misalignment can be corrected, a transfer robot having low repetitive transfer performance can be applied. Therefore, it is possible to reduce the cost of the transfer robot.

Further, according to the transfer system 480 of the present embodiment, since the misalignment can be corrected, it is possible to follow the change of the shape due to the temperature change and the consumption of the target.

For example, even in a case where the central position of the annular member of the ring assembly 112 can be measured using a sensor wafer or the like, the substrate W cannot be placed at the central position of the annular member when the positions of the end effector and the substrate W are misaligned from the reference position. According to the transfer system 480 of the present embodiment, since the misalignment of the substrate W can be corrected, the substrate W can be placed at the central position of the annular member of the ring assembly 112.

Even in a case where the transfer robot is taught using the sensor wafer or the like, the substrate W may not be transported with the same accuracy as when the teaching is performed during transportation of the substrate W due to a change in the environment (for example, temperature) or a difference between the sensor wafer and the substrate W that is actually transferred. According to the transfer system 480 of the present embodiment, since the misalignment of the substrate W can be corrected, the substrate w can be transferred with high positional accuracy.

In the above description, the substrate W is transferred using the transfer system 480 according to the present embodiment. However, the transfer target object is not limited to the substrate W. For example, the transfer system 480 may be used when the members configuring the ring assembly 112 and the shower head 13 are transferred using the transfer system 480 according to the present embodiment.

In the embodiment described above, the case where the optical sensor is used as the sensor that detects the relative position between the fork and the transfer target object has been described. However, the type of the sensor is not limited thereto. For example, a non-contact type sensor such as a magnetic force sensor may be used instead of the optical sensor. Further, as in the first embodiment, a camera may be used as the sensor.

In the embodiment described above, a case where the substrate is a semiconductor wafer has been described. However, the present disclosure is not limited thereto. For example, the substrate may be various substrates used for a liquid crystal display (LCD), a flat panel display (FPD), a CD substrate, a printed substrate, or the like.

Operations and Effects of First to Third Embodiments

According to the first to third embodiments described above, the following effects are acquired in which (1) the self-heating effect of the transfer robot is reduced and (2) the transfer path difference effect is reduced.

(1) In the related art, a slight control error may occur due to the self-heating of the transfer robot. However, in the first to third embodiments, since the positional relationship between the transfer target object and the end effector is successively measured, the position correction can be performed regardless of the presence or absence of the self-heating. Further, since cooling of the transfer robot is not important, a flow rate of a coolant (for example, the cooling gas) can be reduced.

(2) In the related art, since a posture of the transfer robot differs depending on the transfer path, the control error may occur when the transfer path differs. However, in the first to third embodiments, since the positional relationship between the transfer target object and the end effector is successively measured, the position correction can be performed regardless of the transfer path.

It shall be understood that the embodiments disclosed herein are illustrative and are not restrictive in all aspects. The embodiments described above may be omitted, replaced, or modified in various forms without departing from the scope and spirit of the appended claims.

The present invention has been described with reference to the exemplary embodiments. However, the embodiments are not intended to be interpreted in a limiting sense. Various modifications and combinations of the exemplary embodiments, and other embodiments of the present invention will be apparent to those skilled in the art upon reference to the description. For example, the embodiments of FIGS. 4 to 7 and FIGS. 17 to 29 may be combined in a further embodiment. Similarly, the embodiments of FIGS. 8 to 16 may be combined with the embodiments of FIGS. 17 to 29. Accordingly, the appended claims are intended to include any such modifications or embodiments.

With respect to the above-described embodiments, the following appendixes will be further disclosed.

(Appendix 1) A transfer system includes
a transfer robot configured to transfer a transfer target object by an end effector based on an operation instruction, and
a controller configured to output the operation instruction to the transfer robot, wherein
at least any one of the end effector and the transfer target object has at least any one of a sensor and a camera,
the controller calculates a relative position between the end effector and the transfer target object based on at least any one of a detected result of the sensor and a captured result of the camera, and
the controller determines a teaching position of the end effector with respect to the transfer target object based on the relative position, and outputs the operation instruction to the transfer robot such that the end effector is disposed at the teaching position.

(Appendix 2) In the transfer system according to (Appendix 1), the operation instruction includes an instruction to align the end effector configured to transfer the transfer target object with a transfer location of the transfer target object.

(Appendix 3) In the transfer system according to (Appendix 2), the transfer location includes at least one of
a load port on which a container, in which the transfer target object is accommodated, is placed,
an aligner configured to detect a position of the transfer target object in an atmospheric pressure atmosphere,
a storage configured to accommodate the transfer target object in the atmospheric pressure atmosphere,
a load-lock module configured to accommodate the transfer target object and to be able to switch between the atmospheric pressure atmosphere and a vacuum atmosphere, and
a process module configured to accommodate the transfer target object to perform plasma processing.

(Appendix 4) In the transfer system according to (Appendix 2) or (Appendix 3), the transfer target object is at least any one of a substrate and a ring assembly that surrounds the substrate, and
the substrate and the ring assembly have a position detection sensor configured to detect a position of the transfer location.

(Appendix 5) In the transfer system according to any one of (Appendix 1) to (Appendix 4), the transfer robot transfers the transfer target object in at least any one of the atmospheric pressure atmosphere and the vacuum atmosphere.

(Appendix 6) A transfer method using a transfer system, the transfer system including
a transfer robot configured to transfer a transfer target object by an end effector based on an operation instruction, and
a controller configured to output the operation instruction to the transfer robot,
at least any one of the end effector and the transfer target object having at least any one of a sensor and a camera,
the transfer method including
calculating by the controller a relative position between the end effector and the transfer target object based on at least any one of a detected result of the sensor and a captured result of the camera, and
determining by the controller a teaching position of the end effector with respect to the transfer target object based on the relative position to output the operation instruction to the transfer robot such that the end effector is disposed at the teaching position.

(Appendix 7) In the transfer method according to (Appendix 6), the operation instruction includes an instruction to align the end effector configured to transfer the transfer target object with a transfer location of the transfer target object.

(Appendix 8) In the transfer method according to (Appendix 7), the transfer location includes at least one of
a load port on which a container, in which the transfer target object is accommodated, is placed,
an aligner configured to detect a position of the transfer target object in an atmospheric pressure atmosphere, a storage configured to accommodate the transfer target object in the atmospheric pressure atmosphere, a load-lock module configured to accommodate the transfer target object and to be able to switch between the atmospheric pressure atmosphere and a vacuum atmosphere, and a process module configured to accommodate the transfer target object to perform plasma processing.

(Appendix 9) In the transfer method according to (Appendix 7) or (Appendix 8), the transfer target object is at least any one of a substrate and a ring assembly that surrounds the substrate, and the substrate and the ring assembly have a position detection sensor configured to detect a position of the transfer location.

(Appendix 10) In the transfer method according to any one of (Appendix 6) to (Appendix 9), the transfer robot transfers the transfer target object in at least any one of the atmospheric pressure atmosphere and the vacuum atmosphere.

(Appendix 11) The transfer method according to any one of (Appendix 6) to (Appendix 10) is performed in at least one of a case in which the transfer system is started, a case in which the end effector is replaced, and a case in which a component in a process module configured to accommodate the transfer target object to perform plasma processing is replaced.

(Appendix 12) A transfer device for transferring a transfer target object, the transfer device includes:

an end effector on which the transfer target object is placed, an arm configured to move the end effector, and a control device configured to control the arm, wherein the end effector has at least any one of a sensor and a camera on a side on which the transfer target object is placed, and at least any one of the sensor and the camera measures a positional relationship between the transfer target object and the end effector.

(Appendix 13) In the transfer device according to (Appendix 12), the transfer target object is at least any one of a substrate and a ring assembly that surrounds the substrate.

(Appendix 14) In the transfer device according to (Appendix 12) or (Appendix 13), at least any one of the sensor and the camera measures a central position of the transfer target object.

(Appendix 15) In the transfer device according to (Appendix 14), at least any one of the sensor and the camera measures the central position of the transfer target object while the transfer target object is being transferred.

(Appendix 16) In the transfer device according to (Appendix 15), the end effector has the sensor, and the sensor is an electrostatic capacitance sensor provided in at least two or more locations of the end effector.

(Appendix 17) In the transfer device according to (Appendix 16), the electrostatic capacitance sensor is provided in at least three or more locations on the same circumference of the end effector.

(Appendix 18) In the transfer device according to any one of (Appendix 14) to (Appendix 17), at least any one of the sensor and the camera measures the central position of the transfer target object when the transfer target object is received.

(Appendix 19) In the transfer device according to any one of (Appendix 14) to (Appendix 18), at least any one of the sensor and the camera measures the central position of the transfer target object when the transfer target object is placed in a substrate processing apparatus.

(Appendix 20) In the transfer device according to (Appendix 18) or (Appendix 19), the end effector has the sensor, and the sensor is an optical sensor provided in at least two or more locations of the end effector.

(Appendix 21) In the transfer device according to (Appendix 20), the optical sensor is provided at a tip of the end effector.

(Appendix 22) In the transfer device according to any one of (Appendix 14) to (Appendix 19), the control device corrects misalignment of the transfer target object when the central position is misaligned from a desired position.

(Appendix 23) The transfer device according to any one of (Appendix 12) to (Appendix 22), further includes a second sensor on a lower side of the end effector, wherein the control device measures and corrects misalignment of a location where the transfer target object is placed.

(Appendix 24) In the transfer device according to any one of (Appendix 12) to (Appendix 23), the transfer device transfers the transfer target object in at least one of an atmospheric pressure atmosphere and a vacuum atmosphere.

(Appendix 25) A transfer system includes a transfer robot configured to transfer a transfer target object by an end effector based on an operation instruction, and a controller configured to output the operation instruction to the transfer robot, wherein at least any one of the end effector and the transfer target object has at least any one of a sensor and a camera, the controller calculates a relative position between the end effector and the transfer target object based on at least any one of a detected result of the sensor and a captured result of the camera, and the controller determines a teaching position of the end effector with respect to the transfer target object based on the relative position, and outputs the operation instruction to the transfer robot such that the end effector is disposed at the teaching position.

(Appendix 26) A transfer method using a transfer system, the transfer system includes a transfer robot configured to transfer a transfer target object by an end effector based on an operation instruction, and a controller configured to output the operation instruction to the transfer robot, the end effector having at least any one of a sensor and a camera on a side on with the transfer target object is placed, the transfer method including:

(a) measuring by the controller a position of the transfer target object based on at least any one of a detected result of the sensor and a captured result of the camera, and (b) calculating by the controller a misalignment amount between the measured position of the transfer target object and a desired position.

(Appendix 27) The transfer method according to (Appendix 26) further includes (c) correcting the misalignment amount by the controller when the misalignment amount is equal to or larger than a first threshold value and is less than a second threshold value.

(Appendix 28) The transfer method according to (Appendix 27), further includes (d) issuing an alert to stop the system by the controller when the misalignment amount is equal to or larger than the second threshold value.

(Appendix 29) In the transfer method according to any one of (Appendix 26) to (Appendix 28), (a) is performed when the end effector receives the transfer target object.

(Appendix 30) In the transfer method according to any one of (Appendix 26) to (Appendix 28), (a) is performed when the end effector places the transfer target object.

(Appendix 31) In the transfer method according to any one of (Appendix 26) to (Appendix 30), the end effector has the sensor and the sensor is an optical sensor.

(Appendix 32) A transfer system includes
a transfer robot configured to transfer a transfer target object by an end effector based on an operation instruction, and
a controller configured to output the operation instruction to the transfer robot, wherein
the end effector has at least any one of a sensor and a camera on a side on which the transfer target object is placed, and
the controller executes
(a) measuring a position of the transfer target object based on at least any one of a detected result of the sensor and a captured result of the camera, and, and
(b) calculating a misalignment amount between the measured position of the transfer target object and a desired position.

The invention claimed is:
1. A transfer system comprising:
a transfer robot comprising a fork and configured to transfer a transfer target object based on an operation instruction, and
a controller configured to output the operation instruction to the transfer robot,
wherein the fork comprises arms that form a U shape and includes a conductor at a predetermined conductor location on each tip of the fork and at a predetermined conductor location on a base of the fork,
wherein the fork comprises a suction hole at a predetermined suction location on each tip of the fork and at a predetermined suction location on the base of the fork, the suction holes connected by a suction path within the fork, suction within the suction holes and the suction path controlled to hold the transfer object
wherein the transfer target object includes a plurality of position sensors and a plurality of capacitance sensors, the plurality electrostatic capacitance sensor configured to detect corresponding ones of the conductors of the fork, the plurality of position sensors being cameras configured to detect portions of the fork,
the controller calculates a relative position between the fork and the transfer target object based on each of a detected result of the plurality of position sensors and a detected result of the plurality of position sensors, and
the controller determines a teaching position of the fork with respect to the transfer target object based on the relative position, and outputs the operation instruction to the transfer robot such that the fork is disposed at the teaching position.

2. The transfer system according to claim 1, wherein the operation instruction includes an instruction to align the fork with a transfer location of the transfer target object.

3. The transfer system according to claim 2, wherein the transfer target object is one of a substrate or a ring assembly that surrounds the substrate.

4. A transfer device for transferring a transfer target object, the transfer device comprising:
a fork on which the transfer target object is placed;
wherein the fork comprises arms that form a U shape and includes a conductor at a predetermined conductor location on each tip of the fork and at a predetermined conductor location on a base of the fork,
wherein the fork comprises a suction hole at a predetermined suction location on each tip of the fork and at a predetermined suction location on the base of the fork, the suction holes connected by a suction path within the fork, suction within the suction holes and the suction path controlled to hold the transfer object
wherein the transfer target object includes a plurality of position sensors and a plurality of capacitance sensors, the plurality electrostatic capacitance sensor configured to detect corresponding ones of the conductors of the fork, the plurality of position sensors being cameras configured to detect portions of the fork,
an arm configured to move the fork, and
a control device configured to control the arm based on a relative position between the fork and the transfer target object that is determined based on each of a detected result of the plurality of position sensors and a detected result of the plurality of position sensors.

5. The transfer device according to claim 4, wherein the transfer target object is one of a substrate, a ring assembly that surrounds the substrate, or an upper electrode.

6. The transfer device according to claim 4, wherein control device measures a central position of the transfer target object based on each of the detected result of the plurality of position sensors and the detected result of the plurality of position sensors.

7. The transfer device according to claim 6, wherein the control device measures the central position of the transfer target object while the transfer target object is being transferred.

8. The transfer device according to claim 6, wherein the control device measures the central position of the transfer target object when the transfer target object is received.

9. The transfer device according to claim 6, wherein the control device measures the central position of the transfer target object when the transfer target object is placed in a substrate processing apparatus.

10. The transfer device according to claim 6, wherein the control device corrects misalignment of the transfer target object when the central position is misaligned from a predetermined position.

11. A transfer method performed by a transfer system, the transfer system including:
a transfer robot comprising a fork and configured to transfer a transfer target object based on an operation instruction, and
a controller configured to output the operation instruction to the transfer robot,
wherein the fork comprises arms that form a U shape and includes a conductor at a predetermined conductor location on each tip of the fork and at a predetermined conductor location on a base of the fork,
wherein the fork comprises a suction hole at a predetermined suction location on each tip of the fork and at a predetermined suction location on the base of the fork, the suction holes connected by a suction path within the fork, suction within the suction holes and the suction path controlled to hold the transfer object,
wherein the transfer target object includes a plurality of position sensors and a plurality of capacitance sensors, the plurality electrostatic capacitance sensor configured to detect corresponding ones of the conductors of the fork, the plurality of position sensors being cameras configured to detect portions of the fork, the transfer method comprising:

calculating a relative position between the fork and the transfer target object based on each of a detected result of the plurality of position sensors and a detected result of the plurality of position sensors;

calculating a misalignment of the relative position with respect to a reference position;

correcting the misalignment when the misalignment amount is equal to or larger than a first threshold value and is less than a second threshold value, and issuing an alert to stop the transfer system when the misalignment amount is equal to or larger than the second threshold value.

* * * * *